United States Patent
Cho et al.

(10) Patent No.: US 12,545,664 B2
(45) Date of Patent: Feb. 10, 2026

(54) COMPOSITION OF MATTER FOR USE IN ORGANIC LIGHT-EMITTING DIODES

(71) Applicant: KYULUX, INC., Fukuoka (JP)

(72) Inventors: Yong Joo Cho, Fukuoka (JP); Kaori Fujisawa, Fukuoka (JP); Yoshitake Suzuki, Fukuoka (JP); Masataka Yamashita, Fukuoka (JP); Shuo-Hsien Cheng, Fukuoka (JP); Yuseok Yang, Fukuoka (JP); Hiroaki Ozawa, Fukuoka (JP); Hayato Kakizoe, Fukuoka (JP); Yu Inada, Fukuoka (JP); Ayataka Endo, Fukuoka (JP)

(73) Assignee: KYULUX, INC., Fukuoka (JP)

( * ) Notice: Subject to any disclaimer, the term of this patent is extended or adjusted under 35 U.S.C. 154(b) by 1003 days.

(21) Appl. No.: 17/639,749

(22) PCT Filed: Sep. 8, 2020

(86) PCT No.: PCT/US2020/049688
§ 371 (c)(1),
(2) Date: Mar. 2, 2022

(87) PCT Pub. No.: WO2021/046523
PCT Pub. Date: Mar. 11, 2021

(65) Prior Publication Data
US 2022/0340545 A1 Oct. 27, 2022

Related U.S. Application Data

(60) Provisional application No. 62/994,956, filed on Mar. 26, 2020, provisional application No. 62/896,096, filed on Sep. 5, 2019.

(51) Int. Cl.
| | | |
|---|---|---|
| C07D 403/10 | (2006.01) | |
| C07D 403/14 | (2006.01) | |
| C07D 487/04 | (2006.01) | |
| C07D 491/048 | (2006.01) | |
| C07D 519/00 | (2006.01) | |
| H10K 50/12 | (2023.01) | |
| H10K 71/16 | (2023.01) | |
| H10K 85/60 | (2023.01) | |

(52) U.S. Cl.
CPC ......... *C07D 403/10* (2013.01); *C07D 403/14* (2013.01); *C07D 487/04* (2013.01); *C07D 491/048* (2013.01); *C07D 519/00* (2013.01); *H10K 85/631* (2023.02); *H10K 85/652* (2023.02); *H10K 85/654* (2023.02); *H10K 85/657* (2023.02); *H10K 85/6572* (2023.02); *C07B 2200/05* (2013.01); *H10K 50/12* (2023.02); *H10K 71/164* (2023.02)

(58) Field of Classification Search
CPC .................................................. C07D 403/10
See application file for complete search history.

(56) References Cited

U.S. PATENT DOCUMENTS

| | | |
|---|---|---|
| 2018/0134686 A1 | 5/2018 | Bergmann |
| 2019/0058130 A1 | 2/2019 | Aguilera-Iparraguirre |
| 2019/0194171 A1 | 6/2019 | Bergmann |

FOREIGN PATENT DOCUMENTS

| | | |
|---|---|---|
| CN | 107848989 A | 3/2018 |
| DE | 102016115854 B3 | 1/2018 |
| EP | 3266772 A1 | 1/2018 |
| EP | 3674299 A1 | 7/2020 |
| JP | 2019-096876 A | 6/2019 |
| KR | 20170113808 A | 10/2017 |
| WO | 2018077492 A1 | 5/2018 |
| WO | 2018153510 A1 | 8/2018 |
| WO | 2018/224421 A1 | 12/2018 |
| WO | 2019001838 A1 | 1/2019 |
| WO | 2019/063288 A1 | 4/2019 |

(Continued)

OTHER PUBLICATIONS

Office Action dated Feb. 17, 2025 issued in the corresponding European patent application No. 20780416.2.
Chinese Office Action dated Feb. 22, 2024, from corresponding Chinese application No. 202080062628.8.
Japanese Office Action dated May 21, 2024 issued in the corresponding Japanese patent application No. 2022-514495 with its English Machine Translation.
Office Action dated Nov. 28, 2023 issued in the corresponding Taiwanese patent application No. 1019130432 with its English Translation.
Chinese Office Action dated Apr. 21, 2023 issued in the corresponding Chinese patent application No. 202080062628.8 with its English Machine Translation.

(Continued)

*Primary Examiner* — Andrew D Kosar
*Assistant Examiner* — Connor K English
(74) *Attorney, Agent, or Firm* — Troutman Pepper Locke LLP; James E. Armstrong, IV; Nicholas J. DiCeglie, Jr.

(57) ABSTRACT

The present disclosure relates to compounds of Formula I) as useful materials for OLED's. $X^1$, $X^2$ and $X^3$ are N or $C(R^5)$; $Ar^1$ and $Ar^2$ are aryl, heteroaryl or cyano; $L^1$ is single bond, arylene or heteroarylene; and $R^1$, $R^2$, $R^3$ and $R^4$ are diarylamino, carbazolyl, heteroaryl, H or alkyl.

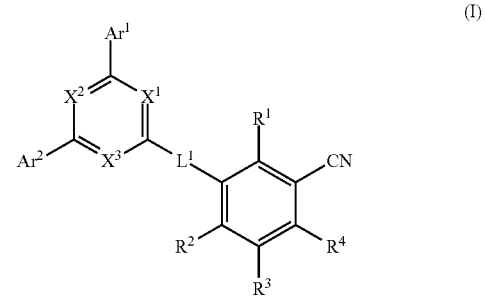

19 Claims, No Drawings

(56) References Cited

FOREIGN PATENT DOCUMENTS

WO      2019/191665 A1   10/2019
WO      2019/195104 A1   10/2019

OTHER PUBLICATIONS

International Preliminary Report on Patentability of Chapter I, i.e., International Search Opinion for PCT/US2020/049688 dated Mar. 8, 2022.
International Search Report and Search Opinion for PCT/US2020/049688 dated Dec. 21, 2020.
Office Action dated Oct. 13, 2023 issued in the corresponding Chinese patent application No. 202080062628.8 with its English Machine Translation.

COMPOSITION OF MATTER FOR USE IN ORGANIC LIGHT-EMITTING DIODES

RELATED APPLICATIONS

This application claims the benefit of priority to U.S. Provisional Patent Application Ser. No. 62/896,096, filed Sep. 5, 2019 and U.S. Provisional Patent Application Ser. No. 62/994,956, filed Mar. 26, 2020, which is each hereby expressly incorporated by reference, in its entirety, into the present application.

BACKGROUND

An organic light emitting diode (OLED) is a light-emitting diode (LED) in which a film of organic compounds is placed between two electrodes, which film emits light in response to excitation, such as an electric current. OLEDs are useful in lightings and displays. such as television screens, computer monitors, mobile phones, and tablets. A problem inherent in OLED displays is the limited lifetime of the organic compounds. OLEDs that emit blue light, in particular, degrade at a significantly increased rate as compared to green or red OLEDs.

OLED materials rely on the radiative decay of molecular excited states (excitons) generated by recombination of electrons and holes. The nature of excitation results in interactions between electrons and holes that split the excited states into emissive singlets (with a total spin of 0) and non-emissive triplets (with a total spin of 1). Since the recombination of electrons and holes affords a statistical mixture of four spin states (one singlet and three triplet levels), conventional OLEDs have a maximum theoretical efficiency of 25%.

To date, OLED material design has focused on harvesting the remaining energy from the normally non-emissive triplets. Recent work to create efficient phosphors, which emit light from the normally non-emissive triplet state, have resulted in green and red OLEDs. Other colors, such as blue, however, require higher energy excited states, which accelerate the degradation process of the OLED.

The fundamental limiting factor to the triplet-singlet transition rate is a value of the parameter $|H_{fi}/\Delta E_{ST}|^2$, where $H_{fi}$ is the coupling energy due to hyperfine or spin-orbit interactions, and $\Delta E_{ST}$ is the energetic splitting between singlet and triplet states. Traditional phosphorescent OLEDs rely on the mixing of singlet and triplet states due to spin-orbital (SO) interaction, increasing $H_{fi}$, and forming a lowest emissive level between a heavy metal atom and an organic ligand. This results in energy harvesting from all higher singlet and triplet states, followed by phosphorescence (relatively short-lived emission from the excited triplet). The shortened triplet lifetime reduces triplet exciton annihilation by charges and other excitons. Recent work by others suggests that the limit to the performance of phosphorescent materials has been reached.

SUMMARY

The present disclosure relates to novel materials for OLEDs. In some embodiments, the OLEDs containing the materials show long lifetimes and improved properties.

In one aspect, the present disclosure provides compounds of Formula (I):

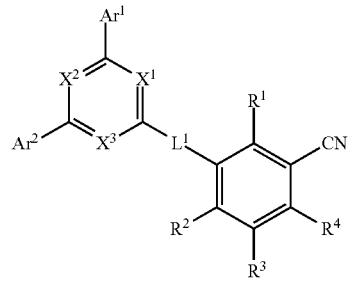

wherein
one of $X^1$, $X^2$ and $X^3$ is N,
the other two of $X^1$, $X^2$ and $X^3$ are independently N or $C(R^5)$;
$R^5$ is hydrogen, deuterium, halogen, cyano, substituted or unsubstituted substituted or unsubstituted alkoxy, substituted or unsubstituted aryl, substituted or unsubstituted aryloxy, substituted or unsubstituted heteroaryl, substituted or unsubstituted heteroaryloxy, and silyl;
$Ar^1$ and $Ar^2$ are independently selected from substituted or unsubstituted aryl, substituted or unsubstituted. heteroaryl and cyano;
$L^1$ is selected from single bond, substituted or unsubstituted arylene, and substituted or unsubstituted heteroarylene;
one of $R^1$, $R^2$, $R^3$ and $R^4$ is D,
another one of $R^1$, $R^2$, $R^3$ and $R^4$ is $Ar^3$,
the other remaining two of $R^1$, $R^2$, $R^3$ and $R^4$ are independently selected from H, substituted or unsubstituted alkyl, D and $Ar^3$;
$Ar^3$ is independently selected from substituted or unsubstituted aryl, and substituted or unsubstituted heteroaryl not having N as a ring-constituting atom wherein each instance of aryl, and heteroaryl can be substituted with one or more substituents independently selected from deuterium, substituted or unsubstituted alkyl, substituted or unsubstituted aryl, and substituted or unsubstituted heteroaryl not having N as a ring-constituting atom; and two or more of these substituents taken together can form a ring system,
D is independently selected from substituted or unsubstituted 1-carbazolyl, substituted or unsubstituted 2-carbazolyl, substituted or unsubstituted 3-carbazolyl, substituted or unsubstituted 4-carbazolyl, or group represented by Formula (II):

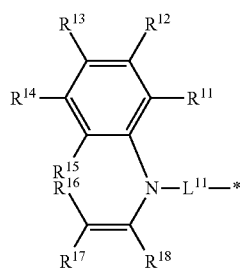

$R^{11}$, $R^{12}$, $R^{13}$, $R^{14}$, $R^{15}$, $R^{16}$, $R^{17}$, and $R^{18}$ are independently selected from hydrogen, deuterium, substituted or unsubstituted alkyl, substituted or unsubstituted alkoxy, substituted or unsubstituted amino, substituted or unsubstituted aryl, substituted or unsubstituted aryloxy, substituted or unsubstituted heteroaryl, substituted or unsubstituted heteroaryloxy, and silyl; or two or more of $R^{11}$, $R^{12}$, $R^{13}$, $R^{14}$, $R^{15}$, $R^{16}$, $R^{17}$ and $R^{18}$ taken together can form a ring system, or $R^{15}$ and $R^{16}$ taken together can form single bond, and $L^{11}$ is selected from single bond, substituted or unsubstituted arylene, and substituted or unsubstituted heteroarylene, In one aspect, the present disclosure provides a light emitting material comprising a compound of Formula (I). In one aspect, the present disclosure provides delayed fluorescent emitter comprising a compound of Formula (I). In one aspect, the present disclosure provides an organic light-emitting diode (OLED) comprising a compound of Formula (I). In one aspect, the present disclosure provides screen or a display comprising a compound of Formula (I).

In one aspect, the present disclosure provides a method of manufacturing an OLED display, the method comprising forming a barrier layer on a base substrate of a mother panel; forming a plurality of display units in units of cell panels on the barrier layer; forming an encapsulation layer on each of the display units of the cell panels; and applying an organic film to an interface portion between the cell panels wherein the organic film comprises a compound of Formula (I).

DETAILED DESCRIPTION

The examples are provided by way of explanation of the disclosure, and not by way of limitation of the disclosure. In fact, it will be apparent to those skilled in the art that various modification and variations can be made in the present disclosure without departing from the scope or spirit of the disclosure. For instance, features illustrated or described as part of one embodiment can he used on another embodiment to yield a still further embodiment. Thus, it is intended that the present disclosure cover such modifications and variations as come within the scope of the appended claims and their equivalents. Other objects, features, and aspects of the present disclosure are disclosed in, or can be derived from, the following detailed description. It is to he understood by one of ordinary skill in the art that the present discussion is a description of exemplary embodiments only, and is not to be construed as limiting the broader aspects of the present disclosure.

The definition of the terms appearing in the present application are shown in page 13, line 16 to page 25, line 9 of WO2019/195104. The principles of OLED are shown in page 25, line 11 to page 26, line 27 of WO2019/195104. The electronic properties and the exemplary uses of the compounds of Formula (I) are shown in page 58, line 24 to page 87, line 9 and FIG. 1 of WO2019/195104. These descriptions and FIG. 1 of WO2019/195104 are hereby expressly incorporated by reference into the present application. Page 5, line 27 to page 19, line 22, and page 43, line 1 to page 64, line 30 of U.S. Provisional Patent Application No. 62/896,096 are also hereby expressly incorporated by reference into the present application.

Compounds of the Disclosure

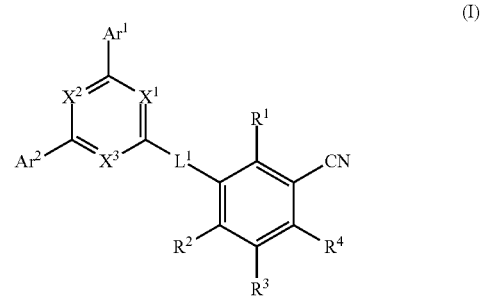

In Formula (1), one of $X^1$, $X^2$ and $X^3$ is N; and the other two of $X^1$, $X^2$ and $X^3$ are independently N or $C(R^5)$. $R^5$ is hydrogen, deuterium, halogen, cyano, substituted or unsubstituted alkyl, substituted or unsubstituted alkoxy, substituted or unsubstituted aryl, substituted or unsubstituted aryloxy, substituted or unsubstituted heteroaryl, substituted or unsubstituted heteroaryloxy, or silyl. In some embodiments, all of $X^1$, $X^2$ and $X^3$ are N. In some embodiments, $X^1$ and $X^2$ are N, and $X^3$ is $C(R^5)$. In some embodiments, $X^2$ and $X^3$ are N, and $X^1$ is $C(R^5)$. In some embodiments, $X^1$ is N, and $X^2$ and $X^3$ are independently $C(R^5)$. In some embodiments, $X^2$ is N, and $X^1$ and $X^3$ are independently $C(R^5)$. In some embodiments, $R^5$ is a substituted or unsubstituted alkyl. In some embodiments, $R^5$ is an unsubstituted alkyl.

In Formula (1), $L^1$ is selected from single bond, substituted or unsubstituted arylene, and substituted or unsubstituted heteroarylene. In some embodiments, each instance of arylene and heteroarylene is substituted with one or more substituents independently selected from deuterium, substituted or unsubstituted. alkyl, substituted or unsubstituted aryl, and substituted or unsubstituted heteroalyl; and two or more of these substituents taken together can form a ring system. In some embodiments, the ring system here is substituted or unsubstituted aromatic ring, or substituted or unsubstituted aliphatic ring. In some embodiments, $L^1$ is single bond, unsubstituted phenylene, or phenylene substituted with at least one alkyl. In some embodiments, $L^1$ is single bond. In some embodiments, $L^1$ is a substituted or unsubstituted phenylene group, preferably a substituted or unsubstituted 1,2-phenylene group, more preferably an alkyl-substituted or unsubstituted 1,2-phenylene group. In some embodiments, $L^1$ is selected from the followings:

L1

L2

L3

L4 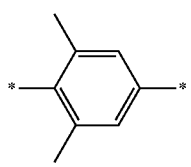

L5 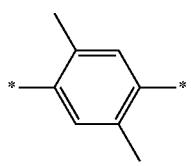

L6 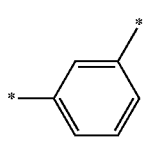

L7 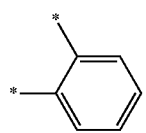

L8 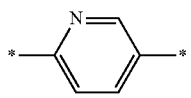

L9 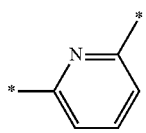

L10 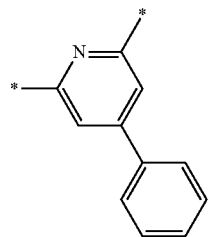

L11 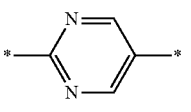

L12 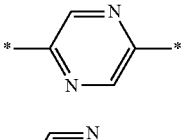

L13 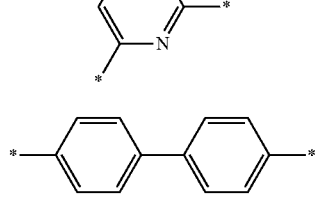

L14

L15 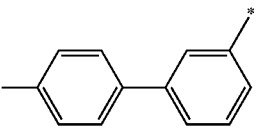

L16 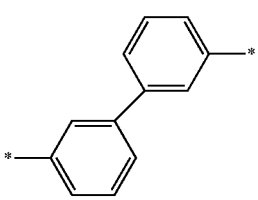

L17 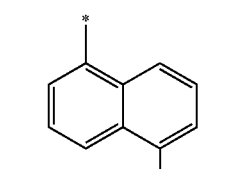

L18 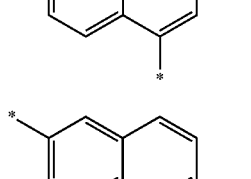

L19 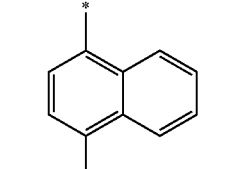

L20 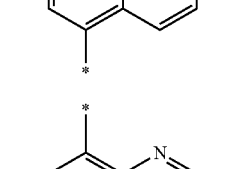

L21 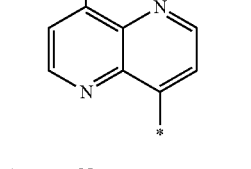

\* represents a bonding position.

In Formula (1), $Ar^1$ and $Ar^2$ are independently selected from substituted or unsubstituted aryl substituted or unsubstituted heteroaryl and cyano. In some embodiments, $Ar^1$ and $Ar^2$ are independently substituted or unsubstituted aryl, preferably an unsubstituted aryl or an aryl substituted with an alkyl, an aryl or cyano. In some embodiments, $Ar^1$ and $Ar^2$ are independently unsubstituted aryl, for example unsubstituted phenyl. In some embodiments, $Ar^1$ and $Ar^2$ are independently substituted or unsubstituted heteroaryl. In some embodiments, $Ar^1$ and $Ar^2$ are cyano. In some embodiments, $Ar^1$ is cyano and $Ar^2$ is substituted or unsubstituted aryl. Each instance of aryl and heteroaryl can be substituted with one or more substituents independently selected from deuterium, substituted or unsubstituted alkyl, substituted or unsubstituted aryl, and substituted or unsubstituted heteroaryl; and two or more of these substituents taken together can form a ring system. In some embodiments, $Ar^1$ and $Ar^2$ are the same. In some embodiments, $Ar^1$ and $Ar^2$ are independently selected from the followings:
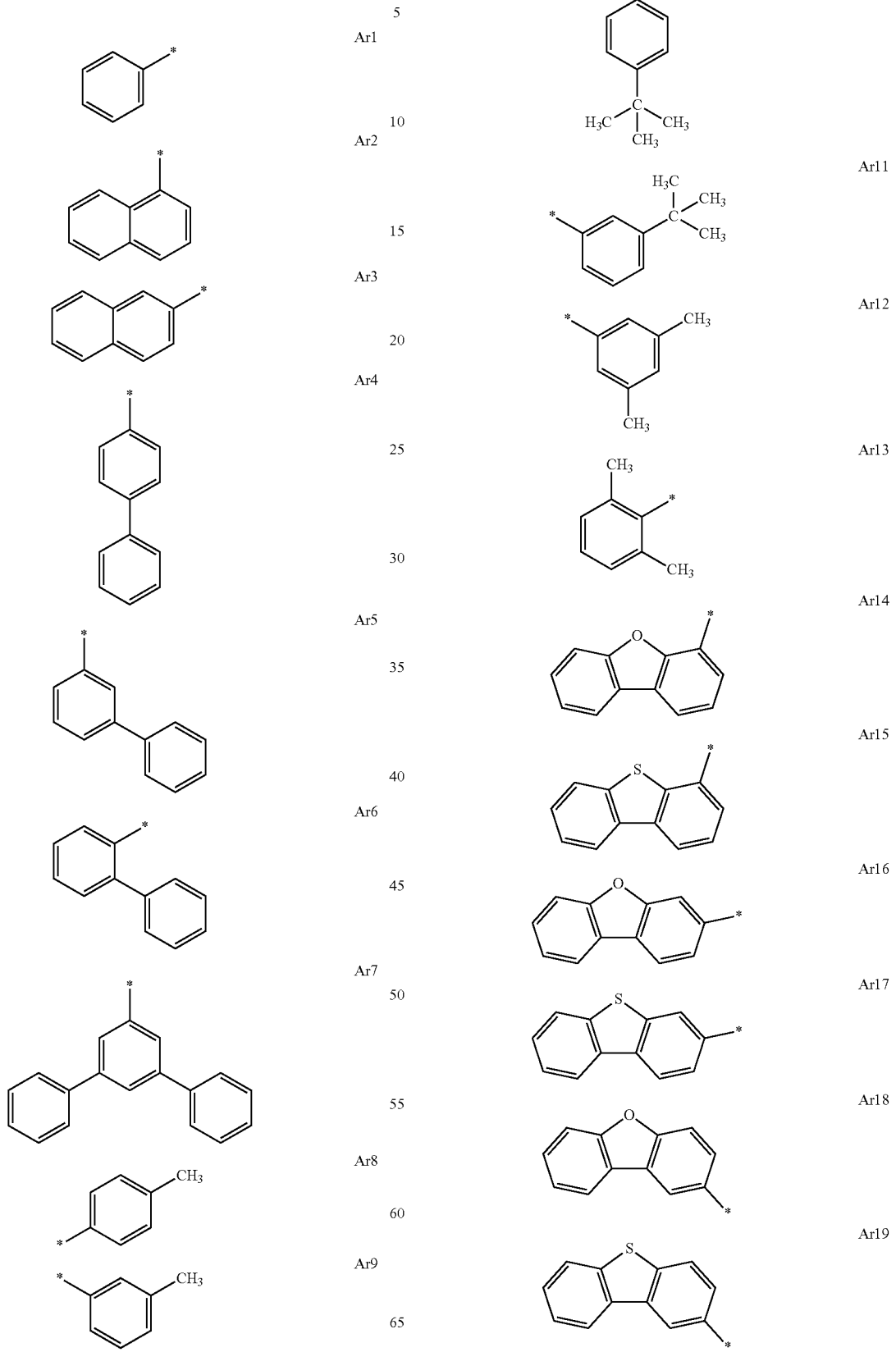

-continued
Ar20 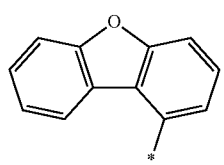
Ar21 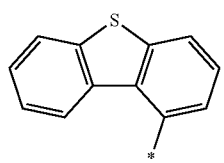
Ar22 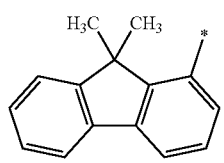
Ar23 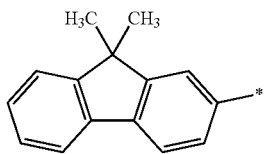
Ar24 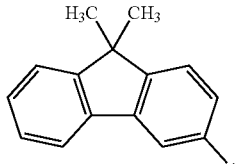
Ar25 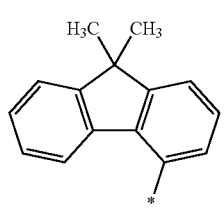
Ar26 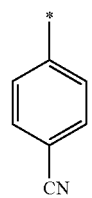
Ar27 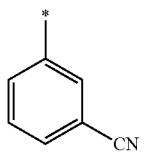
Ar28 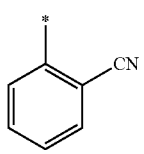
-continued
Ar29 
Ar30 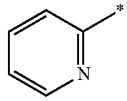
Ar31 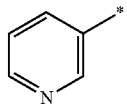
Ar32 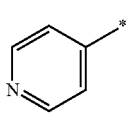
* represents a bonding position.
In some embodiments,
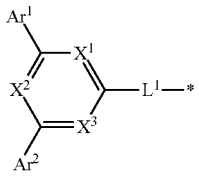
is
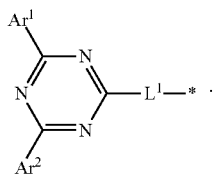
In some embodiments,
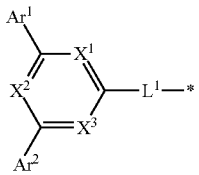
is
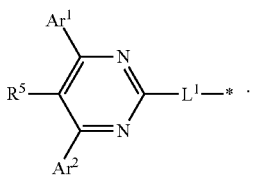

In some embodiments,

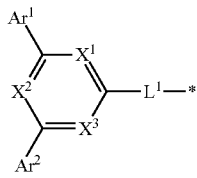

is

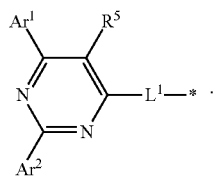

In some embodiments,

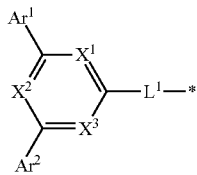

is

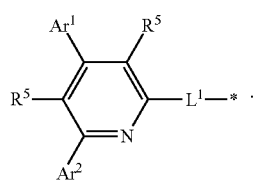

In some embodiments,

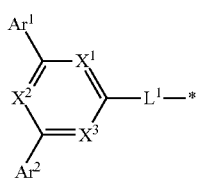

is

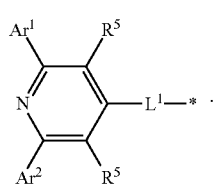

In Formula (1), one of $R^1$, $R^2$, $R^3$ and $R^4$ is D; another one of $R^1$, $R^2$, $R^3$ and $R^4$ is $Ar^3$; and the other remaining two of $R^1$, $R^2$, $R^3$ and $R^4$ are independently selected from H, substituted or unsubstituted alkyl, D and $Ar^3$.

In some embodiments, $R^1$ is H, substituted or unsubstituted alkyl or D. In some embodiments, $R^1$ is H or D. In some embodiments, $R^1$ is H. In some embodiments, $R^1$ is D. In some embodiments, $R^1$ is $Ar^3$. In some embodiments, $R^1$ is substituted or unsubstituted alkyl. In some embodiments, $R^2$ is H or $Ar^3$. In some embodiments, $R^2$ is H. In some embodiments, $R^2$ is $Ar^3$. In some embodiments, $R^2$ is D. In some embodiments, $R^2$ is a group bonding to the benzene ring of Formula (I) by carbon atom. In some embodiments, $R^3$ is a group bonding to the benzene ring of Formula (I) by carbon atom. In some embodiments, $R^3$ is $Ar^3$ or D. In some embodiments, $R^3$ is $Ar^3$. In some embodiments, $R^3$ is D. In some embodiments, $R^3$ is It In some embodiments, $R^4$ is $Ar^3$. In some embodiments, $R^4$ is D. In some embodiments, $R^4$ is H. In some embodiments, $R=^4$ is a group bonding to the benzene ring of Formula (I) by carbon atom.

In some embodiments, at least one of $R^2$, $R^3$ and $R^4$ is D. In some embodiments, at least one of $R^3$ and $R^4$ is D. In some embodiments, al least one of $R^2$ and $R^3$ is D. In some embodiments, at least two of $R^2$, $R^3$ and $R^4$ are independently D. In some embodiments, $R^2$ and $R^3$ are D. In some embodiments, $R^3$ and $R^4$ are D. In some embodiments, $R^2$ and $R^4$ are D. In some embodiments, $R^1$ and $R^3$ are D. In some embodiments, at least two of $R^2$, $R^3$ and $R^4$ are D and they are the same. In some embodiments, at least one of $R^2$, $R^3$ and $R^4$ is $Ar^3$. In some embodiments, $R^2$ is $Ar^3$. In some embodiments, $R^3$ is $Ar^3$. In some embodiments, $R^4$ is $Ar^3$. In some embodiments, only one of $R^1$, $R^2$, $R^3$ and $R^4$ is $Ar^3$. In some preferable embodiments, only $R^3$ of $R^1$, $R^2$, $R^3$ and $R^1$ is $Ar^3$. In some embodiments, only $R^2$ of $R^1$, $R^2$, $R^3$ and $R^4$ is $Ar^3$. In some embodiments, only $R^4$ of $R^1$, $R^2$, $R^3$ and $R^4$ is $Ar^3$. In some embodiments, only one of $R^1$, $R^2$, $R^3$ and $R^4$ is H. In some preferable embodiments, only $R^1$ of $R^1$, $R^2$, $R^3$ and $R^4$ is H. In some embodiments, only one of $R^1$, $R^2$, $R^3$ and $R^4$ is D. In some embodiments, only $R^1$ of $R^1$, $R^2$, $R^3$ and $R^4$ is D. In some embodiments, only $R^2$ of $R^1$, $R^2$, $R^3$ and $R^4$ is D. In some embodiments, only one of $R^1$, $R^2$, $R^3$ and $R^4$ is substituted or unsubstituted alkyl. In some embodiments, two of $R^1$, $R^2$, $R^3$ and $R^4$ are H. In some embodiments, two of $R^1$, $R^2$, $R^3$ and $R^4$ are H. In some preferable embodiments, only $R^1$ and $R^4$ of $R^1$, $R^2$, $R^3$ and $R^4$ are H. In some preferable embodiments, only $R^2$ and $R^3$ of $R^1$, $R^2$, $R^3$ and $R^4$ are H, in some embodiments, $R^2$ is H.

When two or more of $R^2$, $R^3$ and $R^4$ are $Ar^3$, in some embodiments, the two or more $Ar^3$'s are the same, and in some other embodiments, the two or more $Ar^3$'s are different from each other. When two or more of $R^1$, $R^2$, $R^3$ and $R^4$ are D, in some embodiments, the two or more D's are the same, and in some other embodiments, the two or more D's are different from each other.

In some embodiments, $R^1$ is H; $R^2$ and $R^3$ are independently D; and $R^4$ is $Ar^3$. In some embodiments, $R^1$ is H; $R^2$ and $R^4$ are independently D; and $R^3$ is $Ar^3$. In some embodiments, $R^1$ is H; $R^3$ and $R^4$ are independently D; and $R^2$ is $Ar^3$. In some embodiments, $R^2$ is H; $R^1$ and $R^3$ are independently D; and $R^4$ is $Ar^3$. In some embodiments, $R^1$ is H; $R^2$ and $R^3$ are D and they are the same; and $R^4$ is $Ar^3$. In some embodiments, $R^1$ is H; $R^2$ and $R^4$ are D and they are the same; and $R^3$ is $Ar^3$. In some embodiments, $R^1$ is H; $R^3$ and $R^4$ are D and they are the same; and $R^2$ is $Ar^3$. In some embodiments, $R^2$ is H; $R^1$ and $R^3$ are D and they are the same; and $R^4$ is $Ar^3$. In some embodiments, $R^1$ and $R^4$ are H; $R^2$ is D; and $R^3$ is $Ar^3$. In some embodiments, $R^2$ and $R^4$ are H; $R^1$ is D; and $R^3$ is $Ar^3$.

In Formulae (1), $Ar^3$ is independently selected from substituted or unsubstituted aryl, and substituted or unsubstituted heteroaryl not having N as a ring-constituting atom. Each instance of aryl and heteroaryl can be substituted with one or more substituents independently selected from deuterium, substituted or unsubstituted alkyl, substituted or unsubstituted aryl, and substituted or unsubstituted heteroaryl not having N as a ring-constituting atom; and two or more of these substituents taken together can form a ring system.

In some embodiments, $Ar^3$ is independently aryl substituted with one or more substituents independently selected from deuterium, substituted or unsubstituted substituted or unsubstituted aryl, and substituted or unsubstituted heteroaryl, and two or more of these substituents taken together can form a ring system. In some embodiments, $Ar^3$ is independently substituted or unsubstituted phenyl. In some embodiments, $Ar^3$ is independently substituted or unsubstituted naphthyl. In some embodiments, $Ar^3$ is unsubstituted phenyl. In some embodiments, $Ar^3$ is independently phenyl substituted with unsubstituted alkyl, unsubstituted aryl or cyano. In some embodiments, $Ar^3$ is independently selected from substituted or unsubstituted phenyl, substituted or unsubstituted biphenyl, and substituted or unsubstituted terphenyl. In some embodiments, $Ar^3$ is independently phenyl, 3-methylphenyl, 4-methylphenyl, 3-ethylphenyl, 4-ethylphenyl, 3-cyanophenyl, 4-cyanophenyl, 3,5-diphenylphenyl, 1-naphthyl, or 2-naphthyl. In some embodiments, $Ar^3$ is independently selected from Ar1 to Ar25 above.

In Formulae (1), D is independently selected from substituted or unsubstituted 1-carbazolyl, substituted or unsubstituted 2-carbazolyl, substituted or unsubstituted 3-carbazolyl, substituted or unsubstituted 4-carbazolyl, or group represented by Formula (II):

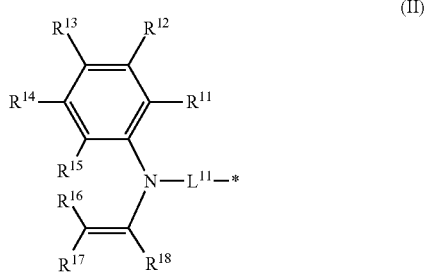

(II)

In Formula (II), $R^{11}$, $R^{12}$, $R^{13}$, $R^{14}$, $R^{15}$, $R^{16}$, $R^{17}$ and $R^{18}$ are independently selected from hydrogen, deuterium, substituted or unsubstituted alkyl, substituted or unsubstituted alkoxy, substituted or unsubstituted amino, substituted or unsubstituted aryl, substituted or unsubstituted aryloxy, substituted or unsubstituted heteroaryl, substituted or unsubstituted heteroaryloxy, and silyl; or two or more of $R^{11}$, $R^{12}$, $R^{13}$, $R^{14}$, $R^{15}$, $R^{16}$, $R^{17}$ and $R^{18}$ taken together can form a ring system, or $R^{15}$ and $R^{16}$ taken together can form single bond.

In some embodiments, the ring system formed by two or more of $R^{11}$, $R^{12}$, $R^{13}$, $R^{14}$, $R^{15}$, $R^{16}$, $R^{17}$ and $R^{18}$ is substituted or unsubstituted aromatic ring. In some embodiments, the ring system is substituted or unsubstituted benzene ring, substituted or unsubstituted naphthalene ring, or substituted or unsubstituted anthracene ring. In some embodiments, the aromatic ring is substituted with one or more substituents independently selected from hydrogen, deuterium, substituted or unsubstituted alkyl, substituted or unsubstituted alkoxy, substituted or unsubstituted amino, substituted or unsubstituted aryl, substituted or unsubstituted aryloxy, substituted or unsubstituted heteroaryl, substituted or unsubstituted heteroaryloxy, and silyl.

In Formula (II), $L^{11}$ is selected from single bond, substituted or unsubstituted arylene, and substituted or unsubstituted heteroarylene. In some embodiments, each instance of arylene and heteroarylene is substituted with one or more substituents independently selected from deuterium, substituted or unsubstituted alkyl, substituted or unsubstituted aryl, and substituted or unsubstituted heteroaryl and two or more of these substituents taken together can form a ring system. In some embodiments, the ring system here is substituted or unsubstituted aromatic ring, or substituted or unsubstituted aliphatic ring. In some embodiments, $L^{11}$ is single bond, unsubstituted phenylene, or phenylene substituted with at least one alkyl.

In some embodiments, D is

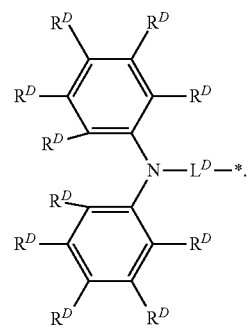

In some embodiments, D is

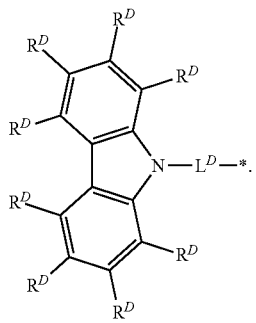

In some embodiments, D is

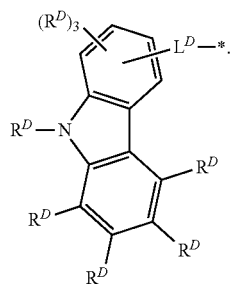

In some embodiments, D is

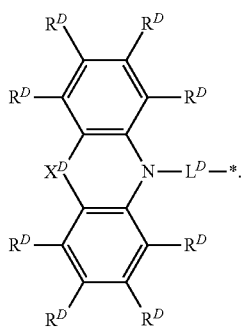

In some embodiments, D is

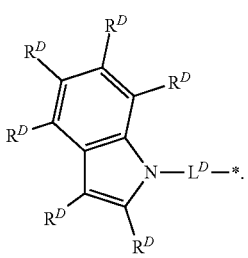

In some embodiments, $X^D$ is O. In some embodiments, $X^D$ is S. In some embodiments, $X^D$ is $NR^{D'}$. In some embodiments, $X^D$ is C(O). In some embodiments, $X^D$ is substituted or unsubstituted methylene. In some embodiments, $X^D$ is substituted or unsubstituted ethylene. In some embodiments, $X^D$ is substituted or unsubstituted vinylene. In some embodiments, $X^D$ is substituted or unsubstituted o-arylene. In some embodiments, $X^D$ is and substituted or unsubstituted o-heteroarylene. In some embodiments, methylene, ethylene, vinylene, o-arylene and o-heteroarylene can be substituted with deuterium, substituted or unsubstituted alkyl, substituted or unsubstituted aryl, and substituted or unsubstituted heteroaryl. In some embodiments, two or more instances of $X^D$ taken together can form a ring system.

In some embodiments, $R^D$ is hydrogen. In some embodiments, $R^D$ is deuterium. In some embodiments, $R^D$ is substituted or unsubstituted alkyl. In some embodiments, $R^D$ is substituted or unsubstituted alkoxy. In some embodiments, $R^D$ is substituted or unsubstituted amino. In some embodiments, $R^D$ is substituted or unsubstituted aryl. In some embodiments, $R^D$ is substituted or unsubstituted aryloxy. In some embodiments, $R^D$ is substituted or unsubstituted heteroalyl. In some embodiments, $R^D$ is substituted or unsubstituted heteroaryloxy. In some embodiments, $R^D$ is silyl. In some of embodiments, two or more instances of $R^D$ taken together can form a ring system.

In some embodiments, $R^{D'}$ is hydrogen, in some embodiments, $R^{D'}$ is deuterium. In some embodiments, $R^{D'}$ is substituted or unsubstituted alkyl. In some embodiments, $R^{D'}$ is substituted or unsubstituted amino. In some embodiments, $R^{D'}$ is substituted or unsubstituted aryl. In some embodiments, $R^{D'}$ is substituted or unsubstituted heteroatyl. In some embodiments, two or more instances of $R^{D'}$ and $R^D$ taken together can form a ring system.

In some embodiments, is a single bond. In some embodiments, $L^D$ is substituted or unsubstituted arylene. In some embodiments, $L^D$ is substituted or unsubstituted heteroarylene.

In some embodiments, when $L^D$ is substituted each substituent is independently selected from deuterium, substituted or unsubstituted alkyl, substituted or unsubstituted aryl, and substituted or unsubstituted heteroaryl; two or more of these substituents taken together can form a ring system.

In some embodiments, D is selected from the followings:

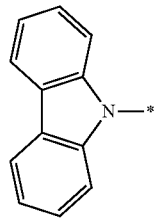

D1

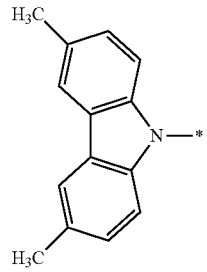

D2

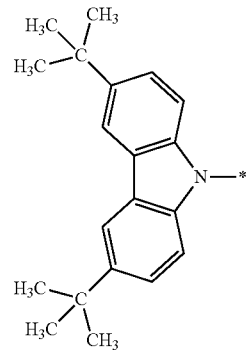

D3

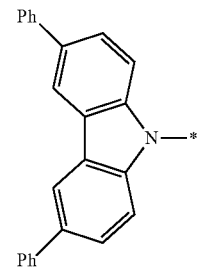

D4

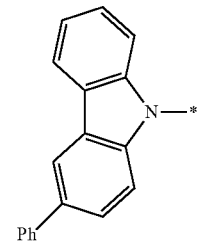

D5

-continued
D6 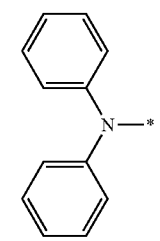
D7 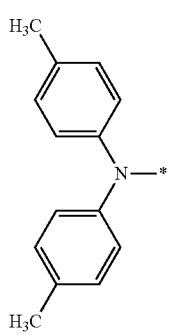
D8 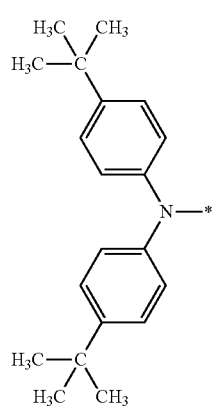
D9 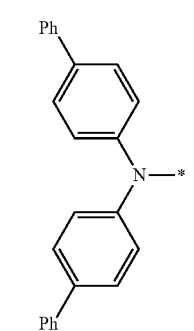
D10 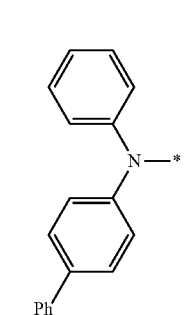
-continued
D11 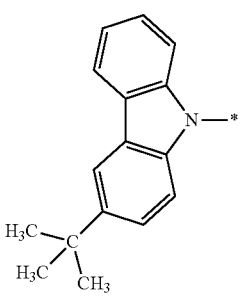
D12 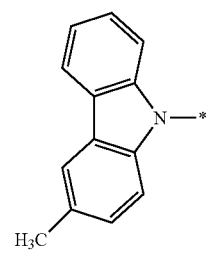
D13 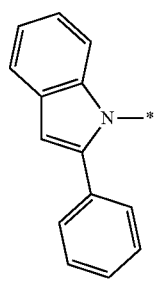
D14 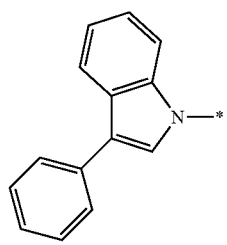
D15 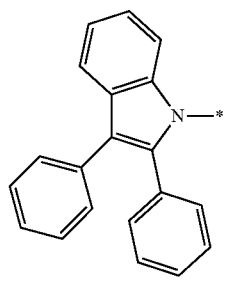

D16
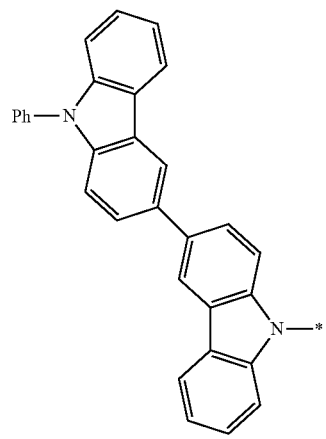
D17
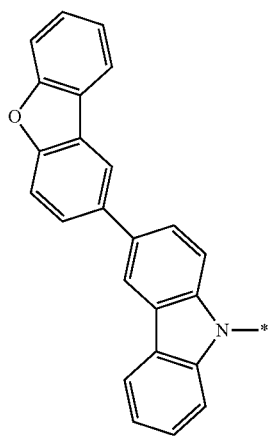
D18
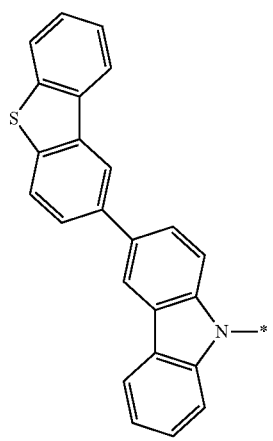
D19
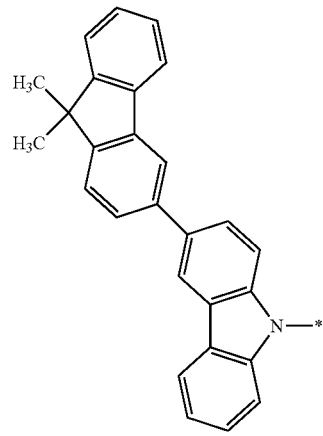
D20
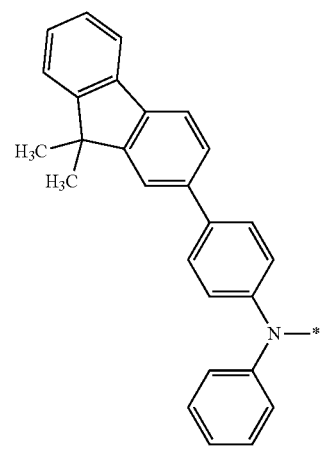
D21
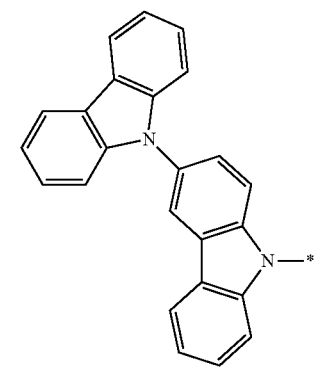

D22
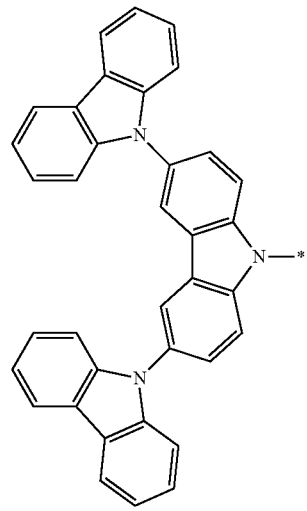
D23
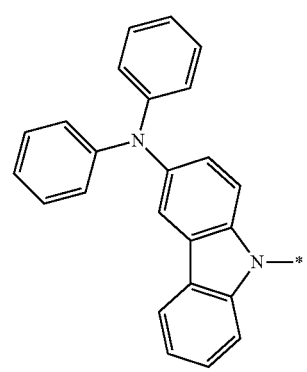
D24
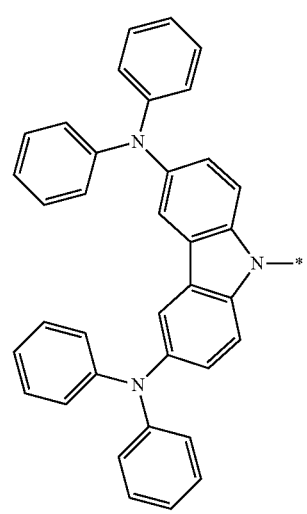
D25
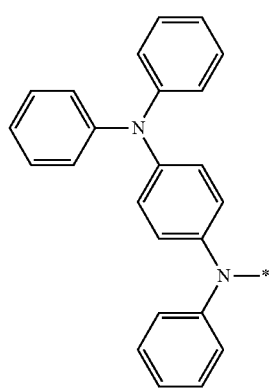
D26
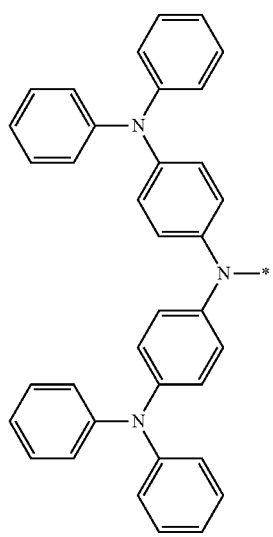
D27
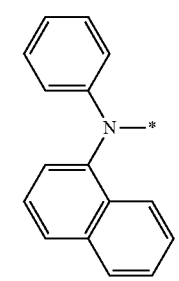
D28
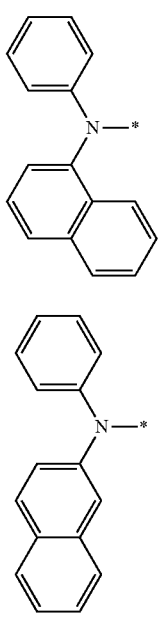

D29 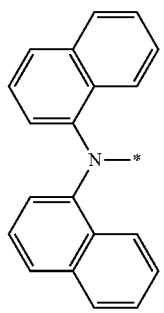
D30 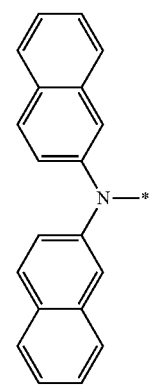
D31 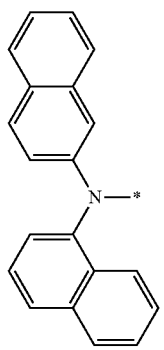
D32 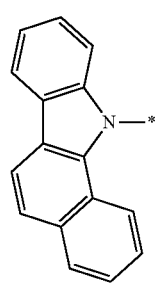
D33 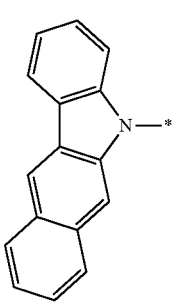
D34 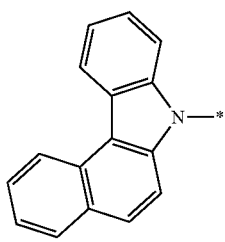
D35 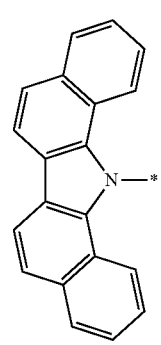
D36 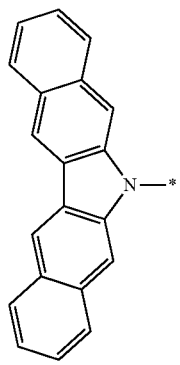
D37 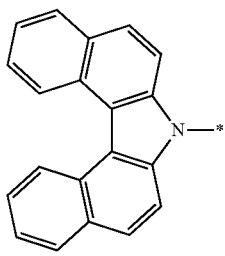
D38 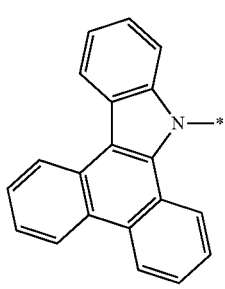

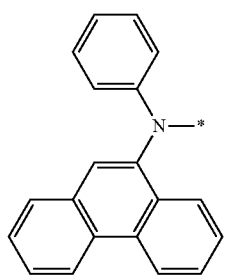 D39
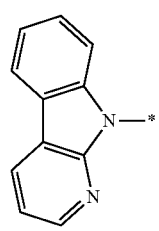 D40
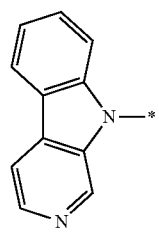 D41
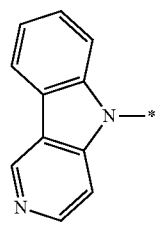 D42
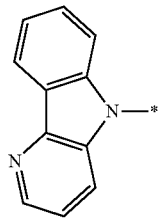 D43
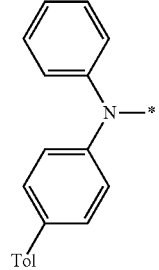 D44
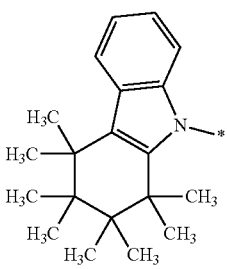 D45
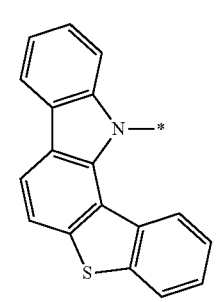 D46
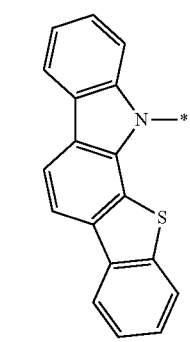 D47
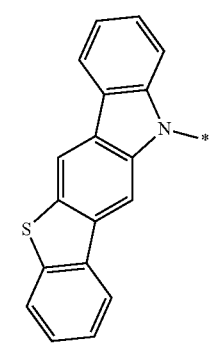 D48
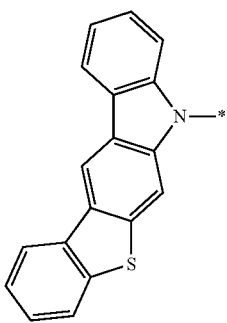 D49

D50
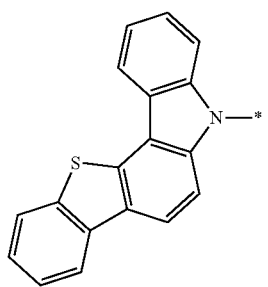
D51
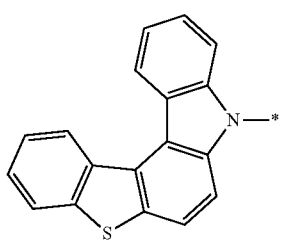
D52
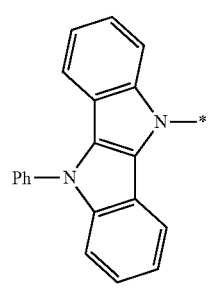
D53
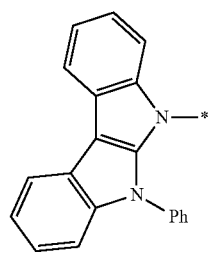
D54
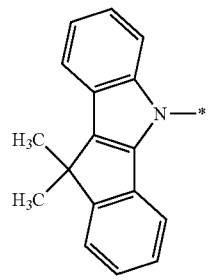
D55
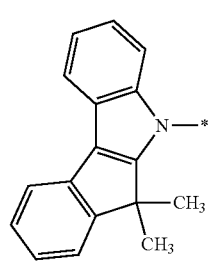
D56
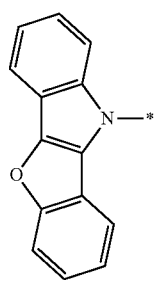
D57
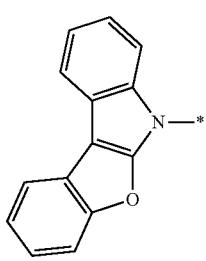
D58
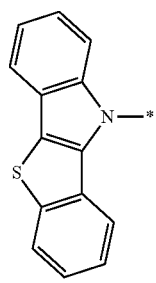
D59
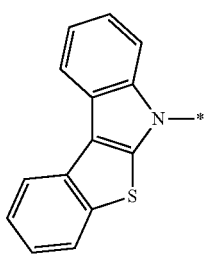
D60
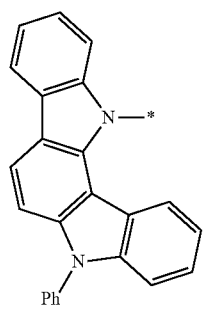

-continued
D61
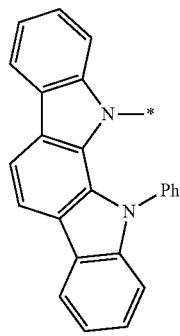
D62
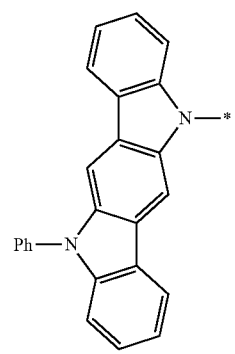
D63
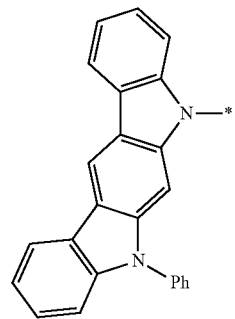
D64
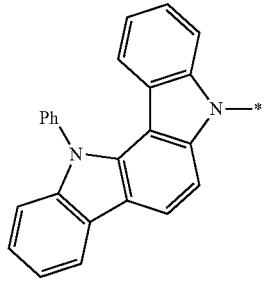
D65
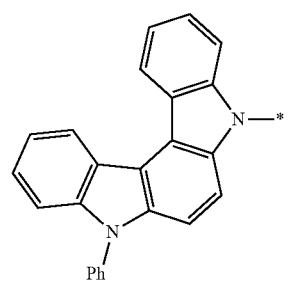
-continued
D66
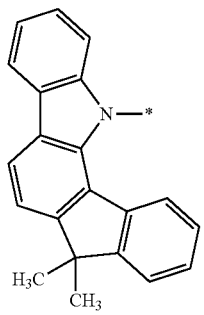
D67
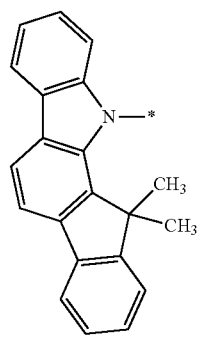
D68
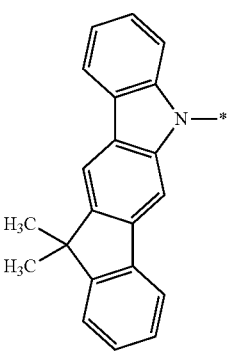
D69
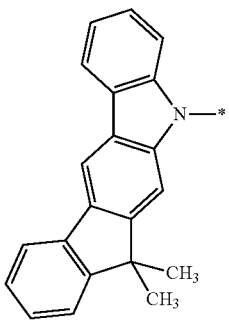
D70
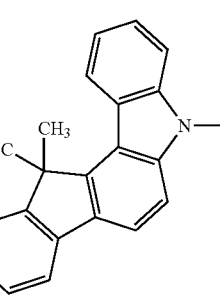

-continued
D71 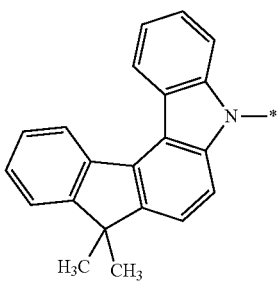
D72 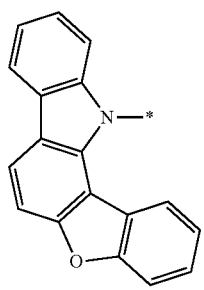
D73 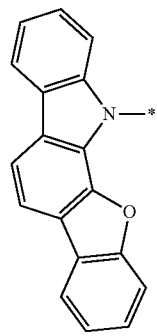
D74 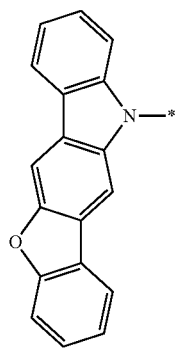
D75 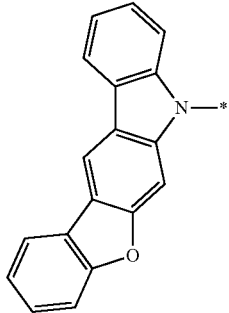
-continued
D76 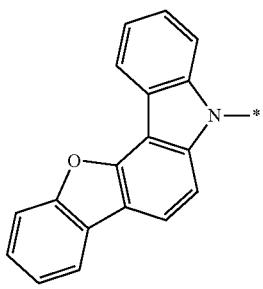
D77 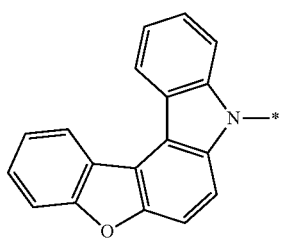
D78 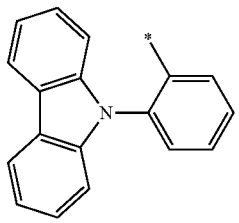
D79 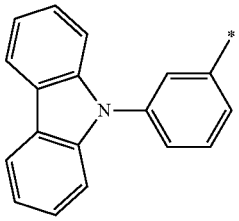
D80 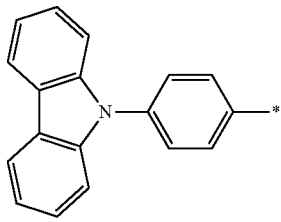
D81 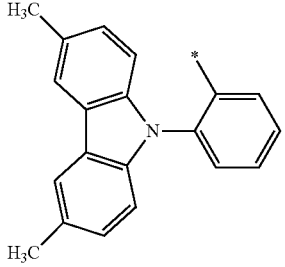

-continued
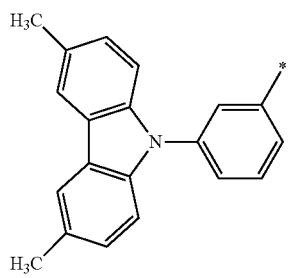
D82
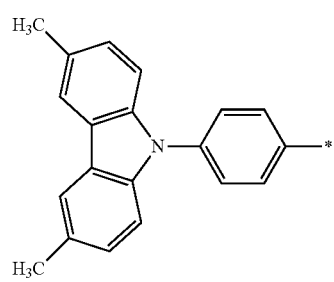
D83
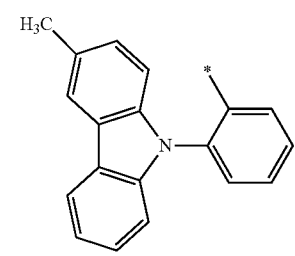
D84
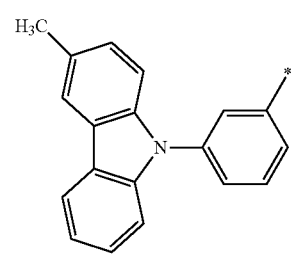
D85
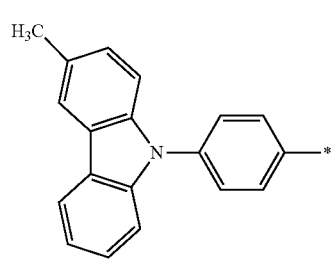
D86
-continued
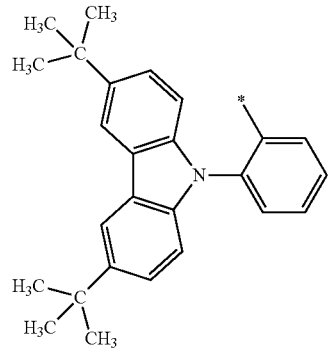
D87
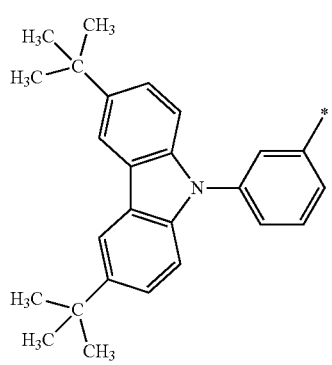
D88
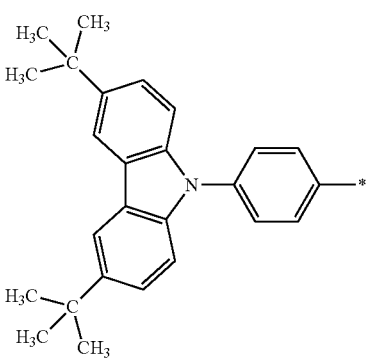
D89
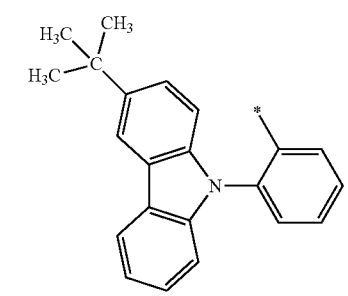
D90
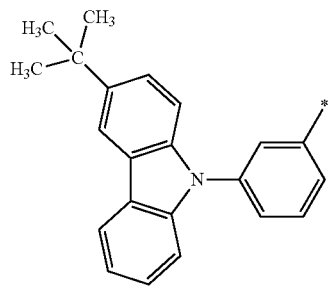
D91

D92 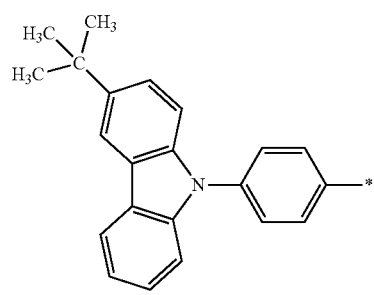
D93 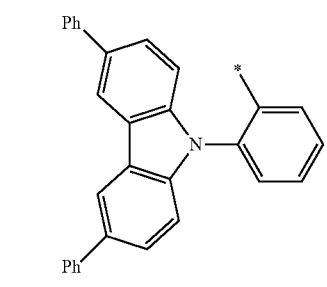
D94 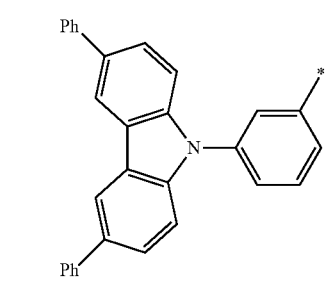
D95 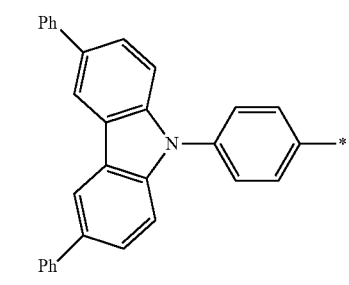
D96 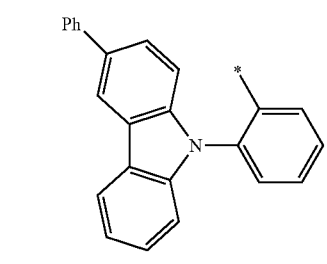
D97 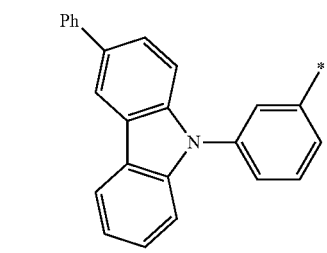
D98 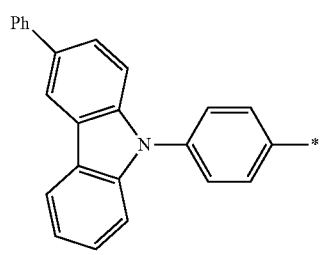
D99 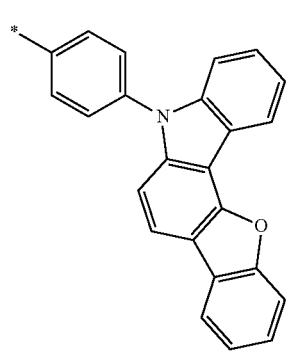
D100 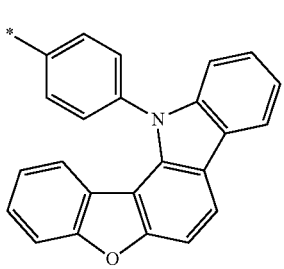
D101 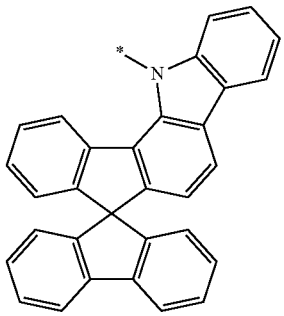
D102 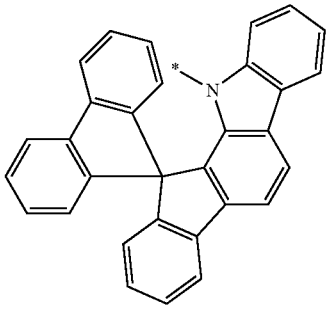

D103 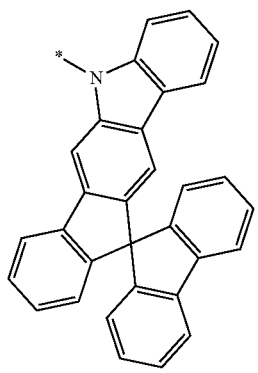
D104 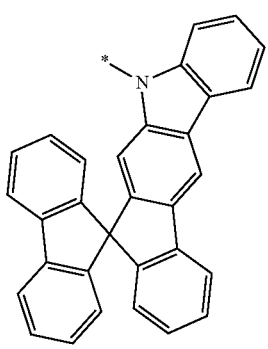
D105 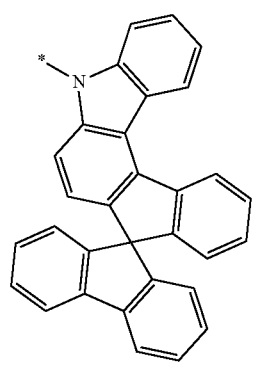
D106 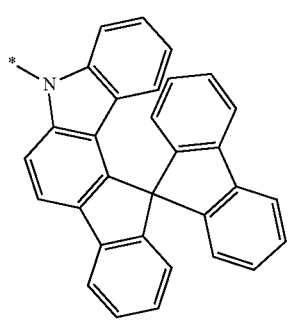
D107 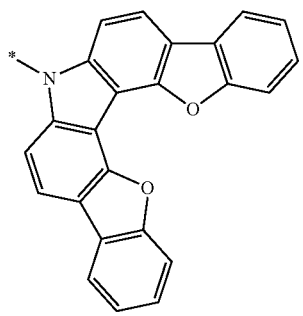
D108 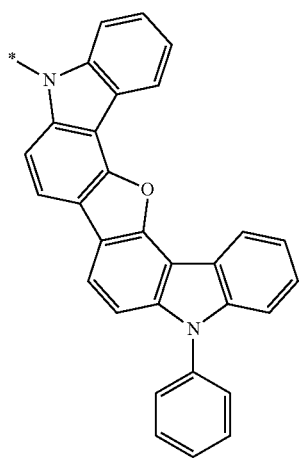
D109 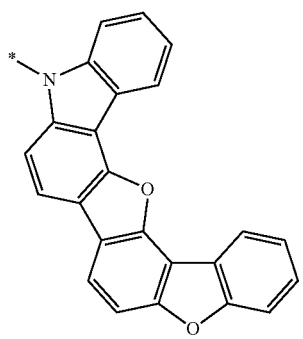
D110 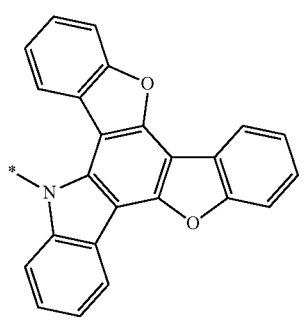

-continued

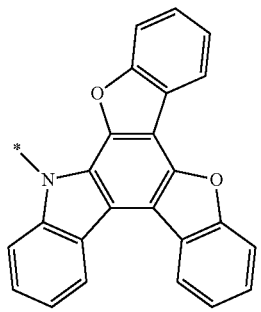

D111

*represetns a bonding position. Ph is unsubstituted phenyl. Tol is p-tolyl.

In some embodiments, alkyl is C1-C20-alkyl. In some embodiments, alkyl is C1-C12 alkyl. In some embodiments, alkyl is C1-C6 alkyl. In some embodiments, alkyl is C1-C3 alkyl. In some embodiments, aryl is C6-C40 aryl. In some embodiments, amyl is C6-C25 aryl. In some embodiments, aryl is C6-C14 aryl. In some embodiments, aryl is C6-C10 aryl. In some embodiments, heteroalyl is C2-C40 heteroaryl. In some embodiments, heteroaryl has 5-40 ring-constituting atoms. In some embodiments, heteroaryl has 5-25 ring-constituting atoms. In some embodiments, heteroaryl has 5-10 ring-constituting atoms. In some embodiments, alkoxy is C1-C20 alkoxy. In some embodiments, alkoxy is C1-C12 alkoxy. In some embodiments, alkoxy is C1-C6 alkoxy. In some embodiments, alkoxy is C1-C3 alkoxy. In some embodiments, aryloxy is C6-C40 aryloxy. In some embodiments, aryloxy is C6-C25 aryloxy. In some embodiments, aryloxy is C6-C14 amyl oxy. In some embodiments, amyl oxy is C6-C10 aryloxy. In some embodiments, heteroaryloxy is C3-C40 heteroaryloxy. In some embodiments, heteroaryloxy has 5-40 ring-constituting atoms. In some embodiments, heteroaryloxy has 5-25 ring-constituting atoms. In some embodiments, heteroaryloxy has 5-10 ring-constituting atoms.

In some preferable embodiments, the compound of Formula (I) is selected from the group (which is hereinafter referred to as "Group 1") satisfying that $R^1$ is H; $R^2$ and $R^3$ are independently D; $R^4$ is $Ar^3$; $X^1$ to $X^3$ are N; and $Ar^1$ and $Ar^2$ are independently substituted or unsubstituted aryl. In some embodiments of Group 1, $L^1$ is single bond. In some embodiments, $R^2$ and $R^3$ are the same. In some embodiments, $R^2$ and $R^3$ are independently substituted or unsubstituted 9-carbazolyl. In some embodiments, $R^2$ and $R^3$ are independently substituted or unsubstituted diarylamino in which the two aryl groups are not bonded to each other. In some embodiments, $R^4$ is substituted or unsubstituted aryl. In some embodiments, $Ar^1$ and $Ar^2$ are the same.

In some preferable embodiments, the compound of Formula (I) is selected from the group (which is hereinafter referred to as "Group 2") satisfying that $R^1$ is H; $R^2$ and $R^3$ are independently $R^4$ is $Ar^3$; $X^1$ and $X^3$ are N; $X^2$ is $C(R^5)$; and $Ar^1$ and $Ar^2$ are independently substituted or unsubstituted aryl. In some embodiments of Group 2, $L^1$ is single bond. In some embodiments, $R^2$ and $R^3$ are the same. In some embodiments, $R^2$ and $R^3$ are independently substituted or unsubstituted 9-carbazolyl. In some embodiments, $R^2$ and $R^3$ are independently substituted or unsubstituted diarylamino in which the two aryl groups are not bonded to each other. In some embodiments, $R^4$ is substituted or unsubstituted aryl. In some embodiments, $Ar^1$ and $Ar^2$ are the same. In some embodiments, $R^5$ is H or unsubstituted alkyl.

In some preferable embodiments, the compound of Formula (I) is selected from the group (which is hereinafter referred to as "Group 3") satisfying that $R^1$ is H; $R^2$ and $R^3$ are independently D; $R^4$ is $Ar^3$; $X^1$ and $X^2$ are N; $X^3$ is $C(R^5)$, and $Ar^1$ and $Ar^2$ are independently substituted or unsubstituted aryl. In some embodiments of Group 3, $L^1$ is single bond. In some embodiments, $R^2$ and $R^3$ are the same, in some embodiments, $R^2$ and $R^3$ are independently substituted or unsubstituted 9-carbazolyl. In some embodiments, $R^2$ and $R^3$ are independently substituted or unsubstituted diarylamino in which the two aryl groups are not bonded to each other. In some embodiments, $R^4$ is substituted or unsubstituted aryl. In some embodiments, $Ar^1$ and $Ar^2$ are the same. In some embodiments, $R^5$ is H or unsubstituted alkyl.

In some preferable embodiments, the compound of Formula (I) is selected from the group (which is hereinafter referred to as "Group 4") satisfying that $R^1$ is H; $R^2$ and $R^3$ are independently D; $R^4$ is $Ar^3$; $X^1$ is N; $X^2$ and $X^3$ are independently $C(R^5)$; and $Ar^1$ and $Ar^2$ are independently substituted or unsubstituted aryl. In some embodiments of Group 4, $L^1$ is single bond. In some embodiments, $R^2$ and $R^3$ are the same. In some embodiments, $R^2$ and $R^3$ are independently substituted or unsubstituted 9-carbazolyl. In some embodiments, $R^2$ and $R^3$ are independently substituted or unsubstituted diarylamino in which the two aryl groups are not bonded to each other. In some embodiments, $R^4$ is substituted or unsubstituted aryl. In some embodiments, $Ar^1$ and $Ar^2$ are the same. In some embodiments, $R^5$ is H or unsubstituted alkyl. In some embodiments, $X^2$ and $X^3$ are the same.

In some preferable embodiments, the compound of Formula (I) is selected from the group (which is hereinafter referred to as "Group 5") satisfying that $R^1$ is H; $R^2$ is $Ar^3$; $R^3$ and $R^4$ are independently D; $X^1$ to $X^3$ are N; and $Ar^1$ and $Ar^2$ are independently substituted or unsubstituted aryl. In some embodiments of Group 5, $L^1$ is single bond. In some embodiments, $R^3$ and $R^4$ are the same. In some embodiments, $R^3$ and $R^4$ are independently substituted or unsubstituted 9-carbazolyl. In some embodiments, $R^3$ and $R^4$ are independently substituted or unsubstituted diary laming in which the two aryl groups are not bonded to each other. In some embodiments, $R^2$ is substituted. or unsubstituted aryl. In some embodiments, $Ar^1$ and $Ar^2$ are the same.

In some preferable embodiments, the compound of Formula (I) is selected from the group (which is hereinafter referred to as "Group 6") satisfying that $R^1$ is H; $R^2$ is $Ar^3$; $R^3$ and $R^4$ are independently D; $X^1$ and $X^2$ are N; $X^3$ is $C(R^5)$; and $Ar^1$ and $Ar^2$ are independently substituted or unsubstituted aryl. In some embodiments of Group 6, $L^1$ is single bond. In some embodiments, $R^3$ and $R^4$ are the same. In some embodiments, $R^3$ and $R^4$ are independently substituted or unsubstituted 9-carbazolyl. In some embodiments, $R^3$ and $R^4$ are independently substituted or unsubstituted diarylamino in which the two aryl groups are not bonded to each other. In some embodiments, $R^2$ is substituted or unsubstituted aryl. In some embodiments, $Ar^1$ and $Ar^2$ are the same. In some embodiments, $R^5$ is H or unsubstituted alkyl.

In some preferable embodiments, the compound of Formula (I) is selected from the group (which is hereinafter referred to as "Group 7") satisfying that $R^1$ is H; $R^2$ is $Ar^3$; $R^3$ and $R^4$ are independently D; $X^1$ and $X^3$ are N; $X^2$ is $C(R^5)$; and $Ar^1$ and $Ar^2$ are independently substituted or unsubstituted amyl. In some embodiments of Group 7, $L^1$ is single bond. In some embodiments, $R^3$ and $R^4$ are the same. In some embodiments, $R^3$ and $R^4$ are independently substituted or unsubstituted. 9-carbazolyl. In some embodiments, R$^3$ and R$^4$ are independently substituted or unsubstituted diarylamino in which the two aryl groups are not bonded to each other. In some embodiments, R$^2$ is substituted or unsubstituted aryl. In some embodiments, Ar$^1$ and Ar$^2$ are the same. In some embodiments, R$^5$ is H or unsubstituted alkyl.

In some preferable embodiments, the compound of Formula (I) is selected from the group (which is hereinafter referred to as "Group 8") satisfying that R$^1$ is H; R$^2$ is Ar$^3$; R$^3$ and R$^4$ are independently D; X$^1$ is C(R$^5$); X$^2$ and X$^3$ are N; and Ar$^1$ and Ar$^2$ are independently substituted or unsubstituted aryl. In some embodiments of Group 8, L$^1$ is single bond. In some embodiments, R$^3$ and R$^4$ are the same. In some embodiments, R$^3$ and R$^4$ are independently substituted or unsubstituted 9-carbazolyl. In some embodiments, R$^3$ and R$^4$ are independently substituted or unsubstituted diarylamino in which the two amyl groups are not bonded to each other. In some embodiments, R$^2$ is substituted or unsubstituted aryl. In some embodiments, Ar$^1$ and Ar$^2$ are the same. In some embodiments, R$^5$ is H or unsubstituted alkyl. In some embodiments, X$^2$ and X$^3$ are the same.

In some preferable embodiments, the compound of Formula (I) is selected from the group (which is hereinafter referred to as "Group 9") satisfying that R$^1$ is H; R$^3$ is Ar$^3$; R$^2$ and R$^4$ are independently D; X$^1$ to X$^3$ are N; and Ar$^1$ and Ar$^2$ are independently substituted or unsubstituted aryl. In some embodiments of Group 9, L$^1$ is single bond. In some embodiments, R$^2$ and R$^4$ are the same. In some embodiments, R$^2$ and R$^4$ are independently substituted or unsubstituted 9-carbazolyl. In some embodiments, R$^2$ and R$^4$ are independently substituted or unsubstituted diarylamino in which the two aryl groups are not bonded to each other. In some embodiments, R$^3$ is substituted or unsubstituted aryl. In some embodiments, Ar$^1$ and Ar$^2$ are the same. In some embodiments, R$^5$ is H or unsubstituted In some preferable embodiments, the compound of Formula (I) is selected from the group (Which is hereinafter referred to as "Group 10") satisfying that R$^1$ is H; R$^3$ is Ar$^3$; R$^2$ and R$^4$ are independently D; X$^1$ and X$^3$ are N; X$^2$ is C(R$^5$); and Ar$^1$ and Ar$^2$ are independently substituted or unsubstituted aryl. In some embodiments of Group 10, L$^1$ is single bond. In some embodiments, R$^2$ and R$^4$ are the same. In some embodiment, R$^2$ and R$^4$ are independently substituted or unsubstituted 9-carbazolyl. In some embodiments, R$^2$ and R$^4$ are independently substituted or unsubstituted diarylamino in which the two aryl groups are not bonded to each other. In some embodiments, R$^3$ is substituted or unsubstituted aryl. In some embodiments, Ar$^1$ and Ar$^2$ are the same. In some embodiments, R$^5$ is H or unsubstituted In some preferable embodiments, the compound of Formula (I) is selected from the group (which is hereinafter referred to as "Group 11") satisfying that R$^1$ is H; R$^3$ is Ar$^3$; R$^2$ and R$^4$ are independently D; X$^1$ and X$^2$ are N; X$^3$ is C(R$^5$); and Ar$^1$ and Ar$^2$ are independently substituted or unsubstituted aryl. In some embodiments of Group 11. L$^1$ is single bond. In some embodiments, R$^2$ and R$^4$ are the same. In some embodiments, R$^2$ and R$^4$ are independently substituted or unsubstituted 9-carbazolyl. In some embodiments, R$^2$ and R$^4$ are independently substituted or unsubstituted diarylamino in which the two aryl groups are not bonded to each other. In some embodiments, R$^3$ is substituted or unsubstituted aryl. In some embodiments, Ar$^1$ and Ar$^2$ are the same. In some embodiments, R$^5$ is H or unsubstituted alkyl.

In some preferable embodiments, the compound of Formula (I) is selected from the group (which is hereinafter referred to as "Group 12") satisfying that R$^1$ is H; R$^3$ is Ar$^3$; R$^2$ and R$^4$ are independently D; X$^1$ is N; X$^2$ and X$^3$ are independently C(R$^5$); and Ar$^1$ and Ar$^2$ are independently substituted or unsubstituted aryl. In some embodiments of Group 12, L$^1$ is single bond. In some embodiments, R$^2$ and R$^4$ are the same, in some embodiments, R$^2$ and R$^4$ are independently substituted or unsubstituted 9-carbazolyl. In some embodiments, R$^2$ and R$^4$ are independently substituted or unsubstituted diarylamino in which the two aryl groups are not bonded to each other. In some embodiments, R$^3$ is substituted or unsubstituted aryl. In some embodiments, Ar$^1$ and Ar$^2$ are the same. In some embodiments, R$^5$ is H or unsubstituted alkyl. In some embodiments, X$^2$ and X$^3$ are the same.

In some preferable embodiments, the compound of Formula (I) is selected from the group (which is hereinafter referred to as "Group 13") satisfying that R$^1$ is H; R$^3$ is Ar$^3$; R$^2$ and R$^4$ are independently D; X$^1$ and X$^3$ are independently C(R$^5$); X$^2$ is N; and Ar$^1$ and Ar$^2$ are independently substituted or unsubstituted aryl. In some embodiments of Group 13, L$^1$ is single bond. In some embodiments, R$^2$ and R$^4$ are the same. In some embodiments, R$^2$ and R$^4$ are independently substituted or unsubstituted 9-carbazolyl. In some embodiments, R$^2$ and R$^4$ are independently substituted or unsubstituted diarylamino in which the two aryl groups are not bonded to each other. In some embodiments, R$^3$ is substituted or unsubstituted aryl. In some embodiments, Ar$^1$ and Ar$^2$ are the same. In some embodiments, R$^5$ is H or unsubstituted alkyl. In some embodiments, X$^1$ and X$^3$ are the same.

In some preferable embodiments, the compound of Formula (I) is selected from the group (which is hereinafter referred to as "Group 14") satisfying that R$^1$ is H; one or two of R$^2$ to R$^4$ are carbolinyl; the others are independently D; L$^1$ is single bond; and Ar$^1$ and Ar$^2$ are independently substituted or unsubstituted aryl. In some embodiments of Group 14, X$^1$ to X$^3$ are N. In some embodiments, X$^1$ and X$^2$ are N; and X$^3$ is C(R$^5$). In some embodiments, X$^1$ is N; and X$^2$ and X$^3$ are independently C(R$^5$), preferably X$^2$ and X$^3$ are the same. In some embodiments, R$^5$ is H or unsubstituted alkyl. In some embodiments, Ar$^1$ and Ar$^2$ are the same. In some embodiments, Ar$^1$ and Ar$^2$ are different from each other. In some embodiments, two of R$^2$ to R$^4$ are the same. In some embodiments, R$^2$ to R$^4$ are different from each other.

In some preferable embodiments, the compound of Formula (I) is selected from the group (which is hereinafter referred to as "Group 15") satisfying that R$^1$ and R$^4$ are H; R$^2$ is D; R$^3$ is Ar$^3$ X$^1$ to X$^3$ are N; and Ar$^1$ and Ar$^2$ are independently substituted or unsubstituted aryl. In some embodiments of Group 15, L$^1$ is single bond. In some embodiments, R$^2$ is substituted or unsubstituted 9-carbazolyl. In some embodiments, R$^2$ is substituted or unsubstituted 9-carbazolyl that is fused with a substituted or unsubstituted benzofuran, a substituted or unsubstituted benzothiophene, or a substituted or unsubstituted indane. In some embodiments, Ar$^1$ and Ar$^2$ are the same.

In some preferable embodiments, the compound of Formula (I) is selected from the group (which is hereinafter referred to as "Group 16") satisfying that R$^1$ and R$^2$ are H; R$^3$ is Ar$^3$; R$^4$ is X$^1$ to X$^3$ are and Ar$^1$ and Ar$^2$ are independently substituted or unsubstituted aryl. In some embodiments of Group 16, L$^1$ is single bond. In some embodiments, R$^4$ is substituted or unsubstituted 9-carbazolyl. In some embodiments, R$^4$ is substituted or unsubstituted 9-carbazolyl that is fused with a substituted or unsubstituted benzofuran, a substituted or unsubstituted benzothiophene, or a substituted or unsubstituted indane. In some embodiments, Ar$^1$ and Ar$^2$ are the same.

In some preferable embodiments, the compound of Formula (I) is selected from the group (which is hereinafter referred to as "Group 17") satisfying that $R^1$ is D; $R^2$ and $R^4$ are H; $R^3$ is $Ar^3$; $X^1$ to $X^3$ are N; and $Ar^1$ and $Ar^2$ are independently substituted or unsubstituted aryl. In some embodiments of Group 17, $L^1$ is single bond. In some embodiments, $R^1$ is substituted or unsubstituted 9-carbazolyl. In some embodiments, $R^1$ is substituted or unsubstituted 9-carbazolyl that is fused with a substituted or unsubstituted benzofuran, a substituted or unsubstituted benzothiophene, or a substituted or unsubstituted indane. In some embodiments, $Ar^1$ and $Ar^2$ are the same.

In some preferable embodiments, the compound of Formula (I) is selected from the group (which is hereinafter referred to as "Group 18") satisfying that $R^1$ and $R^3$ are H; $R^2$ is $Ar^3$; $R^4$ is D; $X^1$ to $X^3$ are N; and $Ar^1$ and $Ar^2$ are independently substituted or unsubstituted aryl. In some embodiments of Group 18, $L^1$ is single bond. In some embodiments, $R^4$ is substituted or unsubstituted 9-carbazolyl. In some embodiments, $R^4$ is substituted or unsubstituted 9-carbazolyl that is fused with a substituted or unsubstituted benzofuran, a substituted or unsubstituted benzothiophene, or a substituted or unsubstituted indane. In some embodiments, $Ar^1$ and $Ar^2$ are the same.

In some preferable embodiments, the compound of Formula (I) is selected from the group (which is hereinafter referred to as "Group 19") satisfying that $R^1$ and $R^4$ are H; $R^2$ is $Ar^3$; $R^3$ is D; $X^1$ to $X^3$ are N; and $Ar^1$ and $Ar^2$ are independently substituted or unsubstituted aryl. In some embodiments of Group 19, $L^1$ is single bond. In some embodiments, $R^3$ is substituted or unsubstituted 9-carbazolyl. In some embodiments, $R^3$ is substituted or unsubstituted 9-carbazolyl that is fused with a substituted or unsubstituted benzofuran, a substituted or unsubstituted benzothiophene, or a substituted or unsubstituted indane. In some embodiments, $Ar^1$ and $Ar^2$ are the same.

In some preferable embodiments, the compound of Formula (I) is selected from the group (which is hereinafter referred to as "Group 20") satisfying that $R^1$ and $R^3$ are H; $R^2$ is D; $R^4$ is $Ar^3$; $X^1$ to $X^3$ are N; and $Ar^1$ and $Ar^2$ are independently substituted or unsubstituted aryl. In some embodiments of Group 20, $L^1$ is single bond. In some embodiments, $R^2$ is substituted or unsubstituted 9-carbazolyl. In some embodiments, $R^2$ is substituted or unsubstituted 9-carbazolyl that is fused with a substituted or unsubstituted benzofuran, a substituted or unsubstituted benzothiophene, or a substituted or unsubstituted indane. In some embodiments, $Ar^1$ and $Ar^2$ are the same.

In some preferable embodiments, the compound of Formula (1) is selected from the group (which is hereinafter referred to as "Group 21") satisfying that $R^1$ and $R^2$ are H; $R^3$ is D; $R^4$ is $Ar^3$; $X^1$ to $X^3$ are N; and $Ar^1$ and $Ar^2$ are independently substituted or unsubstituted aryl. In some embodiments of Group 21, $L^1$ is single bond. In some embodiments, $R^3$ is substituted or unsubstituted 9-carbazolyl. In some embodiments, $R^3$ is substituted or unsubstituted 9-carbazolyl that is fused with a substituted or unsubstituted benzofuran, substituted or unsubstituted benzothiophene, or a substituted or unsubstituted indane. In some embodiments, $Ar^1$ and $Ar^2$ are the same.

In some preferable embodiments, the compound of Formula (1) is selected from the group (which is hereinafter referred to as "Group 22") satisfying that $R^1$ is D; $R^2$ is $Ar^3$; $R^3$ and $R^4$ are H; $X^1$ to $X^3$ are N; and $Ar^1$ and $Ar^2$ are independently substituted or unsubstituted aryl. In some embodiments of Group 22, $L^1$ is single bond. In some embodiments, $R^1$ is substituted or unsubstituted 9-carbazolyl. In some embodiments, $R^1$ is substituted or unsubstituted 9-carbazolyl that is fused with a substituted or unsubstituted benzofuran, substituted or unsubstituted benzothiophene, or a substituted or unsubstituted indane. In some embodiments, $Ar^1$ and $Ar^2$ are the same.

In some embodiments, the compound of Formula (I) is selected from the compounds shown in tables of U.S. Provisional Patent Application Ser. No. 62/896,096 and U.S. Provisional Patent Application Ser. No. 62/994,956. Particularly, the compound of Formula (I) is selected from Compounds 1 to 4678 shown in U.S. Provisional Patent Application Ser. No. 62/994,956, which is hereby expressly incorporated by reference into the present application.

In some embodiments, the compound of Formula (I) is selected from the compounds shown in the following tables.

| No. | $R^1$ | $R^2$ | $R^3$ | $R^4$ | $L^1$ | $X^1$ | $X^2$ | $X^3$ | $Ar^1$ | $Ar^2$ |
|---|---|---|---|---|---|---|---|---|---|---|
| 4679 | H | D1 | Ar1 | H | L1 | N | N | N | Ar1 | Ar1 |
| 4680 | H | D46 | Ar1 | H | L1 | N | N | N | Ar1 | Ar1 |
| 4681 | H | D47 | Ar1 | H | L1 | N | N | N | Ar1 | Ar1 |
| 4682 | H | D48 | Ar1 | H | L1 | N | N | N | Ar1 | Ar1 |
| 4683 | H | D49 | Ar1 | H | L1 | N | N | N | Ar1 | Ar1 |
| 4684 | H | D50 | Ar1 | H | L1 | N | N | N | Ar1 | Ar1 |
| 4685 | H | D51 | Ar1 | H | L1 | N | N | N | Ar1 | Ar1 |
| 4686 | H | D60 | Ar1 | H | L1 | N | N | N | Ar1 | Ar1 |
| 4687 | H | D61 | Ar1 | H | L1 | N | N | N | Ar1 | Ar1 |
| 4688 | H | D62 | Ar1 | H | L1 | N | N | N | Ar1 | Ar1 |
| 4689 | H | D63 | Ar1 | H | L1 | N | N | N | Ar1 | Ar1 |
| 4690 | H | D64 | Ar1 | H | L1 | N | N | N | Ar1 | Ar1 |
| 4691 | H | D65 | Ar1 | H | L1 | N | N | N | Ar1 | Ar1 |
| 4692 | H | D72 | Ar1 | H | L1 | N | N | N | Ar1 | Ar1 |
| 4693 | H | D73 | Ar1 | H | L1 | N | N | N | Ar1 | Ar1 |
| 4694 | H | D74 | Ar1 | H | L1 | N | N | N | Ar1 | Ar1 |
| 4695 | H | D75 | Ar1 | H | L1 | N | N | N | Ar1 | Ar1 |
| 4696 | H | D76 | Ar1 | H | L1 | N | N | N | Ar1 | Ar1 |
| 4697 | H | D77 | Ar1 | H | L1 | N | N | N | Ar1 | Ar1 |
| 4698 | H | D99 | Ar1 | H | L1 | N | N | N | Ar1 | Ar1 |
| 4699 | H | D100 | Ar1 | H | L1 | N | N | N | Ar1 | Ar1 |
| 4700 | H | D101 | Ar1 | H | L1 | N | N | N | Ar1 | Ar1 |
| 4701 | H | D102 | Ar1 | H | L1 | N | N | N | Ar1 | Ar1 |
| 4702 | H | D103 | Ar1 | H | L1 | N | N | N | Ar1 | Ar1 |
| 4703 | H | D104 | Ar1 | H | L1 | N | N | N | Ar1 | Ar1 |
| 4704 | H | D105 | Ar1 | H | L1 | N | N | N | Ar1 | Ar1 |
| 4705 | H | D106 | Ar1 | H | L1 | N | N | N | Ar1 | Ar1 |
| 4706 | H | D107 | Ar1 | H | L1 | N | N | N | Ar1 | Ar1 |
| 4707 | H | D108 | Ar1 | H | L1 | N | N | N | Ar1 | Ar1 |
| 4708 | H | D109 | Ar1 | H | L1 | N | N | N | Ar1 | Ar1 |
| 4709 | H | D110 | Ar1 | H | L1 | N | N | N | Ar1 | Ar1 |
| 4710 | H | D111 | Ar1 | H | L1 | N | N | N | Ar1 | Ar1 |
| 4711 | H | D1 | Ar1 | H | L1 | N | N | N | Ar8 | Ar8 |
| 4712 | H | D46 | Ar1 | H | L1 | N | N | N | Ar8 | Ar8 |
| 4713 | H | D47 | Ar1 | H | L1 | N | N | N | Ar8 | Ar8 |
| 4714 | H | D48 | Ar1 | H | L1 | N | N | N | Ar8 | Ar8 |
| 4715 | H | D49 | Ar1 | H | L1 | N | N | N | Ar8 | Ar8 |
| 4716 | H | D50 | Ar1 | H | L1 | N | N | N | Ar8 | Ar8 |
| 4717 | H | D51 | Ar1 | H | L1 | N | N | N | Ar8 | Ar8 |
| 4718 | H | D60 | Ar1 | H | L1 | N | N | N | Ar8 | Ar8 |
| 4719 | H | D61 | Ar1 | H | L1 | N | N | N | Ar8 | Ar8 |
| 4720 | H | D62 | Ar1 | H | L1 | N | N | N | Ar8 | Ar8 |
| 4721 | H | D63 | Ar1 | H | L1 | N | N | N | Ar8 | Ar8 |
| 4722 | H | D64 | Ar1 | H | L1 | N | N | N | Ar8 | Ar8 |
| 4723 | H | D65 | Ar1 | H | L1 | N | N | N | Ar8 | Ar8 |
| 4724 | H | D72 | Ar1 | H | L1 | N | N | N | Ar8 | Ar8 |
| 4725 | H | D73 | Ar1 | H | L1 | N | N | N | Ar8 | Ar8 |
| 4726 | H | D74 | Ar1 | H | L1 | N | N | N | Ar8 | Ar8 |
| 4727 | H | D75 | Ar1 | H | L1 | N | N | N | Ar8 | Ar8 |
| 4728 | H | D76 | Ar1 | H | L1 | N | N | N | Ar8 | Ar8 |
| 4729 | H | D77 | Ar1 | H | L1 | N | N | N | Ar8 | Ar8 |
| 4730 | H | D99 | Ar1 | H | L1 | N | N | N | Ar8 | Ar8 |
| 4731 | H | D100 | Ar1 | H | L1 | N | N | N | Ar8 | Ar8 |
| 4732 | H | D101 | Ar1 | H | L1 | N | N | N | Ar8 | Ar8 |
| 4733 | H | D102 | Ar1 | H | L1 | N | N | N | Ar8 | Ar8 |
| 4734 | H | D103 | Ar1 | H | L1 | N | N | N | Ar8 | Ar8 |
| 4735 | H | D104 | Ar1 | H | L1 | N | N | N | Ar8 | Ar8 |
| 4736 | H | D105 | Ar1 | H | L1 | N | N | N | Ar8 | Ar8 |
| 4737 | H | D106 | Ar1 | H | L1 | N | N | N | Ar8 | Ar8 |

| No. | R¹ | R² | R³ | R⁴ | L¹ | X¹ | X² | X³ | Ar¹ | Ar² |
|---|---|---|---|---|---|---|---|---|---|---|
| 4738 | H | D107 | Ar1 | H | L1 | N | N | N | Ar8 | Ar8 |
| 4739 | H | D108 | Ar1 | H | L1 | N | N | N | Ar8 | Ar8 |
| 4740 | H | D109 | Ar1 | H | L1 | N | N | N | Ar8 | Ar8 |
| 4741 | H | D110 | Ar1 | H | L1 | N | N | N | Ar8 | Ar8 |
| 4742 | H | D111 | Ar1 | H | L1 | N | N | N | Ar8 | Ar8 |
| 4743 | H | D1 | Ar1 | H | L7 | N | N | N | Ar1 | Ar1 |
| 4744 | H | D46 | Ar1 | H | L7 | N | N | N | Ar1 | Ar1 |
| 4745 | H | D47 | Ar1 | H | L7 | N | N | N | Ar1 | Ar1 |
| 4746 | H | D48 | Ar1 | H | L7 | N | N | N | Ar1 | Ar1 |
| 4747 | H | D49 | Ar1 | H | L7 | N | N | N | Ar1 | Ar1 |
| 4748 | H | D50 | Ar1 | H | L7 | N | N | N | Ar1 | Ar1 |
| 4749 | H | D51 | Ar1 | H | L7 | N | N | N | Ar1 | Ar1 |
| 4750 | H | D60 | Ar1 | H | L7 | N | N | N | Ar1 | Ar1 |
| 4751 | H | D61 | Ar1 | H | L7 | N | N | N | Ar1 | Ar1 |
| 4752 | H | D62 | Ar1 | H | L7 | N | N | N | Ar1 | Ar1 |
| 4753 | H | D63 | Ar1 | H | L7 | N | N | N | Ar1 | Ar1 |
| 4754 | H | D64 | Ar1 | H | L7 | N | N | N | Ar1 | Ar1 |
| 4755 | H | D65 | Ar1 | H | L7 | N | N | N | Ar1 | Ar1 |
| 4756 | H | D72 | Ar1 | H | L7 | N | N | N | Ar1 | Ar1 |
| 4757 | H | D73 | Ar1 | H | L7 | N | N | N | Ar1 | Ar1 |
| 4758 | H | D74 | Ar1 | H | L7 | N | N | N | Ar1 | Ar1 |
| 4759 | H | D75 | Ar1 | H | L7 | N | N | N | Ar1 | Ar1 |
| 4760 | H | D76 | Ar1 | H | L7 | N | N | N | Ar1 | Ar1 |
| 4761 | H | D77 | Ar1 | H | L7 | N | N | N | Ar1 | Ar1 |
| 4762 | H | D99 | Ar1 | H | L7 | N | N | N | Ar1 | Ar1 |
| 4763 | H | D100 | Ar1 | H | L7 | N | N | N | Ar1 | Ar1 |
| 4764 | H | D101 | Ar1 | H | L7 | N | N | N | Ar1 | Ar1 |
| 4765 | H | D102 | Ar1 | H | L7 | N | N | N | Ar1 | Ar1 |
| 4766 | H | D103 | Ar1 | H | L7 | N | N | N | Ar1 | Ar1 |
| 4767 | H | D104 | Ar1 | H | L7 | N | N | N | Ar1 | Ar1 |
| 4768 | H | D105 | Ar1 | H | L7 | N | N | N | Ar1 | Ar1 |
| 4769 | H | D106 | Ar1 | H | L7 | N | N | N | Ar1 | Ar1 |
| 4770 | H | D107 | Ar1 | H | L7 | N | N | N | Ar1 | Ar1 |
| 4771 | H | D108 | Ar1 | H | L7 | N | N | N | Ar1 | Ar1 |
| 4772 | H | D109 | Ar1 | H | L7 | N | N | N | Ar1 | Ar1 |
| 4773 | H | D110 | Ar1 | H | L7 | N | N | N | Ar1 | Ar1 |
| 4774 | H | D111 | Ar1 | H | L7 | N | N | N | Ar1 | Ar1 |
| 4775 | H | H | Ar1 | D1 | L1 | N | N | N | Ar1 | Ar1 |
| 4776 | H | H | Ar1 | D46 | L1 | N | N | N | Ar1 | Ar1 |
| 4777 | H | H | Ar1 | D47 | L1 | N | N | N | Ar1 | Ar1 |
| 4778 | H | H | Ar1 | D48 | L1 | N | N | N | Ar1 | Ar1 |
| 4779 | H | H | Ar1 | D49 | L1 | N | N | N | Ar1 | Ar1 |
| 4780 | H | H | Ar1 | D50 | L1 | N | N | N | Ar1 | Ar1 |
| 4781 | H | H | Ar1 | D51 | L1 | N | N | N | Ar1 | Ar1 |
| 4782 | H | H | Ar1 | D60 | L1 | N | N | N | Ar1 | Ar1 |
| 4783 | H | H | Ar1 | D61 | L1 | N | N | N | Ar1 | Ar1 |
| 4784 | H | H | Ar1 | D62 | L1 | N | N | N | Ar1 | Ar1 |
| 4785 | H | H | Ar1 | D63 | L1 | N | N | N | Ar1 | Ar1 |
| 4786 | H | H | Ar1 | D64 | L1 | N | N | N | Ar1 | Ar1 |
| 4787 | H | H | Ar1 | D65 | L1 | N | N | N | Ar1 | Ar1 |
| 4788 | H | H | Ar1 | D72 | L1 | N | N | N | Ar1 | Ar1 |
| 4789 | H | H | Ar1 | D73 | L1 | N | N | N | Ar1 | Ar1 |
| 4790 | H | H | Ar1 | D74 | L1 | N | N | N | Ar1 | Ar1 |
| 4791 | H | H | Ar1 | D75 | L1 | N | N | N | Ar1 | Ar1 |
| 4792 | H | H | Ar1 | D76 | L1 | N | N | N | Ar1 | Ar1 |
| 4793 | H | H | Ar1 | D77 | L1 | N | N | N | Ar1 | Ar1 |
| 4794 | H | H | Ar1 | D99 | L1 | N | N | N | Ar1 | Ar1 |
| 4795 | H | H | Ar1 | D100 | L1 | N | N | N | Ar1 | Ar1 |
| 4796 | H | H | Ar1 | D101 | L1 | N | N | N | Ar1 | Ar1 |
| 4797 | H | H | Ar1 | D102 | L1 | N | N | N | Ar1 | Ar1 |
| 4798 | H | H | Ar1 | D103 | L1 | N | N | N | Ar1 | Ar1 |
| 4799 | H | H | Ar1 | D104 | L1 | N | N | N | Ar1 | Ar1 |
| 4800 | H | H | Ar1 | D105 | L1 | N | N | N | Ar1 | Ar1 |
| 4801 | H | H | Ar1 | D106 | L1 | N | N | N | Ar1 | Ar1 |
| 4802 | H | H | Ar1 | D107 | L1 | N | N | N | Ar1 | Ar1 |
| 4803 | H | H | Ar1 | D108 | L1 | N | N | N | Ar1 | Ar1 |
| 4804 | H | H | Ar1 | D109 | L1 | N | N | N | Ar1 | Ar1 |
| 4805 | H | H | Ar1 | D110 | L1 | N | N | N | Ar1 | Ar1 |
| 4806 | H | H | Ar1 | D111 | L1 | N | N | N | Ar1 | Ar1 |
| 4807 | D1 | H | Ar1 | H | L1 | N | N | N | Ar1 | Ar1 |
| 4808 | D46 | H | Ar1 | H | L1 | N | N | N | Ar1 | Ar1 |
| 4809 | D47 | H | Ar1 | H | L1 | N | N | N | Ar1 | Ar1 |
| 4810 | D48 | H | Ar1 | H | L1 | N | N | N | Ar1 | Ar1 |
| 4811 | D49 | H | Ar1 | H | L1 | N | N | N | Ar1 | Ar1 |
| 4812 | D50 | H | Ar1 | H | L1 | N | N | N | Ar1 | Ar1 |
| 4813 | D51 | H | Ar1 | H | L1 | N | N | N | Ar1 | Ar1 |
| 4814 | D60 | H | Ar1 | H | L1 | N | N | N | Ar1 | Ar1 |
| 4815 | D61 | H | Ar1 | H | L1 | N | N | N | Ar1 | Ar1 |
| 4816 | D62 | H | Ar1 | H | L1 | N | N | N | Ar1 | Ar1 |
| 4817 | D63 | H | Ar1 | H | L1 | N | N | N | Ar1 | Ar1 |
| 4818 | D64 | H | Ar1 | H | L1 | N | N | N | Ar1 | Ar1 |
| 4819 | D65 | H | Ar1 | H | L1 | N | N | N | Ar1 | Ar1 |
| 4820 | D72 | H | Ar1 | H | L1 | N | N | N | Ar1 | Ar1 |
| 4821 | D73 | H | Ar1 | H | L1 | N | N | N | Ar1 | Ar1 |
| 4822 | D74 | H | Ar1 | H | L1 | N | N | N | Ar1 | Ar1 |
| 4823 | D75 | H | Ar1 | H | L1 | N | N | N | Ar1 | Ar1 |
| 4824 | D76 | H | Ar1 | H | L1 | N | N | N | Ar1 | Ar1 |
| 4825 | D77 | H | Ar1 | H | L1 | N | N | N | Ar1 | Ar1 |
| 4826 | D99 | H | Ar1 | H | L1 | N | N | N | Ar1 | Ar1 |
| 4827 | D100 | H | Ar1 | H | L1 | N | N | N | Ar1 | Ar1 |
| 4828 | D101 | H | Ar1 | H | L1 | N | N | N | Ar1 | Ar1 |
| 4829 | D102 | H | Ar1 | H | L1 | N | N | N | Ar1 | Ar1 |
| 4830 | D103 | H | Ar1 | H | L1 | N | N | N | Ar1 | Ar1 |
| 4831 | D104 | H | Ar1 | H | L1 | N | N | N | Ar1 | Ar1 |
| 4832 | D105 | H | Ar1 | H | L1 | N | N | N | Ar1 | Ar1 |
| 4833 | D106 | H | Ar1 | H | L1 | N | N | N | Ar1 | Ar1 |
| 4834 | D107 | H | Ar1 | H | L1 | N | N | N | Ar1 | Ar1 |
| 4835 | D108 | H | Ar1 | H | L1 | N | N | N | Ar1 | Ar1 |
| 4836 | D109 | H | Ar1 | H | L1 | N | N | N | Ar1 | Ar1 |
| 4837 | D110 | H | Ar1 | H | L1 | N | N | N | Ar1 | Ar1 |
| 4838 | D111 | H | Ar1 | H | L1 | N | N | N | Ar1 | Ar1 |
| 4839 | H | Ar1 | H | D1 | L1 | N | N | N | Ar1 | Ar1 |
| 4840 | H | Ar1 | H | D46 | L1 | N | N | N | Ar1 | Ar1 |
| 4841 | H | Ar1 | H | D47 | L1 | N | N | N | Ar1 | Ar1 |
| 4842 | H | Ar1 | H | D48 | L1 | N | N | N | Ar1 | Ar1 |
| 4843 | H | Ar1 | H | D49 | L1 | N | N | N | Ar1 | Ar1 |
| 4844 | H | Ar1 | H | D50 | L1 | N | N | N | Ar1 | Ar1 |
| 4845 | H | Ar1 | H | D51 | L1 | N | N | N | Ar1 | Ar1 |
| 4846 | H | Ar1 | H | D60 | L1 | N | N | N | Ar1 | Ar1 |
| 4847 | H | Ar1 | H | D61 | L1 | N | N | N | Ar1 | Ar1 |
| 4848 | H | Ar1 | H | D62 | L1 | N | N | N | Ar1 | Ar1 |
| 4849 | H | Ar1 | H | D63 | L1 | N | N | N | Ar1 | Ar1 |
| 4850 | H | Ar1 | H | D64 | L1 | N | N | N | Ar1 | Ar1 |
| 4851 | H | Ar1 | H | D65 | L1 | N | N | N | Ar1 | Ar1 |
| 4852 | H | Ar1 | H | D72 | L1 | N | N | N | Ar1 | Ar1 |
| 4853 | H | Ar1 | H | D73 | L1 | N | N | N | Ar1 | Ar1 |
| 4854 | H | Ar1 | H | D74 | L1 | N | N | N | Ar1 | Ar1 |
| 4855 | H | Ar1 | H | D75 | L1 | N | N | N | Ar1 | Ar1 |
| 4856 | H | Ar1 | H | D76 | L1 | N | N | N | Ar1 | Ar1 |
| 4857 | H | Ar1 | H | D77 | L1 | N | N | N | Ar1 | Ar1 |
| 4858 | H | Ar1 | H | D99 | L1 | N | N | N | Ar1 | Ar1 |
| 4859 | H | Ar1 | H | D100 | L1 | N | N | N | Ar1 | Ar1 |
| 4860 | H | Ar1 | H | D101 | L1 | N | N | N | Ar1 | Ar1 |
| 4861 | H | Ar1 | H | D102 | L1 | N | N | N | Ar1 | Ar1 |
| 4862 | H | Ar1 | H | D103 | L1 | N | N | N | Ar1 | Ar1 |
| 4863 | H | Ar1 | H | D104 | L1 | N | N | N | Ar1 | Ar1 |
| 4864 | H | Ar1 | H | D105 | L1 | N | N | N | Ar1 | Ar1 |
| 4865 | H | Ar1 | H | D106 | L1 | N | N | N | Ar1 | Ar1 |
| 4866 | H | Ar1 | H | D107 | L1 | N | N | N | Ar1 | Ar1 |
| 4867 | H | Ar1 | H | D108 | L1 | N | N | N | Ar1 | Ar1 |
| 4868 | H | Ar1 | H | D109 | L1 | N | N | N | Ar1 | Ar1 |
| 4869 | H | Ar1 | H | D110 | L1 | N | N | N | Ar1 | Ar1 |
| 4870 | H | Ar1 | H | D111 | L1 | N | N | N | Ar1 | Ar1 |
| 4871 | H | Ar1 | D1 | H | L1 | N | N | N | Ar1 | Ar1 |
| 4872 | H | Ar1 | D46 | H | L1 | N | N | N | Ar1 | Ar1 |
| 4873 | H | Ar1 | D47 | H | L1 | N | N | N | Ar1 | Ar1 |
| 4874 | H | Ar1 | D48 | H | L1 | N | N | N | Ar1 | Ar1 |
| 4875 | H | Ar1 | D49 | H | L1 | N | N | N | Ar1 | Ar1 |
| 4876 | H | Ar1 | D50 | H | L1 | N | N | N | Ar1 | Ar1 |
| 4877 | H | Ar1 | D51 | H | L1 | N | N | N | Ar1 | Ar1 |
| 4878 | H | Ar1 | D60 | H | L1 | N | N | N | Ar1 | Ar1 |
| 4879 | H | Ar1 | D61 | H | L1 | N | N | N | Ar1 | Ar1 |
| 4880 | H | Ar1 | D62 | H | L1 | N | N | N | Ar1 | Ar1 |
| 4881 | H | Ar1 | D63 | H | L1 | N | N | N | Ar1 | Ar1 |
| 4882 | H | Ar1 | D64 | H | L1 | N | N | N | Ar1 | Ar1 |
| 4883 | H | Ar1 | D65 | H | L1 | N | N | N | Ar1 | Ar1 |
| 4884 | H | Ar1 | D72 | H | L1 | N | N | N | Ar1 | Ar1 |
| 4885 | H | Ar1 | D73 | H | L1 | N | N | N | Ar1 | Ar1 |
| 4886 | H | Ar1 | D74 | H | L1 | N | N | N | Ar1 | Ar1 |
| 4887 | H | Ar1 | D75 | H | L1 | N | N | N | Ar1 | Ar1 |
| 4888 | H | Ar1 | D76 | H | L1 | N | N | N | Ar1 | Ar1 |
| 4889 | H | Ar1 | D77 | H | L1 | N | N | N | Ar1 | Ar1 |
| 4890 | H | Ar1 | D99 | H | L1 | N | N | N | Ar1 | Ar1 |
| 4891 | H | Ar1 | D100 | H | L1 | N | N | N | Ar1 | Ar1 |

| No. | R¹ | R² | R³ | R⁴ | L¹ | X¹ | X² | X³ | Ar¹ | Ar² |
|---|---|---|---|---|---|---|---|---|---|---|
| 4892 | H | Ar1 | D101 | H | L1 | N | N | N | Ar1 | Ar1 |
| 4893 | H | Ar1 | D102 | H | L1 | N | N | N | Ar1 | Ar1 |
| 4894 | H | Ar1 | D103 | H | L1 | N | N | N | Ar1 | Ar1 |
| 4895 | H | Ar1 | D104 | H | L1 | N | N | N | Ar1 | Ar1 |
| 4896 | H | Ar1 | D105 | H | L1 | N | N | N | Ar1 | Ar1 |
| 4897 | H | Ar1 | D106 | H | L1 | N | N | N | Ar1 | Ar1 |
| 4898 | H | Ar1 | D107 | H | L1 | N | N | N | Ar1 | Ar1 |
| 4899 | H | Ar1 | D108 | H | L1 | N | N | N | Ar1 | Ar1 |
| 4900 | H | Ar1 | D109 | H | L1 | N | N | N | Ar1 | Ar1 |
| 4901 | H | Ar1 | D110 | H | L1 | N | N | N | Ar1 | Ar1 |
| 4902 | H | Ar1 | D111 | H | L1 | N | N | N | Ar1 | Ar1 |
| 4903 | H | D1 | H | Ar1 | L1 | N | N | N | Ar1 | Ar1 |
| 4904 | H | D46 | H | Ar1 | L1 | N | N | N | Ar1 | Ar1 |
| 4905 | H | D47 | H | Ar1 | L1 | N | N | N | Ar1 | Ar1 |
| 4906 | H | D48 | H | Ar1 | L1 | N | N | N | Ar1 | Ar1 |
| 4907 | H | D49 | H | Ar1 | L1 | N | N | N | Ar1 | Ar1 |
| 4908 | H | D50 | H | Ar1 | L1 | N | N | N | Ar1 | Ar1 |
| 4909 | H | D51 | H | Ar1 | L1 | N | N | N | Ar1 | Ar1 |
| 4910 | H | D60 | H | Ar1 | L1 | N | N | N | Ar1 | Ar1 |
| 4911 | H | D61 | H | Ar1 | L1 | N | N | N | Ar1 | Ar1 |
| 4912 | H | D62 | H | Ar1 | L1 | N | N | N | Ar1 | Ar1 |
| 4913 | H | D63 | H | Ar1 | L1 | N | N | N | Ar1 | Ar1 |
| 4914 | H | D64 | H | Ar1 | L1 | N | N | N | Ar1 | Ar1 |
| 4915 | H | D65 | H | Ar1 | L1 | N | N | N | Ar1 | Ar1 |
| 4916 | H | D72 | H | Ar1 | L1 | N | N | N | Ar1 | Ar1 |
| 4917 | H | D73 | H | Ar1 | L1 | N | N | N | Ar1 | Ar1 |
| 4918 | H | D74 | H | Ar1 | L1 | N | N | N | Ar1 | Ar1 |
| 4919 | H | D75 | H | Ar1 | L1 | N | N | N | Ar1 | Ar1 |
| 4920 | H | D76 | H | Ar1 | L1 | N | N | N | Ar1 | Ar1 |
| 4921 | H | D77 | H | Ar1 | L1 | N | N | N | Ar1 | Ar1 |
| 4922 | H | D99 | H | Ar1 | L1 | N | N | N | Ar1 | Ar1 |
| 4923 | H | D100 | H | Ar1 | L1 | N | N | N | Ar1 | Ar1 |
| 4924 | H | D101 | H | Ar1 | L1 | N | N | N | Ar1 | Ar1 |
| 4925 | H | D102 | H | Ar1 | L1 | N | N | N | Ar1 | Ar1 |
| 4926 | H | D103 | H | Ar1 | L1 | N | N | N | Ar1 | Ar1 |
| 4927 | H | D104 | H | Ar1 | L1 | N | N | N | Ar1 | Ar1 |
| 4928 | H | D105 | H | Ar1 | L1 | N | N | N | Ar1 | Ar1 |
| 4929 | H | D106 | H | Ar1 | L1 | N | N | N | Ar1 | Ar1 |
| 4930 | H | D107 | H | Ar1 | L1 | N | N | N | Ar1 | Ar1 |
| 4931 | H | D108 | H | Ar1 | L1 | N | N | N | Ar1 | Ar1 |
| 4932 | H | D109 | H | Ar1 | L1 | N | N | N | Ar1 | Ar1 |
| 4933 | H | D110 | H | Ar1 | L1 | N | N | N | Ar1 | Ar1 |
| 4934 | H | D111 | H | Ar1 | L1 | N | N | N | Ar1 | Ar1 |
| 4935 | H | H | D1 | Ar1 | L1 | N | N | N | Ar1 | Ar1 |
| 4936 | H | H | D46 | Ar1 | L1 | N | N | N | Ar1 | Ar1 |
| 4937 | H | H | D47 | Ar1 | L1 | N | N | N | Ar1 | Ar1 |
| 4938 | H | H | D48 | Ar1 | L1 | N | N | N | Ar1 | Ar1 |
| 4939 | H | H | D49 | Ar1 | L1 | N | N | N | Ar1 | Ar1 |
| 4940 | H | H | D50 | Ar1 | L1 | N | N | N | Ar1 | Ar1 |
| 4941 | H | H | D51 | Ar1 | L1 | N | N | N | Ar1 | Ar1 |
| 4942 | H | H | D60 | Ar1 | L1 | N | N | N | Ar1 | Ar1 |
| 4943 | H | H | D61 | Ar1 | L1 | N | N | N | Ar1 | Ar1 |
| 4944 | H | H | D62 | Ar1 | L1 | N | N | N | Ar1 | Ar1 |
| 4945 | H | H | D63 | Ar1 | L1 | N | N | N | Ar1 | Ar1 |
| 4946 | H | H | D64 | Ar1 | L1 | N | N | N | Ar1 | Ar1 |
| 4947 | H | H | D65 | Ar1 | L1 | N | N | N | Ar1 | Ar1 |
| 4948 | H | H | D72 | Ar1 | L1 | N | N | N | Ar1 | Ar1 |
| 4949 | H | H | D73 | Ar1 | L1 | N | N | N | Ar1 | Ar1 |
| 4950 | H | H | D74 | Ar1 | L1 | N | N | N | Ar1 | Ar1 |
| 4951 | H | H | D75 | Ar1 | L1 | N | N | N | Ar1 | Ar1 |
| 4952 | H | H | D76 | Ar1 | L1 | N | N | N | Ar1 | Ar1 |
| 4953 | H | H | D77 | Ar1 | L1 | N | N | N | Ar1 | Ar1 |
| 4954 | H | H | D99 | Ar1 | L1 | N | N | N | Ar1 | Ar1 |
| 4955 | H | H | D100 | Ar1 | L1 | N | N | N | Ar1 | Ar1 |
| 4956 | H | H | D101 | Ar1 | L1 | N | N | N | Ar1 | Ar1 |
| 4957 | H | H | D102 | Ar1 | L1 | N | N | N | Ar1 | Ar1 |
| 4958 | H | H | D103 | Ar1 | L1 | N | N | N | Ar1 | Ar1 |
| 4959 | H | H | D104 | Ar1 | L1 | N | N | N | Ar1 | Ar1 |
| 4960 | H | H | D105 | Ar1 | L1 | N | N | N | Ar1 | Ar1 |
| 4961 | H | H | D106 | Ar1 | L1 | N | N | N | Ar1 | Ar1 |
| 4962 | H | H | D107 | Ar1 | L1 | N | N | N | Ar1 | Ar1 |
| 4963 | H | H | D108 | Ar1 | L1 | N | N | N | Ar1 | Ar1 |
| 4964 | H | H | D109 | Ar1 | L1 | N | N | N | Ar1 | Ar1 |
| 4965 | H | H | D110 | Ar1 | L1 | N | N | N | Ar1 | Ar1 |
| 4966 | H | H | D111 | Ar1 | L1 | N | N | N | Ar1 | Ar1 |
| 4967 | D1 | Ar1 | H | H | L1 | N | N | N | Ar1 | Ar1 |
| 4968 | D46 | Ar1 | H | H | L1 | N | N | N | Ar1 | Ar1 |
| 4969 | D47 | Ar1 | H | H | L1 | N | N | N | Ar1 | Ar1 |
| 4970 | D48 | Ar1 | H | H | L1 | N | N | N | Ar1 | Ar1 |
| 4971 | D49 | Ar1 | H | H | L1 | N | N | N | Ar1 | Ar1 |
| 4972 | D50 | Ar1 | H | H | L1 | N | N | N | Ar1 | Ar1 |
| 4973 | D51 | Ar1 | H | H | L1 | N | N | N | Ar1 | Ar1 |
| 4974 | D60 | Ar1 | H | H | L1 | N | N | N | Ar1 | Ar1 |
| 4975 | D61 | Ar1 | H | H | L1 | N | N | N | Ar1 | Ar1 |
| 4976 | D62 | Ar1 | H | H | L1 | N | N | N | Ar1 | Ar1 |
| 4977 | D63 | Ar1 | H | H | L1 | N | N | N | Ar1 | Ar1 |
| 4978 | D64 | Ar1 | H | H | L1 | N | N | N | Ar1 | Ar1 |
| 4979 | D65 | Ar1 | H | H | L1 | N | N | N | Ar1 | Ar1 |
| 4980 | D72 | Ar1 | H | H | L1 | N | N | N | Ar1 | Ar1 |
| 4981 | D73 | Ar1 | H | H | L1 | N | N | N | Ar1 | Ar1 |
| 4982 | D74 | Ar1 | H | H | L1 | N | N | N | Ar1 | Ar1 |
| 4983 | D75 | Ar1 | H | H | L1 | N | N | N | Ar1 | Ar1 |
| 4984 | D76 | Ar1 | H | H | L1 | N | N | N | Ar1 | Ar1 |
| 4985 | D77 | Ar1 | H | H | L1 | N | N | N | Ar1 | Ar1 |
| 4986 | D99 | Ar1 | H | H | L1 | N | N | N | Ar1 | Ar1 |
| 4987 | D100 | Ar1 | H | H | L1 | N | N | N | Ar1 | Ar1 |
| 4988 | D101 | Ar1 | H | H | L1 | N | N | N | Ar1 | Ar1 |
| 4989 | D102 | Ar1 | H | H | L1 | N | N | N | Ar1 | Ar1 |
| 4990 | D103 | Ar1 | H | H | L1 | N | N | N | Ar1 | Ar1 |
| 4991 | D104 | Ar1 | H | H | L1 | N | N | N | Ar1 | Ar1 |
| 4992 | D105 | Ar1 | H | H | L1 | N | N | N | Ar1 | Ar1 |
| 4993 | D106 | Ar1 | H | H | L1 | N | N | N | Ar1 | Ar1 |
| 4994 | D107 | Ar1 | H | H | L1 | N | N | N | Ar1 | Ar1 |
| 4995 | D108 | Ar1 | H | H | L1 | N | N | N | Ar1 | Ar1 |
| 4996 | D109 | Ar1 | H | H | L1 | N | N | N | Ar1 | Ar1 |
| 4997 | D110 | Ar1 | H | H | L1 | N | N | N | Ar1 | Ar1 |
| 4998 | D111 | Ar1 | H | H | L1 | N | N | N | Ar1 | Ar1 |

Preferable structures of Formula (I) are shown in Example 2 and below:

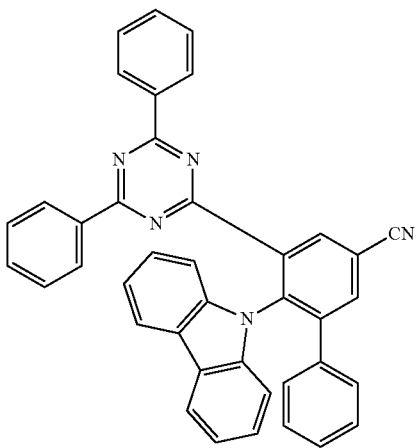

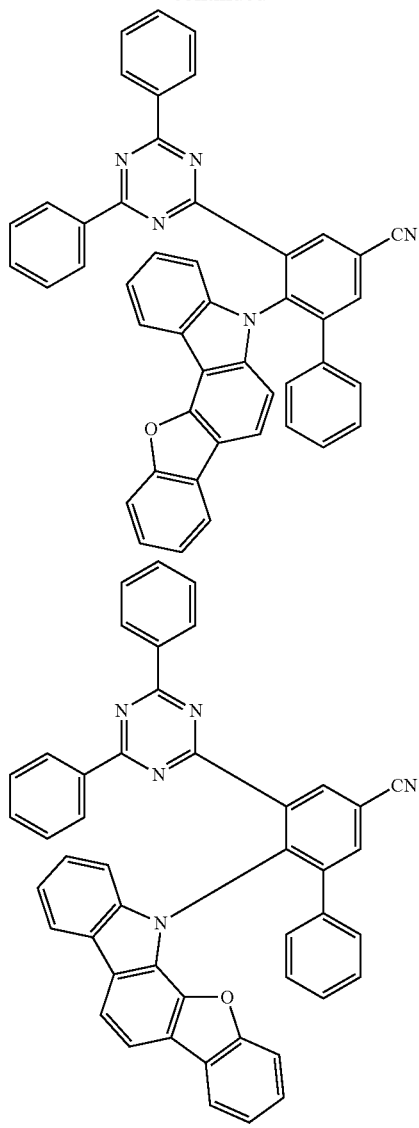
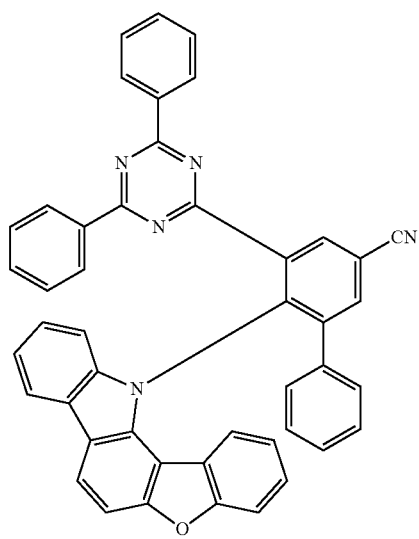
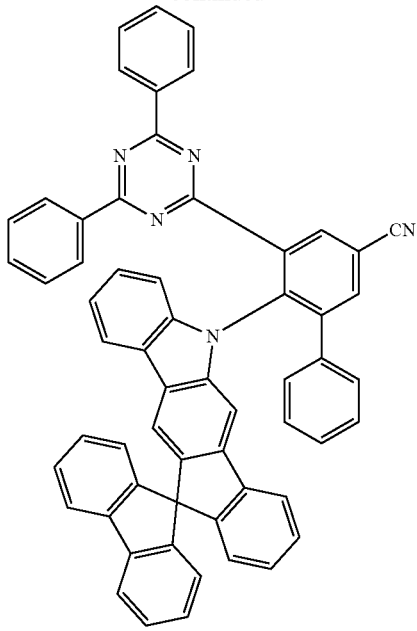
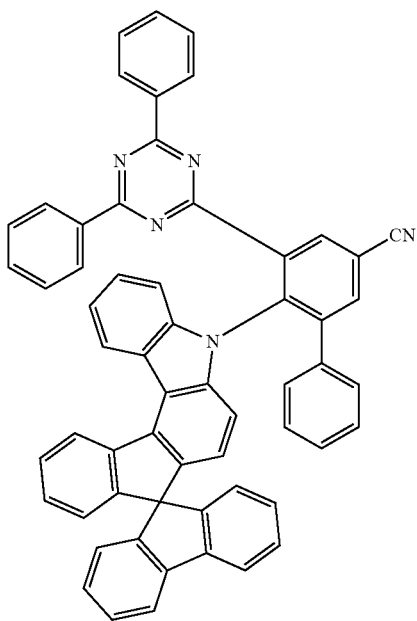

51
-continued
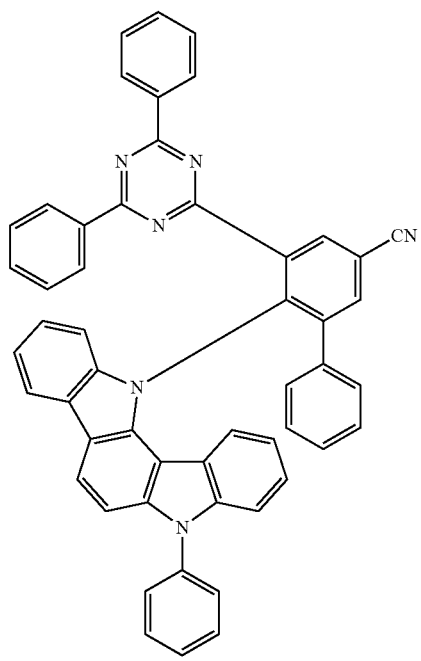
52
-continued
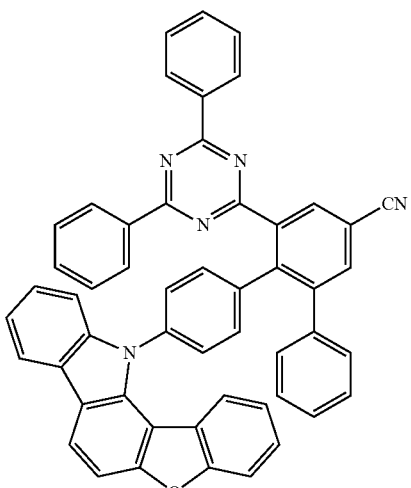
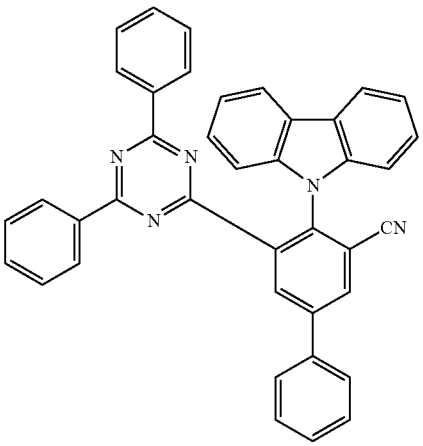
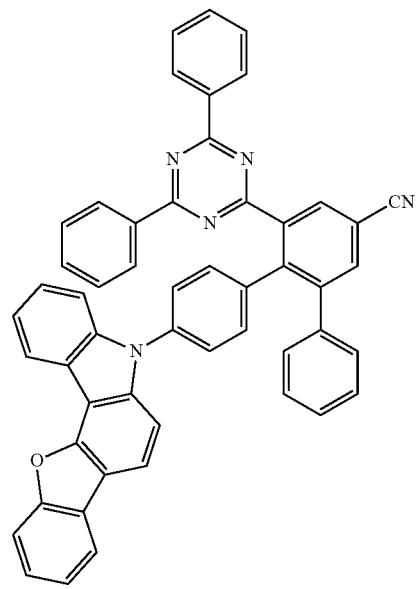
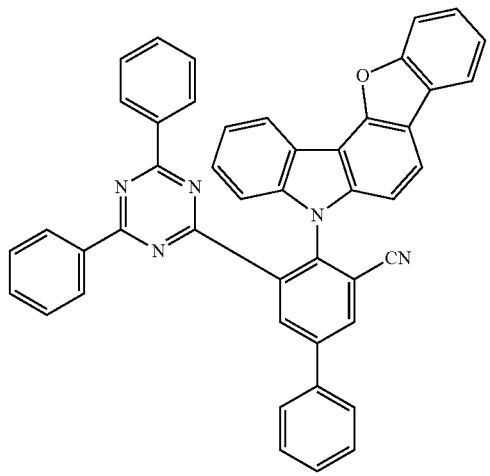

53
-continued
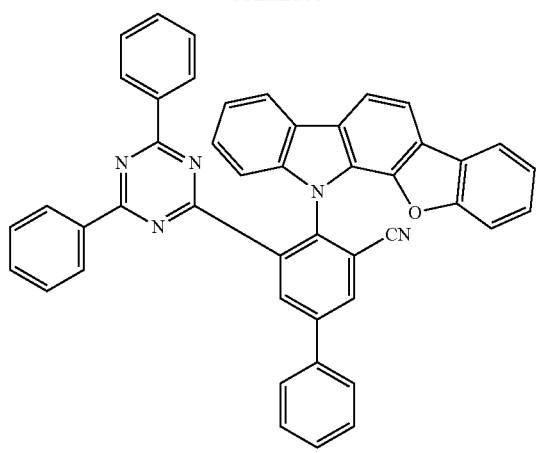
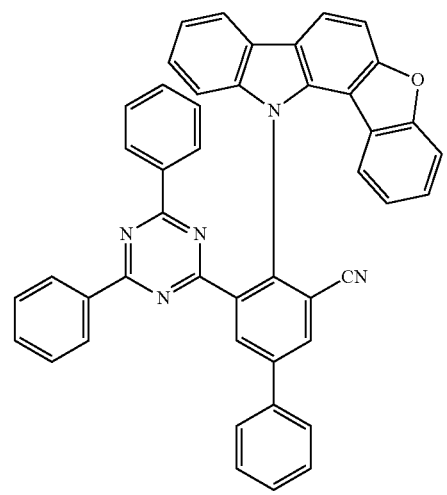
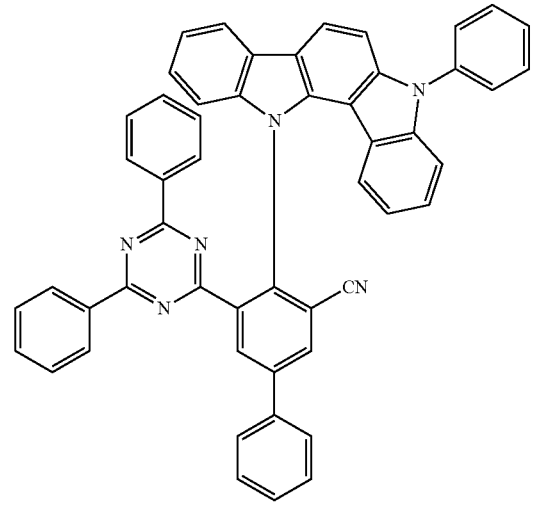
54
-continued
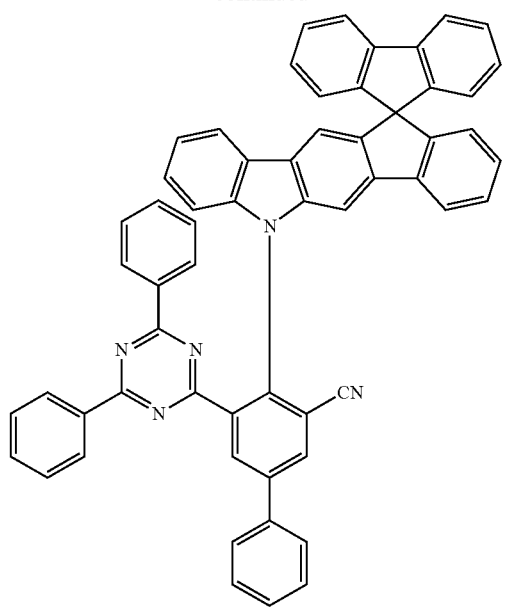
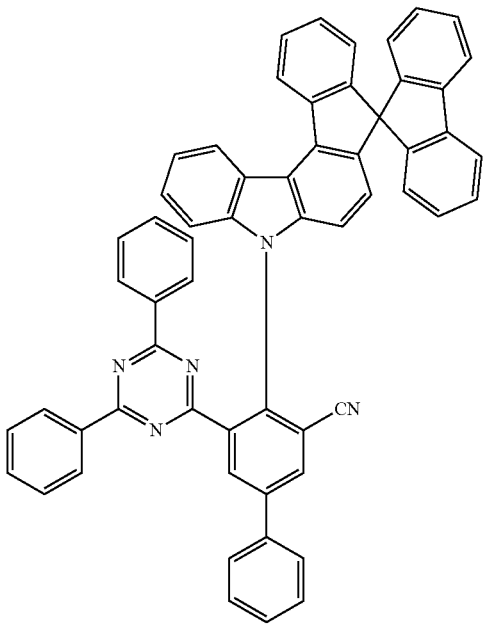

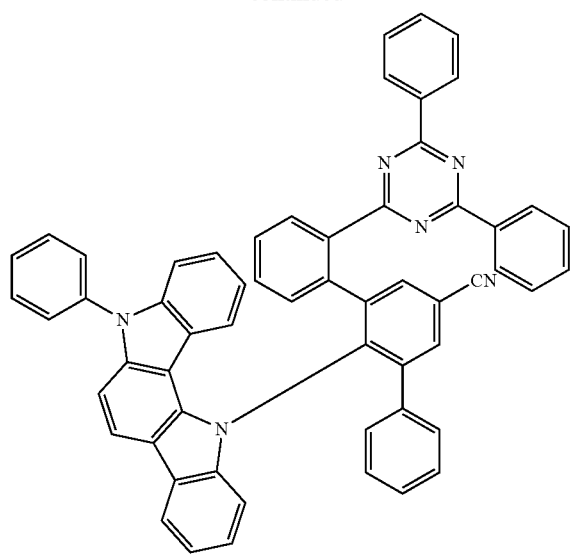
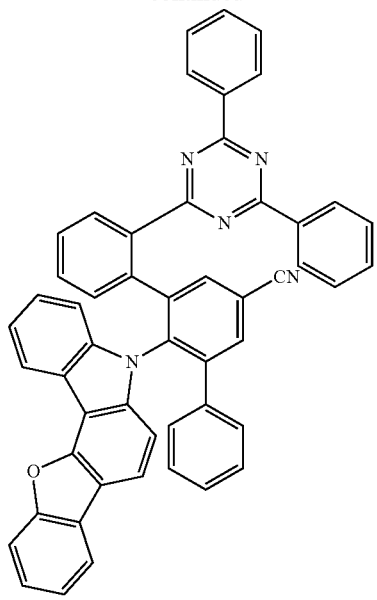
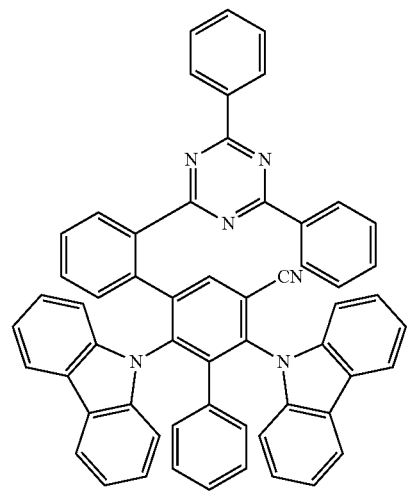
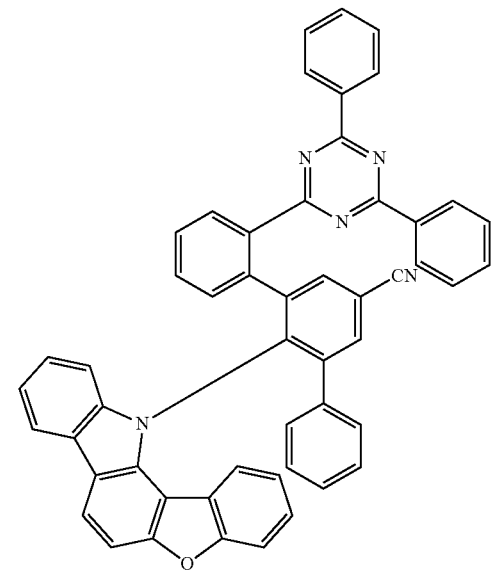
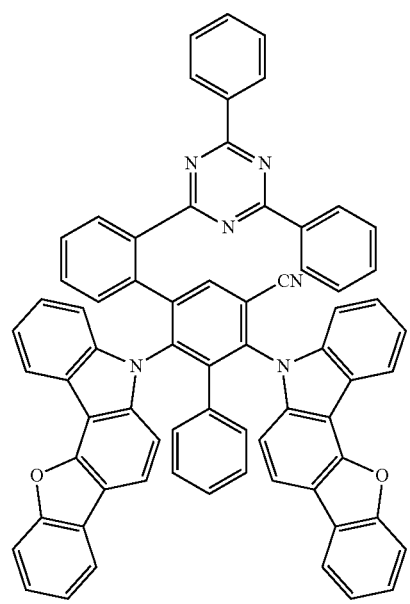
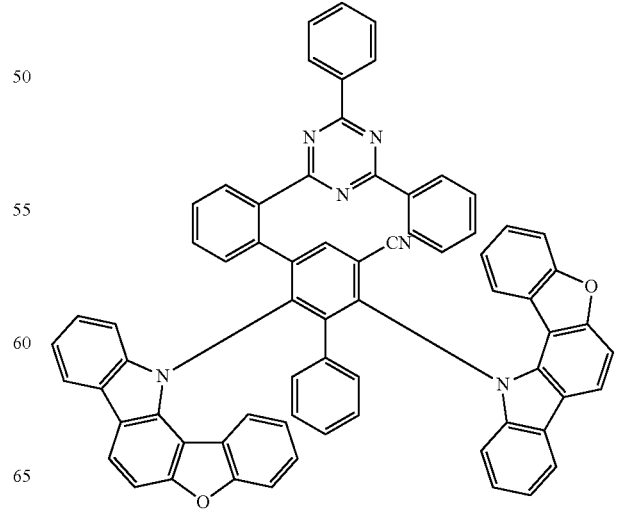

-continued

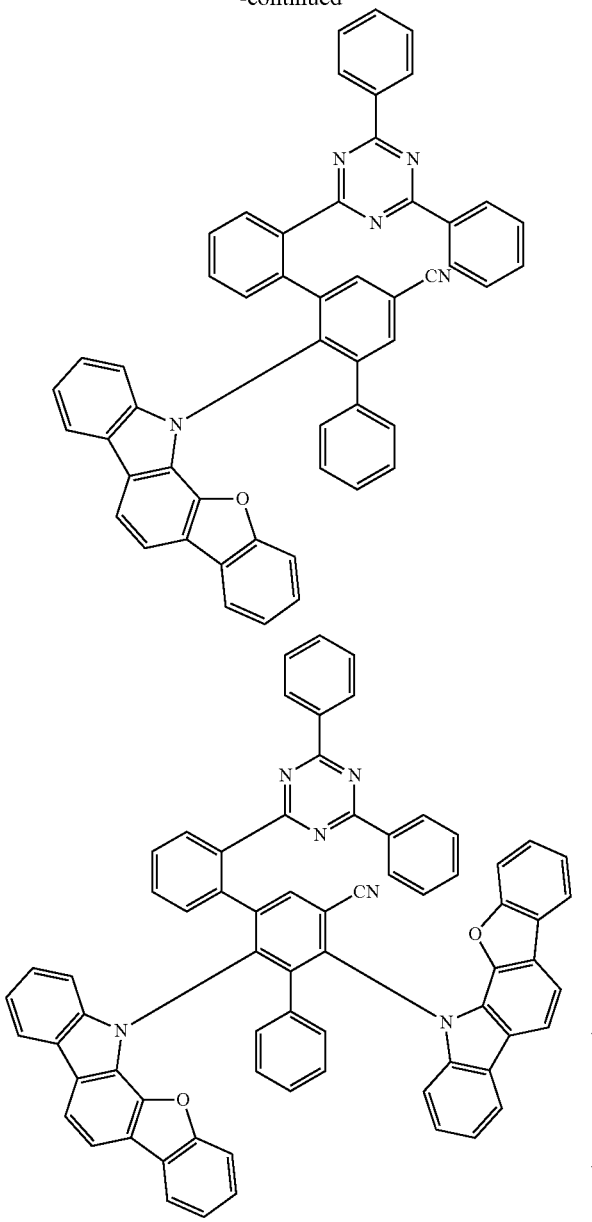

In some embodiments, compounds of Formula (I) are substituted with at least one deuterium.

In some embodiments, compounds of Formula (I) are light-emitting materials. In some embodiments, compounds of Formula (I) are compound capable of emitting delayed fluorescence.

In some embodiments of the present disclosure, when excited via thermal or electronic means, the compounds of Formula (I) can produce light in UV region, the blue, green, yellow, orange, or red region of the visible spectrum (e.g., about 420 nm to about 500 nm, about 500 nm to about 600 nm, or about 600 nm to about 700 nm), or near-IR region. In some embodiments of the present disclosure, when excited via thermal or electronic means, the compounds of Formula (I) can produce light in the red or orange region of the visible spectrum (e.g., about 620 nm to about 780 nm; about 650 nm). In some embodiments of the present disclosure, when excited via thermal or electronic means, the compounds of Formula (I) can produce light in the orange or yellow region of the visible spectrum (e.g., about 570 nm to about 620 nm; about 590 nm; about 570 nm). In some embodiments of the present disclosure, when excited via thermal or electronic means, the compounds of Formula (I) can produce light in the green region of the visible spectrum (e.g., about 490 nm to about 575 nm; about 510 nm). In some embodiments of the present disclosure, when excited via thermal or electronic means, the compounds of Formula (I) can produce light in the blue region of the visible spectrum (e.g., about 400 nm to about 490 nm; about 475 nm).

Preparation of the Disclosed Compounds

The compounds of Formula (I) can be synthesized by any method known to one of ordinary skills in the art. The compounds are synthesized from the commonly available starting material. In some embodiments, the compounds of Formula (I) are synthesized by reacting a precursor of Formula (III) and a compound of Formula (IV).

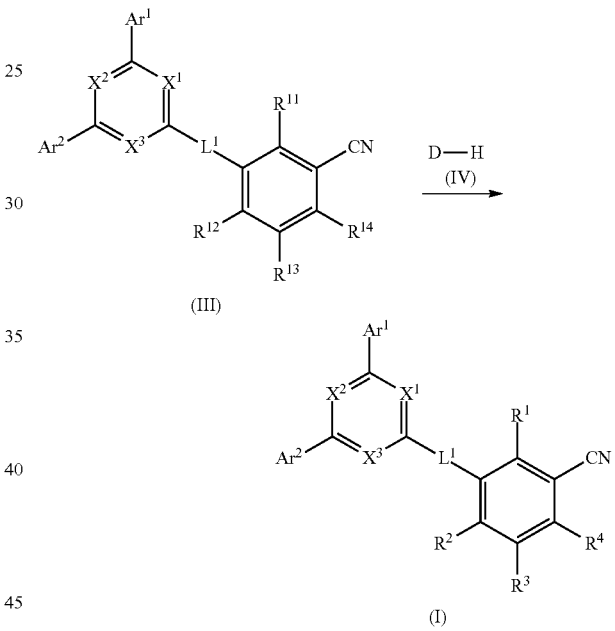

In Formula (III), one of $R^{11}$, $R^{12}$, $R^{13}$ and $R^{14}$ is $Ar^3$; another one of $R^{11}$, $R^{12}$, $R^{13}$ and $R^{14}$ is F; and the other remaining two of $R^{11}$, $R^{12}$, $R^{13}$ and $R^{14}$ are independently selected from H, F, substituted or unsubstituted alkyl, and $Ar^3$. $X^1$, $X^2$, $X^3$, $Ar^1$, $Ar^2$, $L^1$ and $Ar^3$ in Formula (III) are as defined in Formula (I). In some embodiments, only one of $R^{11}$, $R^{12}$, $R^{13}$ and $R^{14}$ is F. In some embodiments, $R^{11}$ and $R^{12}$ are F. In some embodiments, $R^{12}$ and $R^{13}$ are F. In some embodiments, $R^{11}$ and $R^{14}$ are F. In some embodiments, $R^{12}$ and $R^{13}$ are F. In some embodiments, $R^{12}$ and $R^{14}$ are F. In some embodiments, $R^{13}$ and $R^{14}$ are F. In some embodiments, $R^{11}$, $R^{12}$ and $R^{13}$ are F. In some embodiments, $R^{11}$, $R^{12}$ and $R^{14}$ are F. In some embodiments, $R^{11}$, $R^{13}$ and $R^{14}$ are F. In some embodiments, $R^{12}$, $R^{13}$ and $R^{14}$ are F. D in Formula (III) is as defined in Formula (I).

The fluorine in Formula (III) is replaced by D through the reaction. The known reaction conditions can be appropriately selected and used. For the details of the reaction, reference may be made to the synthesis examples described later (see Example 2).

Examples of the compounds of Formula (III) include Compounds 1b to 4678b which are formed by replacing D1 to D77 appearing in Compounds 1 to 4678 to a fluorine atom, respectively.

In some embodiments, the compounds of Formula (III) have a structure of Formula (IIIa):

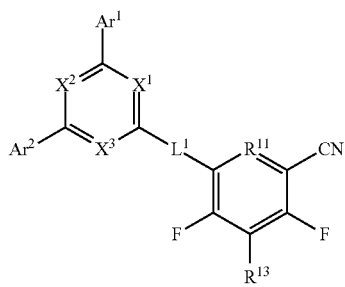

(IIIa)

In Formula (IIIa), one of $R^{11}$ and $R^{13}$ is $Ar^3$; and the other of $R^{11}$ and $R^{13}$ is H, substituted or unsubstituted alkyl, or $Ar^1$, $X^1$, $X^2$, $X^3$, $Ar^1$, $Ar^2$, $L^1$ and $Ar^3$ in Formula (IIIa) are as defined in Formula (I). In some embodiments, $R^{11}$ and $R^{13}$ are independently $Ar^3$. In some embodiments, $R^{11}$ is $Ar^3$, and $R^{13}$ is H. In some embodiments, $R^{11}$ is $Ar^3$, and $R^{13}$ is substituted or unsubstituted alkyl. In some embodiments, $R^{11}$ is H, and $R^{13}$ is $Ar^3$. In some embodiments, $R^{11}$ is substituted or unsubstituted alkyl, and $R^{13}$ is $Ar^3$.

In some embodiments, $X^1$, $X^2$ and $X^3$ are N. In some embodiments, two of $X^1$, $X^2$ and $X^3$ are N, and the other one is $C(R^3)$. In some embodiments, $X^1$ and $X^3$ are N, and $X^2$ is $C(R^3)$. In some embodiments, $R^3$ is an unsubstituted alkyl group. In some embodiments, the compound of Formula (IIIa) is selected from Compounds 8a and 12a shown in Example 2 below.

Compositions with the Disclosed Compounds

In some embodiments, a compound of Formula (I) is combined with, dispersed within, covalently bonded to, coated with, formed on, or otherwise associated with, one or more materials (e.g., small molecules, polymers, metals, metal complexes, etc.) to form a film or layer in solid state. For example, the compound of Formula (I) may be combined with an electroactive material to form a film. In some cases, the compound of Formula (I) may be combined with a hole-transport polymer. In some cases, the compound of Formula (I) may be combined with all electron-transport polymer. In some cases, the compound of Formula (I) may be combined with a hole-transport polymer and an electron-transport polymer. In some cases, the compound of Formula (I) may be combined with a copolymer comprising both hole-transport portions and electron-transport portions. In such embodiments, electrons and/or holes formed within the solid film or layer may interact with the compound of Formula (I).

Film Formation

In some embodiments, a film containing a compound of the present invention of Formula (I) can be formed in a wet process. In a we process, a solution prepared by dissolving a composition containing a compound of the present invention is applied to a surface and formed into a film thereon after solvent removal. A wet process includes, though not limited thereto, a spin coating method, a slit coating method, a spraying method, an inkjet method (a spay method), a gravure printing method, an offset printing method, and a flexographic printing method. In a wet process, a suitable organic solvent capable of dissolving a composition containing a compound of the present invention is selected and used. In some embodiments, a substituent (for example, an alkyl group) capable of increasing solubility in an organic solvent can be introduced into the compound contained in the composition.

In some embodiments, a film containing a compound of the present invention can be formed in a dry process. In some embodiments, a thy process includes a vacuum evaporation method, but is not limited thereto. In the case of employing a vacuum evaporation method, compounds to constitute a film can be vapor-co-deposited from individual evaporation sources, or can be vapor-co-deposited from a single evaporation source of a mixture of the compounds. In the case of using a single evaporation source, a mixed powder prepared by mixing powders of compounds may be used, or a compression-molded body prepared by compressing the mixed powder may be used, or a mixture prepared by heating, melting and cooling compounds may be used. In some embodiments where vapor-co-deposition is carried out under such a condition that the evaporation rate (weight reduction rate) of the plural compounds contained in a single evaporation source is the same or is nearly the same as each other, a film whose composition ratio corresponds to the composition ratio of the plural compounds contained in the evaporation source can be formed. Under the condition where plural compounds are mixed to make an evaporation source in a composition ratio that is the same as the composition ratio of the film to be formed, a film having a desired composition ratio can be formed in a simplified manner. In some embodiments where a temperature at which the compounds to be vapor-co-deposited could have the same weight reduction ratio is identified, and the temperature can be employed as the temperature in vapor-co-deposition.

EXAMPLES

An embodiment of the present disclosure provides the preparation of compounds of Formula (I) according to the procedures of the following examples, using appropriate materials. Those skilled in the art will understand that known variations of the conditions and processes of the following preparative procedures can be used to prepare these compounds. Moreover, by utilizing the procedures described in detail, one of ordinary skill in the art can prepare additional compounds of the present disclosure.

General Information on Analytical Methods

The features of the invention will be described more specifically with reference to examples below. The materials, processes, procedures and the like shown below may be appropriately modified unless they deviate from the substance of the invention. Accordingly, the scope of the invention is not construed as being limited to the specific examples shown below. The characteristics of samples were evaluated by using NMR (Nuclear Magnetic Resonance 500 MHz, produced by Bruker), LC/MS (Liquid Chromatography Mass Spectrometry, produced by Waters), AC3 (produced by RIKEN KEIKI), High-performance UV/Vis/NIR Spectrophotometer (Lambda 950, produced by PerkinElmer, Co., Ltd.), Fluorescence Spectrophotometer (FluoroMax-4, produced by Horiba, Ltd.), Photonic multichannel analyser (PMA-1.2 C10027-01, produced by Hamamatsu Photonics K.K.), and Life Time Measurement System (EAS-26C, produced by System engineers co ltd).

Example 1

The principle of the features may be described as follows for an organic electroluminescent device as an example. Example 1 of WO2019/195104 (page 88, line 7 to page 89. line 9) and Example 1 of US Provisional Patent Application No. 62/896,096 (page 65, line 25 to page 66, line 29) are hereby expressly incorporated by reference into the present application.

Example 2

The compounds of the invention can be synthesized by any method known to one of ordinary skills in the art. The compounds are synthesized from the commonly available starting material. The various moieties can be assembled via linear or branched synthetic routes.

Synthesis of Compound 1

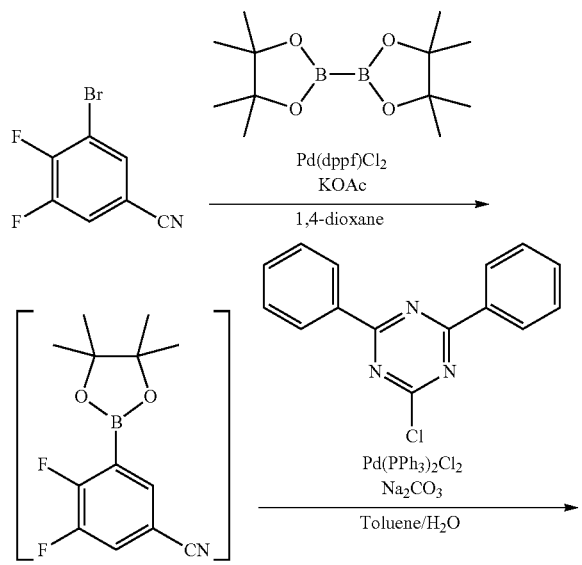

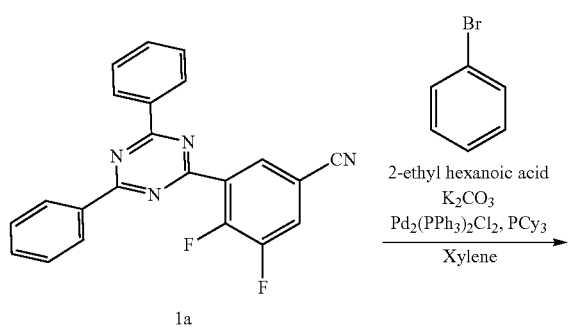

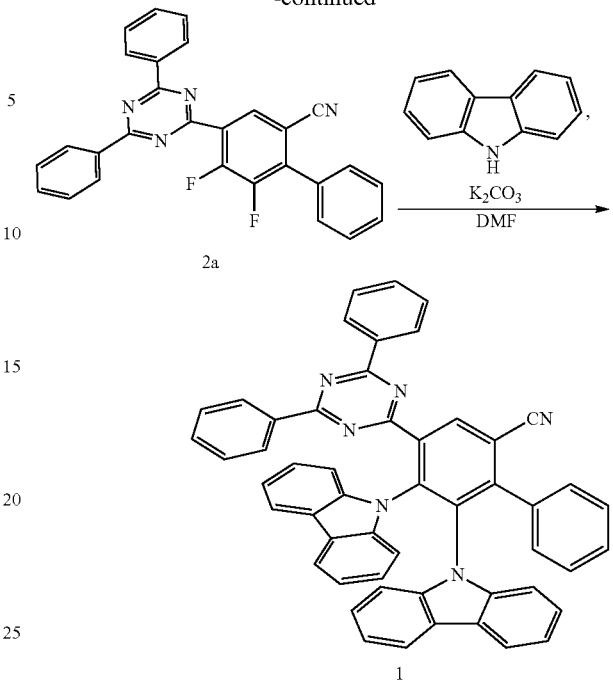

1) Synthesis of 5-(4,6-diphenyl-1,3,5-triazin-2-yl)-2,3-difluorobenzonitrile 1a

A mixture of 5-bronco-2,3-difluorobenzonitrile (4.67 g, 21.4 mmol), bis(pinacolato)diboron (5.98 g, 23.5 mmol), KOAc (6.30 g, 64.2 mmol) in dioxane (21 mL) was degassed and charged by $N_2$. Then, $Pd(dppf)Cl_2$ (0.47 g, 0.64 mmol) was added to the mixture and the mixture was stirred at 110° C. for 4 h. The reaction mixture was cooled and added water (25 mL), 2-chloro-4,6-diphenyl-1,3,5-triazine (5.83 g, 21.4 mmol), and sodium carbonate (3.40 g, 32.1 mmol). The mixture was degassed and charged by $N_2$. $PdCl_2(PPh_3)_2$ (0.451 g. 0.64 mmol) and THF (25 ml) were added to the mixture. The mixture was stirred for 15 h at 90° C. The reaction mixture was washed by brine, dried with $MgSO_4$, and concentrated under reduced pressure. The resulting mixture was resolved in DCM and reprecipitated by MeOH. The residues was purified by silica gel column chromatography (toluene) and reprecipitated (toluene and MeOH) to give compound 1a (3.60 g, 9.7 mmol, 45%) as white solid.
$^1$H-NMR (500 MHz, $CDCl_3$, δ): 8.87-8,84 (m, 2H), 8.75 (d, J=7.0 Hz, 4H), 7.68-7.65 (m, 2H), 7.56 (t, J=8.0 Hz, 4H). MS (ASAP): 371.2 [(M+H)$^+$].

2) 6-(4,6-diphenyl-1,3,5-triazin-2-yl)-2,3-difluoro-[1,1'-biphenyl]-4-carbonitrile 2a A mixture of compound 1a (2.22 g. 6.00 mmol), $K_2CO_3$ (2.49 g, 18.0 mmol), bromobenzene (1.13 g, 7.2 mmol), 2-ethylhexanoic acid (0.17 g, 1.2 mmol), tricyclohexyl phosphine (0.25 g, 0.90 mmol) and $Pd(PPh_3)_2Cl_2$ (0.21 g, 0.30 mmol) in xylene (18 ml) was heated at 130° C. for 15 h. The solvent was removed and washed by water. The residue was purified by reprecipitation (MeOH) and column chromatography (hexane/toluene=7/3–1/2), and then, the residue was purified by recrystallization (toluene/hexane) to give 6-(4, 6-diphenyl-1,3,5-triazin-2-yl)-2,3-difluoro-[1,1'-biphenyl]-4-carbonitrile 2a (1.05 g, 2.25 mmol, 38%) as white powder. ¹H-NMR (500 MHz, CDCl₃, δ): 8.87-8.70 (m, 5H), 7.64-7.55 (m, 9H), 7.23 (t, J=6.5 Hz, 1H), 7.17-7.16 (m, 1H). MS (ASAP): 447.3 [(M+H)⁺].

3) 5,6-di(9H-carbazol-9-yl)-4-(4,6-diphenyl-1,3,5-triazin-2-yl)-[1,1'-biphenyl]2-carbonitrile (Compound 1)

A mixture of K₂CO₃ (1.77 g, 12.,8 mmol) and 9H-carbazole (1.43 g, 8.52 mmol), 6-(4,6-diphenyl-1,3,5-triazin-2-yl)-2,3-difluoro-[1,1'-biphenyl]-4-carbonitrile 2 (0.95 g, 2.13 mmol) in DMF (35 mL) was stirred at 100° C. for 15 h and at 120° C. for 4 h. The reaction mixture was quenched with MeOH and H₂O. The precipitated powder was filtered, washed with MeOH, and purified by reprecipitation (DCM: MeOH) and column chromatography (DCM) to give Compound 1 (1.30 g, 1.75 mmol.) in 82% yield as yellow powder.

¹H-NMR (500 MHz, CDCl₃, δ): 9.00 (s, 1H), 7.94 (d, J=7.8 Hz, 4H), 7.61 (d, J=7.0 Hz, 2H), 7.55 (d, J=7.0 Hz, 2H), 7.47-7.44 (m, 2H), 7.29 (t, J=7.6 Hz, 4H), 7.14 (d, J=7.6 Hz, 2H), 7.09-7.07 (m, 2H), 6.99-6.93 (m, 13H). MS (ASAP): 741.5 [(M+H)⁺].

Synthesis of Compound 21

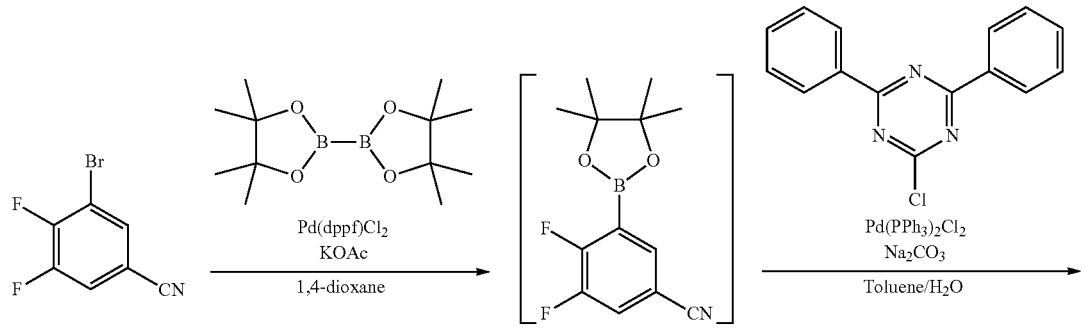

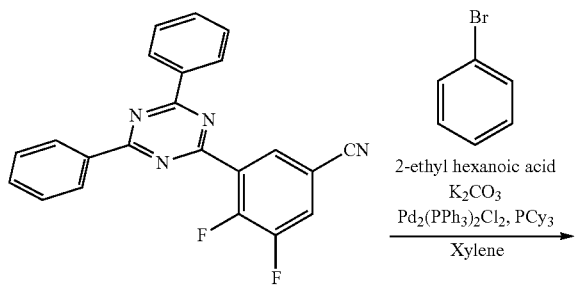

3a

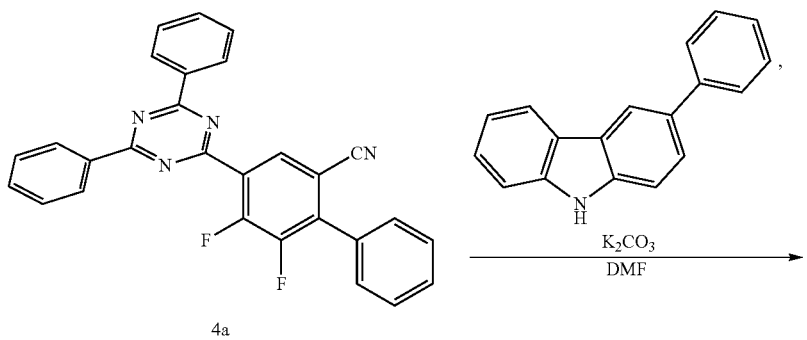

4a

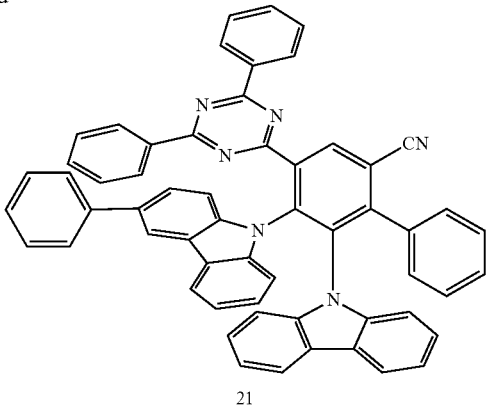

21

1) Synthesis of 5-(4,6-diphenyl-1,3,5-triazin-2-yl)-2,3-difluorobenzonitrile 3a A mixture of 5-bromo-2,3-difluorobenzonitrile (4.67 g, 21.4 mmol), bis(pinacolato)diboron (5.98 g, 23.5 mmol), KOAc (6,30 g, 64.2 mmol) in dioxane (21 mL) was degassed and charged by $N_2$. Then, Pd(dppf)$Cl_2$ (0.47 g, 0.64 mmol) was added to the mixture and the mixture was stirred at 110° C. for 4 h. The reaction mixture was cooled and added water (25 mL), 2-chloro-4,6-diphenyl-1,3,5-triazine (5.83 g, 21.4 mmol), and sodium carbonate (3.40 g. 32.1 mmol). The mixture was degassed and charged by $N_2$. PdCl$_2$(PPh$_3$)$_2$ (0.451 g. 0.64 mmol) and THF (25 ml) were added to the mixture. The mixture was stirred for 15 h at 90° C. The reaction mixture was washed by brine, dried with MgSO$_4$, and concentrated under reduced pressure. The resulting mixture was resolved in DCM and reprecipitated by MeOH. The residues was purified by silica gel column chromatography (toluene) and reprecipitated (toluene and MeOH) to give compound 3a (3.60 g, 9.7 mmol, 45%) as white solid.
$^1$H-NMR (500 MHz, CDCl$_3$, δ): 8.87-8.84 (m, 2H), 8.75 (d, J=7.0 Hz, 4H), 7668-7.65 (m, 2H), 7.56 (t, J=8.0 Hz, 4H). MS (ASAP): 371.2 [(M+H)$^+$].

2) 6-(4,6-diphenyl-1,3,5-triazin-2-yl)-2,3-difluoro-[1,1'-biphenyl]-4-carbonitrile 4a A mixture of compound 3a (2.22 g, 6.00 mmol), $K_2CO_3$ (2.49 g, 18.0 mmol), bromobenzene (1.13 g, 7.2 mmol), 2-ethylhexanoic acid (0.17 g, 1.2 mmol), tricyclohexyl phosphine (0.25 g, 0.90 mmol) and Pd(PPh$_3$)$_2$Cl$_2$ (0.21 g, 0.30 mmol) in xylene (18 ml) was heated at 130° C. for 15 h. The solvent was removed and washed by water. The residue was purified by reprecipitation (MeOH) and column chromatography (hexane/toluene=7/3–1/2), and then, the residue was purified by recrystallization (toluene/hexane) to give 6-4,6-diphenyl-1,3,5-triazin-2-yl)-2,3-difluoro-[1,1'-biphenyl]-4-carbonitrile 4a (1.05 g, 2.25 mmol, 38%) as white powder.
$^1$H-NMR (500 MHz, CDCl$_3$, δ): 8.87-8.70 (m, 5H), 7.64-7.55 (m, 9H). 7.23 (t, J=6.5 Hz, 1H), 7.17-7.16 (m, 1H). MS (ASAP): 447.3 [(M+H)$^+$].

3) 4-(4,6-diphenyl-1,3,5-triazin-2-yl)-5,6-bis(3-phenyl-9H-carbazol-9-yl)-[1'-biphenyl]-2-carbonitrile 3 (Compound 21)

A mixture of $K_2CO_3$ (2.4 g, 17.5 mmol) and 3-phenyl-9H-carbazole (3.4 g, 14.0 mmol), 6-(4,6-diphenyl-1,3,5-triazin-2-yl)-2,3-difluoro-[1,1'-biphenyl]-4-carbonitrile 4a (1.56 g, 3.5 mmol) in NMP (35 mL) was stirred at 130° C. for 15 h. The reaction mixture was quenched with MeOH and $H_2O$. The precipitated powder was filtered, washed with MeOH, and purified by reprecipitation (DCM: MeOH, EtOAc) and column chromatography (hexane/CHCl$_3$) to give Compound 21 (1.56 g, 1.75 mmol) in 50% yield as yellow powder.
$^1$H-NMR (500 MHz, CDCl$_3$, δ): (this compound showed rotational isomer) 9.06 (s, 0.3H), 9.05 (s, 0.7H), 7.99 (d, J=7.9 Hz, 4H), 7.85-7.80 (m, 2H), 7.69-7.60 (m, 2H), 7.53-7.36 (m, 11H), 7.30-7.26 (m, 4H), 7.25-6.97(m, 16H). MS (ASAP): 893.7 [(M+H)$^+$].

Synthesis of Compound 227

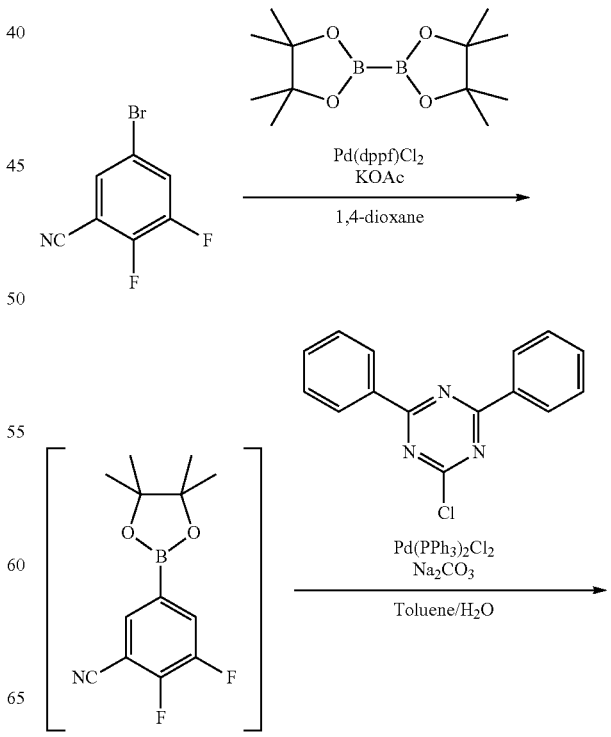

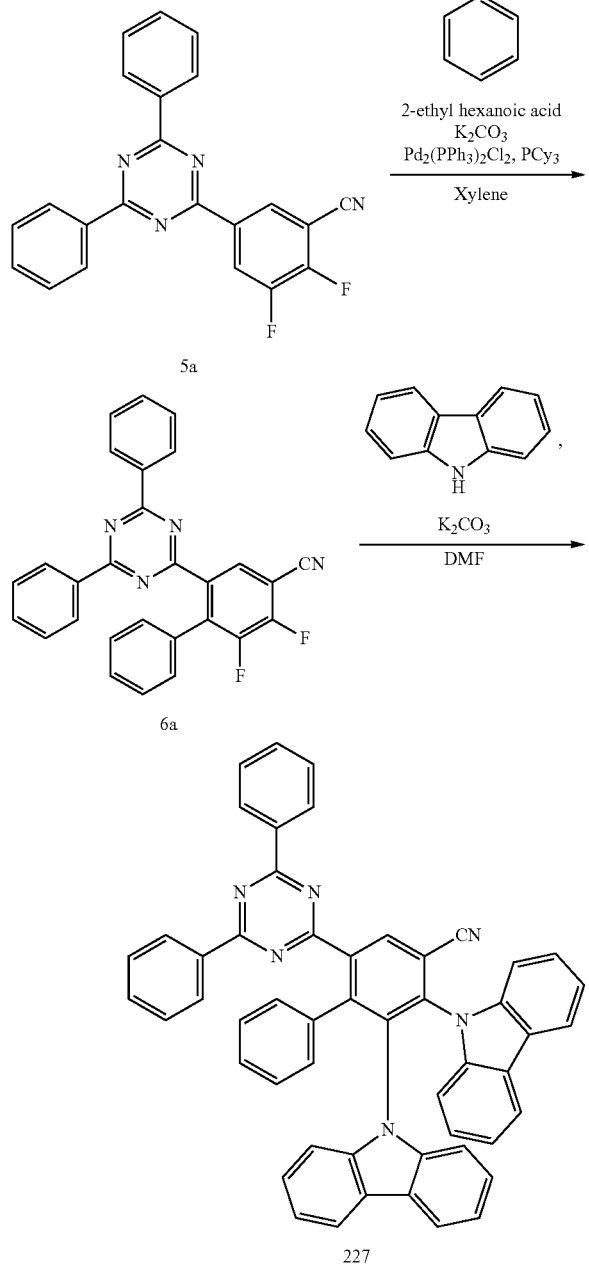

1) Synthesis of 5-(4,6-diphenyl-1,3,5-triazin-2-yl)-2,3-difluorobenzonitrile 5a A mixture of 5-bromo-2,3-difluorobenzonitrile (8.72 g, 40.0 mmol), bis(pinacolato)diboron (11.2 g, 44.0 mmol), KOAc (19.6 g, 64.2 mmol) in dioxane (400 mL) was degassed and charged by N₂. Then, Pd(dppf)Cl₂ (2.34 g, 3.2 mmol) was added to the mixture and the mixture was stirred at 110° C. for 15 h. Solvent was removed and resolve in DCM/hexane and filtrated by silica gel and Celite. The solvent was removed to get 8.9 g of intermediate. The intermediate (4.6 g, 17.4 mmol), 2-chloro-4,6-diphenyl-1,3,5-triazine (1.6 g, 6.0 mmol), and sodium carbonate (15.9 g, 15.0 mmol) were added to water (15 mL) and THF (50 ml). The mixture was degassed and charged by N₂. Pd(PPh₃)₂Cl₂ (0.21 g, 0.30 mmol) and were added to the mixture. The mixture was stirred for 1.5 h at 90° C. The reaction mixture was washed by brine, dried with MgSO₄, and concentrated under reduced pressure. The resulting mixture was resolved in DCM and reprecipitated by MeOH. The residues was purified by silica gel column chromatography (hexane/toluene=1/0–7/3) to give 5-(4,6-diphenyl-1,3,5-triazin-2-yl)-2,3-difluorobenzonitrile 5a (1.37 g, 3.7 mmol, 62%) as white solid.

$^1$H-NMR (500 MHz, CDCl₃, δ): 8.85-8.81 (m, 2H), 8.73 (d, J=7.0 Hz, 4H), 7.67-7.65 (m, 2H), 7.62-7.59 (m, 4H). MS (ASAP): 371.2 [(M+H)⁺].

2) 6-(4,6-diphenyl-1,3,5-triazin-2-yl)-2,3-difluoro[1,1'-biphenyl]-4-carbonitrile 6a A mixture of compound 5a (2.5 g, 3.50 mmol), K₂CO₃ (2.8 g, 20.4 mmol), bromobenzene (2.10 g, 13.6 mmol), 2-ethylhexanoic acid (0.20 g, 1.36 mmol), tricyclohexyl phosphine (0.29 g, 1.02 mmol) and Pd(PPh₃)₂Cl₂ (0.24 g, 0.34 mmol) in xylene (20 ml) was heated at 130° C. for 15 h. The solvent was removed and washed by water. The residue was purified by reprecipitation (MeOH) and column chromatography (hexane/toluene=7/3–1/2), and then, the residue was purified by recrystallization (toluene/hexane) to give 6-(4,6-diphenyl-1,3,5-triazin-2-yl)-2,3-difluoro-[1,1'-biphenyl]-4-carbonitrile 6a (0.33 g, 0.74 mmol, 11%) as white powder.

$^1$H-NMR (500 MHz, CDCl₃, δ): 8.50 (d, J=5.0 Hz, 1H), 8.29 (d, J=5.0 Hz, 4H), 7.57 (t, J=7.0 Hz, 2H), 7.49-7.32 (m, 9H). MS (ASAP): 447.3 [(M+H)⁺].

3) 2,3-di(9H-carbazol-9-yl)-6-(4,6-diphenyl-1,3,5-triazin-2-yl)-[1,1'-biphenyl]-4-carbonitrile 3 (Compound 227)

A mixture of K₂CO₃ (1.47 g, 8.8 mmol) and 9H-carbazole (1.47 g, 8.80 mmol), 6-(4,6-diphenyl-1,3,5-triazin-2-yl)-2,3-difluoro-[1,1'-biphenyl]-4-carbonitrile 6a (0.99 g, 2.22 mmol) in DMF (10 ml) was stirred at 120° C. for 15 h and at 140° C. for 4 h. The reaction mixture was quenched with MeOH and H₂O. The precipitated powder was filtered, washed with MeOH, and purified by reprecipitation (DCM:MeOH) and column chromatography (toluene/hexane=1/1–2/1) to give Compound 227 (1.06 g, 1.43 mmol) in 65% yield as yellow powder.

$^1$H-NMR (500 MHz, CDCl₃, δ): 8.94 (s, 1H), 8.36 (d, J=8.0 Hz, 4H), 7.71 (d, J=7.6 Hz, 2H), 7.58 (t, J=7.6 Hz, 2H), 7.55-7.53 (m, 2H), 7.47 (t, J=7.6 Hz, 4H), 7.08-7.03 (m, 6H), 6.97-6.96 (m, 2H), 6.90 (d, J=3.0 Hz, 6H), 6.82-6.81 (m, 3H). MS (ASAP): 741.6 [(M+H)⁺].

Synthesis of Compound 467

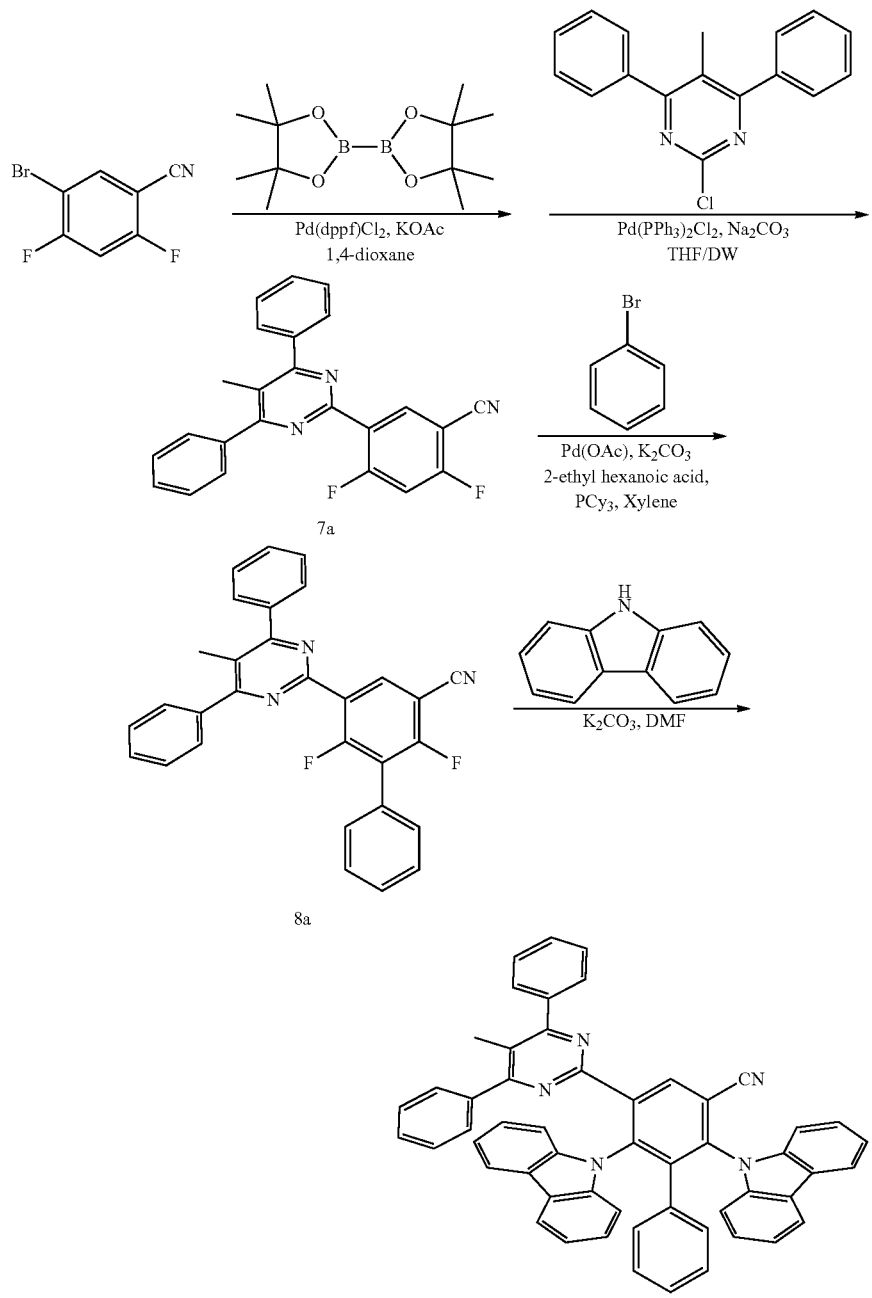

1) Synthesis of 2,4-difluoro-5-(5-methyl-4,6-diphenylpyrimidin-2-yl)benzonitrile 7a Potassium acetate (2.70 g, 27.52 mmol), 4,4,4',4',5,5,5',5'-octamethyl-2,2'-bi(1,3,2-dioxaborolane) (3.84 g, 15.14 mmol), 1,1'-bis(diphenylphosphino)ferrocene]dichloropalladium(II) (0.30 g, 3 mol %) and 5-bromo-2,4-difluorobenzonitrile (3.00 g, 13.76 mmol) were dissolved in 1,4-dioxane under nitrogen atmosphere. The mixture flask of temperature was increase to 100° C. and then stirred overnight. After starting compounds disappeared in thin layer chromatography, the mixture flask of temperature was decrease to room temperature. 2-Chloro-5-methyl-4,6-diphenylpyrimidine (4.25 g, 15.15 mmol), bis(triphenylphosphine)palladium(II) dichloride (3 mol %) and potassium carbonate (5.70 g, 41.31 mmol, 2 M aqueous solution) put into same flask maintaining nitrogen atmosphere. The mixture flask of temperature was increase to 100° C. and then stirred overnight under nitrogen atmosphere. The reaction quenched by brine solution at room temperature, and the mixture extracted by chloroform and dried over $MgSO_4$ and then concentrated by vacuum evaporator system. The mixture was purified by column chromatography on silica gel using n-hexane; chloroform as an eluent to give 2,4-difluoro-5-(5-methyl-4,6-diphenylpyrimidin-2-yl)benzonitrile 7a as a powdery product (2.80 g, 53.0% yield).
¹H-NMR (500 MHz, CDCl₃, δ): 2.43 (s, 3H), 7.09 (t, J=8.0 Hz, 1H), 7.50-7.55 (m, 6H), 7.71 (d, J=7.5 Hz, 4H), 8.57 (t, J=8.0 Hz, 1H), MS (APCI): 384.20 [(M+H)⁺].

2) Synthesis of 2,6-difluoro-5-(5-methyl-4,6-diphenylpyrimidin-2-yl)-[1,1'-biphenyl]-3-carbonitrile 8a Palladium(II)acetate (3 mol %), 2,4-difluoro-5-(5-methyl-4,6-diphenylpyrimidin-2-yl)benzonitrile 7a (7.82 mmol, 3.00 g), bromobenzene (23.47 mmol, 3.69 g), potassium carbonate (23.47 mmol, 3.24 g), 2-ethyl hexanoic acid (1.56 mmol, 0.23 g) and tricyclohexylphosphine (0.70 mmol, 0.20 g) put into 3 neck round flask under nitrogen atmosphere. After nitrogen gas flow in a minute, it was dissolved in xylene. The temperature of mixture was increased to 100° C. and then stirred overnight. The reaction quenched by brine solution at room temperature, and the mixture extracted by chloroform and dried over MgSO₄ and then concentrated by vacuum evaporator system. The mixture was purified by column chromatography on silica gel using n-hexane/chloroform as an eluent to give 2,6-difluoro-5-(5-methyl-4,6-diphenylpyrimidin-2-yl)-[1,1'-biphenyl]-3-carbonitrile 8a as a white powdery product (2.68 g, 74.0% yield).
¹H-NMR (500 MHz, CDCl₃, δ): 2.46 (s, 3H), 7.46-7.55 (m, 11H), 7.71 (d, J=7.5 Hz, 4H), 8.51 (t, J=7.5 Hz, 1H), MS (APCI): 460.15 [l(M+H)⁺].

3) Synthesis of 2,6-di(9H-carbazol-9-yl)-5-(5-methyl-4,6-diphenylpyrimidin-2-yl)-[1,1'-biphenyl]-3-carbonitrile (Compound 467)

Potassium carbonate (1.35 g, 9.79 mmol), 2,6-difluoro-5-(5-methyl-4,6-diphenylpyrimidin-2-yl)-[1,1'-biphenyl]-3-carbonitrile 8a (1.50 g, 3.26 mmol) and 9H-carbazole (1.64 g, 9.79 mmol) were placed in three neck round bottom flask. The mixture dried by vacuum system and then DMF was poured into flask as solvent under nitrogen atmosphere. The reaction mixture stirred overnight keeping at 160° C. The reaction quenched by NH₄Cl in aqueous solution and the mixture extracted by chloroform. The separated organic layer dried by MgSO₄ and concentrated solvent by vacuum evaporator system. The reaction product was isolated by column chromatography using a mixture of toluene and hexane (1:4) as an eluent. A final product was obtained Compound 467 (2.0 g, 97.4%).
¹H-NMR (500 MHz, CDCl₃, δ): 2.09 (s, 3H), 6.44 (t, J=7.5 Hz, 2H), 652 (t, J=7.5 Hz, 1H), 6.59 (d, J=7.5 Hz, 2H), 6.98 (d, J=8.0 Hz, 4H), 7.06 (d, J=8.5 Hz, 2H), 7.13 (t, J=7.5 Hz, 2H), 7.20 (t, J=8.0 Hz, 4H), 7.28-7.38 (m, 9H), 7.84 (d, J=8.0 Hz, 2H), 7.97 (d, J=7.5 Hz, 2H), 8.59 (s, 1H), MS (APCI): 754.43 [(M+H)⁺].

Synthesis of Compound 475

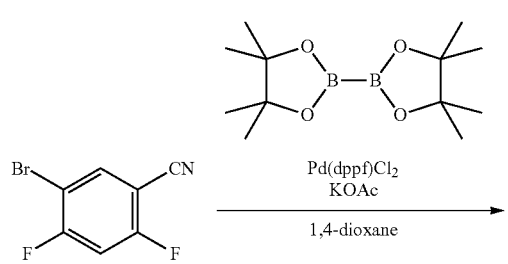

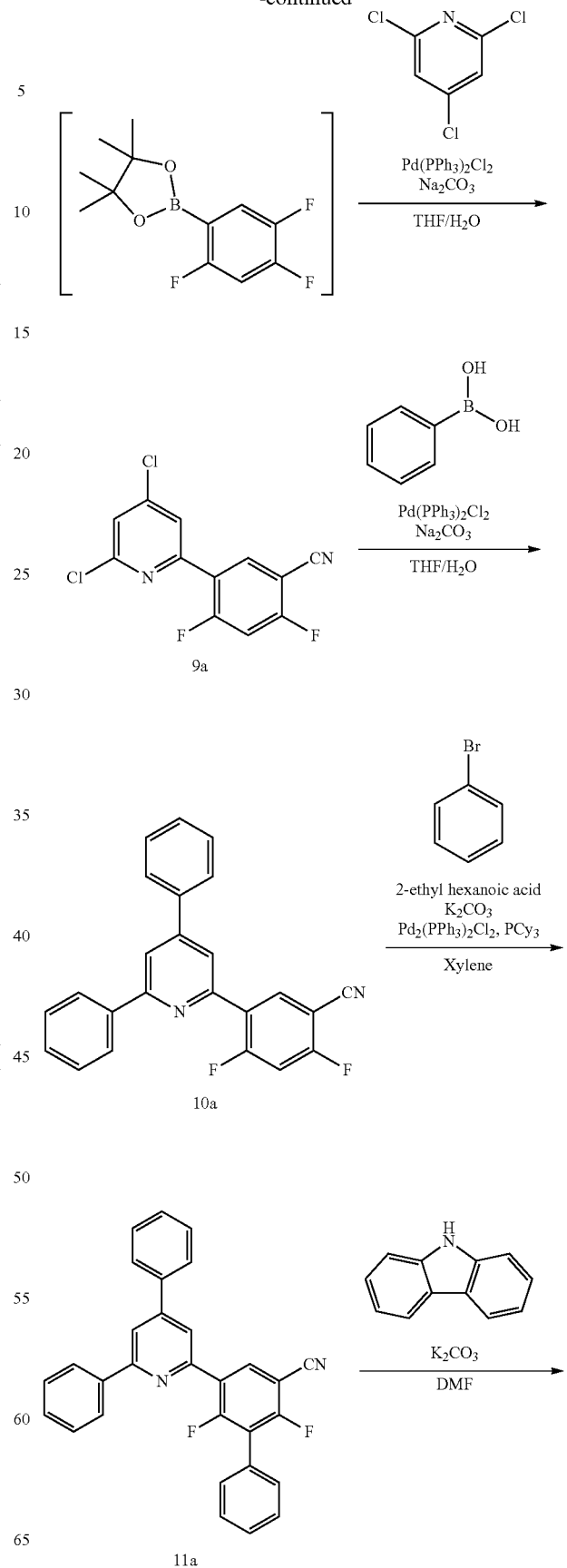

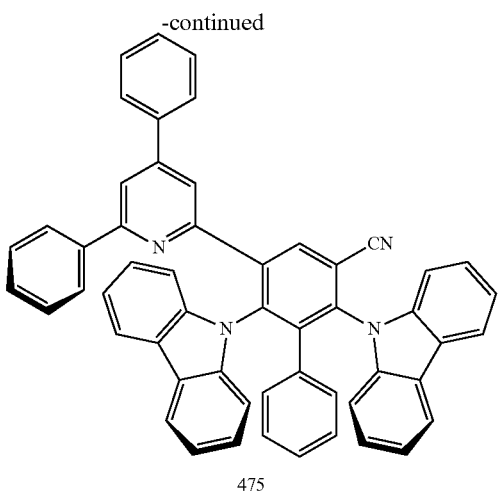

475

1) Synthesis of 5-(4,6-dichloropyridin-2-yl)-2,4-difluorobenzonitrile 9a

A mixture of 5-bromo-2,4-difluorobenzonitrile (4.36 g, 20.0 mmol), bis(pinacolato)diboron (5.59 g, 22.0 mmol), KOAc (5.89 g, 60.0 mmol) in dioxane (20 mL) was degassed and charged by $N_2$. Then, Pd(dppf)$Cl_2$ (0.44 g, 0.60 mmol) was added to the mixture and the mixture was stirred at 110° C. for 4 h. To a reaction mixture, water (10 mL) and THF (10 ml), 2,4,6-trichloropyridine (10.9 g, 60.0 mmol), and sodium carbonate (5.30 g, 50.0 mmol) were added. The mixture was degassed and charged by $N_2$, Pd(PPh$_3$)$_2$Cl$_2$ (0.70 g, 1.0 mmol) and were added to the mixture. The mixture was stirred for 15 h at 80° C. The reaction mixture was concentrated under reduced pressure. The resulting mixture was resolved in DCM and reprecipitated by MeOH. The residue was purified by silica gel column chromatography (hexane/toluene=1/1–1/2) to give 5-(4,6-dichloropyridin-2-yl)-2,4-difluorobenzonitrile 9a (2.78 g, 9.8 mmol, 49%) as white solid.

$^1$H-NMR (500 MHz, CDCl$_3$, δ): 8.50 (t, J=7.5 Hz, 1H), 7.76 (s, 1H), 7.41 (s, 1H), 7.12 (t, J=9.0 Hz, 1H). MS (APCI): 285.1 [(M+H)$^+$].

2) Synthesis of 5-(4,6-diphenylpyridin-2-yl)-2,4-difluorobenzonitrile 10a 5-(4,6-dichloropyridin-2-yl)-2,4-difluorobenzonitrile 9a (1.62 g, 5.70 mmol), phenylboronic acid (2.78 g. 22.8 mmol), and sodium carbonate (3.02 g, 28.5 mmol) were added to water (2 ml) and THF (10 ml). The mixture was degassed and charged by $N_2$. Pd(PPh$_3$)$_2$Cl$_2$ (0.20 g, 0.29 mmol) and were added to the mixture. The mixture was stirred for 15 h at 80° C. The reaction mixture was concentrated under reduced pressure. The resulting mixture was resolved in DCM and reprecipitated by MeOH. The residue was purified by silica gel column chromatography (hexane/toluene=1/1–1/2) to give 5-(4,6-diphenylpyridin-2-yl)-2,4-difluorobenzonitrile 10a (1.45 g, 3.9 mmol, 69%) as white solid.

$^1$H-NMR (500 MHz, CDCl$_3$, δ): 8.69 (t, J=7.5 Hz, 1-H), 8.15 (d, J=8.0 Hz, 2H), 7.98 (s, 1H), 7.95 (s, 1H), 7.74 (d, J=7.5 Hz, 2H), 7.55 (t, J=7.5 Hz, 2H), 7.52-7.48 (m, 4H), 7.13 (t, J=9.0 Hz, 1H). MS (APCI): 369.18 [(M+H)$^+$].

3) 5-(4,6-diphenylpyridin-2-yl)-2,6-difluoro-[1,1'-biphenyl]-3-carbonitrile 11a A mixture of compound 10a (1.49 g, 4.0 mmol), $K_2CO_3$ (1.66 g, 12.0 mmol), bromobenzene (0.94 g, 6.0 mmol), 2-ethylhexanoic acid (0.20 g, 1.4 tricyclohexyl phosphine (0.10 g, 0.36 mmol) and Pd(PPh$_3$)$_2$Cl$_2$ (0.08 g, 0.12 mmol) in xylene (12 ml) was heated at 110° C. for 15 h. MeOH was added to the reaction mixture and filtrated. The residue was purified by silica gel column chromatography (hexane/toluene=4/6–3/7) to give 5-(4,6-diphenylpyridin-2-yl)-2,6-difluoro-[1,1'-biphenyl]-3-carbonitrile 11a (1.18 g, 2.65 mmol, 67%) as white powder.

$^1$H-NMR (500 MHz, CDCl$_3$, δ): 8.63 (t, J=6.5 Hz, 1H), 8.17 (d, J=8.0 Hz, 2H), 7,98 (s, 1H), 7.96 (s, 1H), 7.72 (d, J=8.0 Hz, 2H), 7.56-7.50 (t, J=7.0 Hz, 11H). MS (APCI): 445.3 [M+H$^+$].

4) 2,6-di(9H-carbazol-9-yl)-5-(4,6-diphenylpyridin-2-yl)-[1,1'-biphenyl]-3-carbonitrile 4 (Compound 475)

A mixture of $K_2CO_3$ (1.73 g, 12.5 mmol) and 9H-carbazole (1.67 g, 10.0 mmol), 5-(4,6-diphenylpyridin-2-yl)-2,6-difluoro-[1,1'-biphenyl]-3-carbonitrile 11a (1.11 g, 2.50 mmol) in DMF (25 was stirred at 110° C. for 15 h. The reaction mixture was quenched with MeOH and $H_2O$. The precipitated powder was filtered, washed with MeOH, and purified by reprecipitation (DCM: MeOH) and column chromatography (toluene) to give Compound 475 (1.04 g. 1.41 mmol) in 56% yield as white powder.

$^1$H-NMR (500 MHz, CDCl$_3$, δ): 8.71 (s, 1H), 7.99 (d, J=8.0 Hz, 2H), 7.89 (d, J=8.0 Hz, 2H), 7.81 (d, J=8.0 Hz, 2H), 7.58 (s, 1H), 7.45-7.41 (m, 3H), 7.36 (t, J=7.5 Hz, 2H), 7.28 (t, J=7.5 Hz, 1H), 7.25-7.10 (m, 12H), 6.85 (s, 1H), 6.81 (d, J=8.0 Hz, 2H), 6.62 (d, J=7.5 Hz, 2H), 6.53 (t, J=7.5 Hz, 1H), 6.42 (t, J=7.5 Hz, 2H). MS (APCI): 739.4 [(M+H)$^+$].

Synthesis of Compound 483

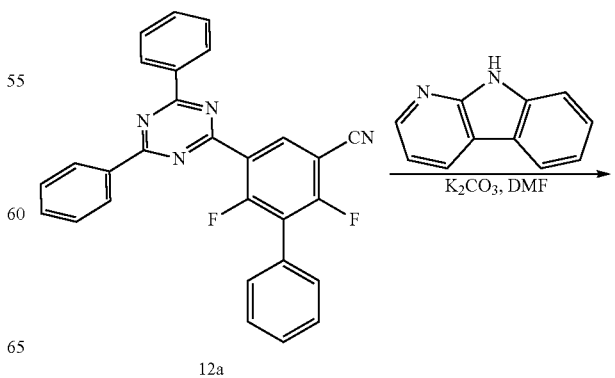

12a

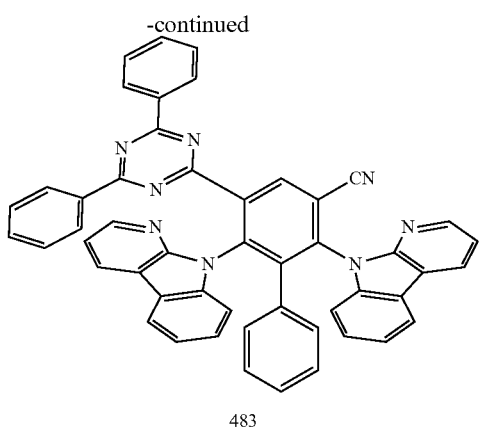

483

Synthesis of 5-(4,6-diphenyl-1,3,5-triazin-2-yl)-2,6-bis(9H-pyrido[2,3-b]indol-9-yl)-[1,1'-biphenyl]-3-carbonitrile (Compound 483)

Potassium carbonate (6.72 mmol, 0.93 g, 5-(4,6-diphenyl-1,3,5-triazin-2-yl)-2,6-diflouro-[1,1'-biphenyl]-3-carbonitrile 12a (2.24 mmol, 1.00 g) and 9H-pyrido[2,3-b]indole (5.60 mmol, 0.94 g) were placed in three neck round bottom flask. The mixture dried by vacuum system and then N,N-dimethylformamide was poured into flask as solvent under nitrogen atmosphere. The reaction mixture stirred overnight keeping temperature of 100° C. The reaction quenched by brine and the mixture extracted by chloroform. The separated organic layer dried by MgSO$_4$ and concentrated solvent by vacuum evaporator system. The reaction product was isolated by column chromatography using a mixture of chloroform and hexane (1:4) as an eluent to give Compound 483 (0.90 g, 54%)

$^1$H-NMR (500 MHz, CDCl$_3$, δ): 6.43 (m, 2H), 6.78 (m, 1H), 6.99-7.00 (m, 1H), 7.12-7.18 (m, 3H), 7.29 (d, J=6.5 Hz, 3H), 7.32 (t, J=7.5 Hz, 6H), 7.48 (t, J=7.5 Hz, 3H), 7.76 (d, J=8.0 Hz, 1H), 7.89 (d, J=8.0 Hz, 1H), 8.00 (d, J=7.5 Hz, 6H), 8.28 (d, J=8.0 Hz, 2H), 8.56 (d, J=5.0 Hz, 1H), 9.05 (s, 1H), MS (APCI): 743.42 [(M+H)$^+$].

Synthesis of Compound 485

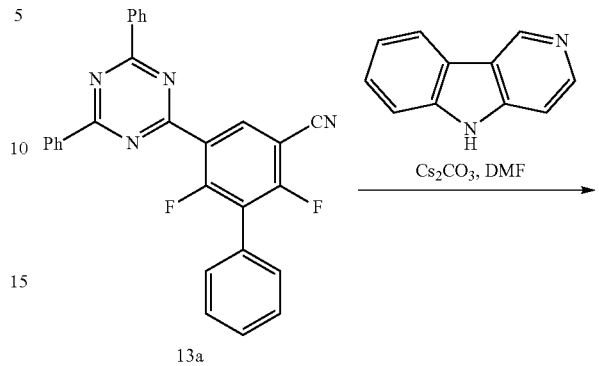

13a

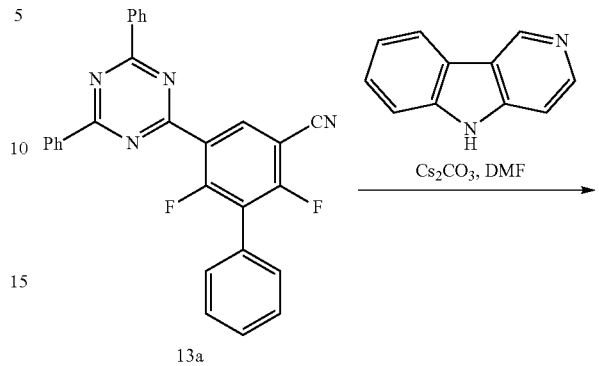

485

Synthesis of Compound 485

A mixture of Cs$_2$CO$_3$ (4.84 g, 14.9 mmol) and γ-carboline (2.00 g, 11.9 mmol) in DMF (50 mL) was stirred at room temperature for I h and then Compound 13a (2.21 g, 4.95 mmol) was added. The mixture was stirred at 100° C. for 24 h. The reaction mixture was quenched with H$_2$O. The precipitated products were filtered, washed with MeOH, and purified by reprecipitation (EtOAc: Hex) to give Compound 485 (1.30 g, 1.75 mmol) in 35.3% yield as yellow powder.

$^1$H-NMR (500 MHz, CDCl$_3$, δ): 9.26 (s, 1H), 9.06 (s, 1H), 9.03 (s, 1H), 8,47 (d, J=5.5 Hz, 1H), 8.39 (d, J=5.5 Hz, 1H), 8.11 (d, J=7.5 Hz, 1H), 7.99 (d, J=7.5 Hz, 4H), 7.88 (d, J=7.5 Hz, 1H), 7.53-7.49 (m, 3H), 7.40-7.30 (m, 6H), 7.23-7.17 (m, 3H), 7.03 (t, J=6.5 Hz, 2H), 6.62-6.59 (m, 3H), 6.51-6.48 (m, 2H). MS (ASAP): 742.3 [M$^+$].

Synthesis of Compound 1245

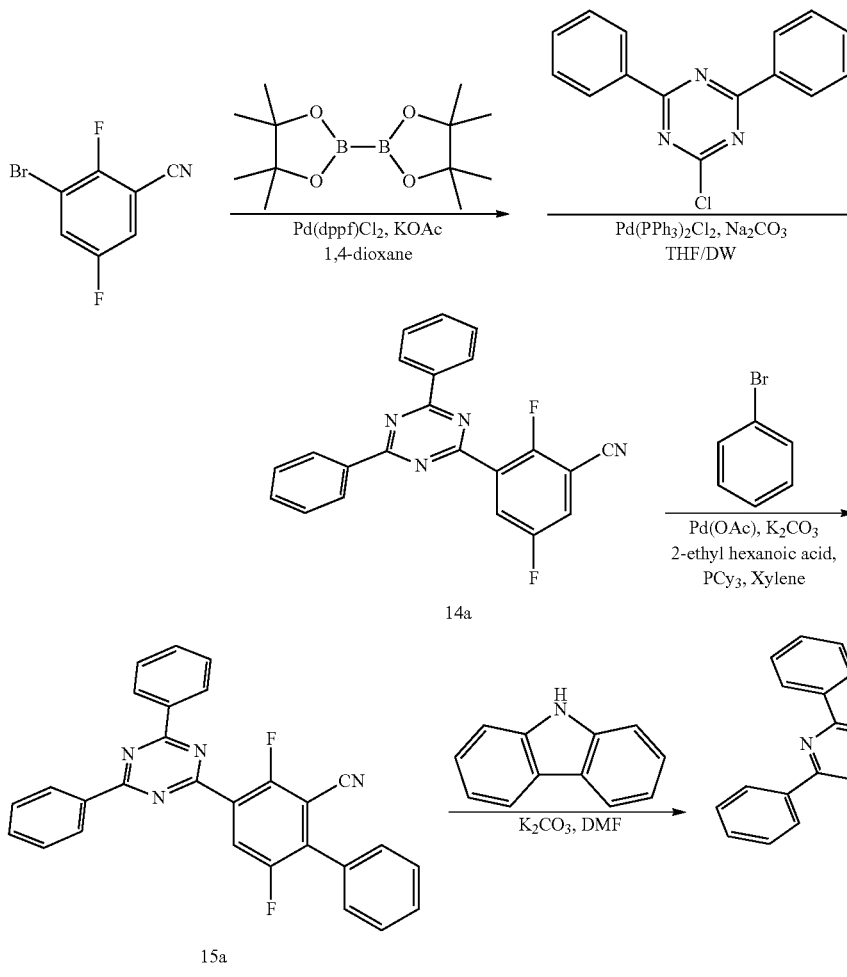

1) Synthesis of 3-(4,6-diphenyl4,3,5-triazin-2-yl)-2,5-difluorobenzonitrile 14a

Potassium acetate (4.50 g, 45.87 mmol), 4,4,4',4',5,5,5',5'-octamethyl-2,2?-bi(1,3,2-dioxaborolane) (6.41 g, 25.23 mmol), 1,1'-bis(diphenylphosphino)ferrocene]dichloropalladium(II) (0.50 g, 3 mol %) and 3-bromo-2,5-difluorobenzonitrile (5.00 g, 22.94 mmol) were dissolved in 1,4-dioxane under nitrogen atmosphere. The mixture flask of temperature was increase to 100° C. and then stirred overnight. After starting compounds disappeared in thin layer chromatography, the mixture flask of temperature was decrease to room temperature. 2-Chloro-4,6-diphenyl-1,3,5-triazine (6.32 g, 24.90 mmol), bis(triphenylphosphine)palladium(II) dichloride (3 mol %) and sodium carbonate (3.59 g, 33.95 mmol, 2 M aqueous solution) put into same flask maintaining nitrogen atmosphere. The mixture flask of temperature was increase to 100° C. and then stirred overnight under nitrogen atmosphere. The reaction quenched by brine solution at room temperature, and the mixture extracted by chloroform and dried over MgSO$_4$ and then concentrated by vacuum evaporator system. The mixture was purified by column Chromatography on silica gel using n-hexane/chloroform as an eluent to give 3-(4,6-diphenyl-1,3,5-triazin-2-yl)-2,5-difluorobenzonitrile 14a as a powdery product (3.20 g, 38.2% yield).

$^1$H-NMR (500 MHz, CDCl$_3$, δ): 7.54-7.57 (m, 1H), 7.59 (t, J=7.5 Hz, 4H), 7.65 (t, J=7.5 Hz, 2H), 8.48-8.51 (m, 1H), 8.73 (d, J=8.0 Hz, 4H). MS (APCI): 384.20 [(M+H)$^+$].

2) Synthesis of 4-(4,6-diphenyl-1,3,5-triazin-2-yl)-3,6-difluoro-[1,1'-biphenyl]-2-carbonitrile 15a Palladium(II)acetate (3 mol %), 3-(4,6-diphenyl-1,3,5-triazin-2-yl)-2,5-difluorobenzonitrile 14a (2.70 mmol, 1.00 g), bromobenzene (8.10 mmol, 1.27 g), potassium carbonate (10.80 mmol, 1.50 g), 2-ethyl hexanoic acid (0.54 mmol, 0.08 g) and tricyclohexylphosphine (0.24 mmol, 0.07 g) put into 3 neck round flask under nitrogen atmosphere. After nitrogen gas flow in a minute, it was dissolved in xylene. The temperature of mixture was increased to 100° C. and then stirred overnight. The reaction quenched by brine solution at room temperature, and the mixture extracted by chloroform and dried over MgSO$_4$ and then concentrated by vacuum evaporator system. The mixture was purified by column chromatography on silica gel using n-hexane/chloroform as an eluent to give 4-(4,6-diphenyl-1,3,5-triazin-2-yl)-3,6-difluoro-[1,1'-biphenyl]-2-carbonitrile 15a as a white powdery product (1.2 g, 99.5% yield).

¹H-NMR (500 MHz, CDCl₃, δ): 7.17 (t, J=7.5 Hz, 1H), 7.56-7.66 (m, 10H), 8.56-8.60 (m, 1H), 8.75 (d, J=7.5 Hz, 4H), MS (APCI): 447.43 [(M+H)⁺].

3) Synthesis of 3,6-di(9H-carbazol-9-yl)-4-(4,6-diphenyl-1,3,5-triazin-2-yl)-[1,1'-biphenyl]-2-carbonitrile (Compound 1245)

Potassium carbonate (0.46 g, 3.36 mmol), 4-(4,6-diphenyl-1,3,5-triazin-2-yl)-3,6-difluoro-[1,1'-biphenyl]-2-carbonitrile 15a (0.50 g, 1.12 mmol) and 9H-carbazole (0.56 g, 3.36 mmol) were placed in three neck round bottom flask. The mixture dried by vacuum system and then DMF was poured into flask as solvent under nitrogen atmosphere. The reaction mixture stirred overnight keeping at 160° C. The reaction quenched by NH₄Cl in aqueous solution and the mixture extracted by chloroform. The separated organic layer dried by MgSO₄ and concentrated solvent by vacuum evaporator system. The reaction product was isolated by column chromatography using a mixture of toluene and hexane (1:4) as an eluent. A final product was obtained (Compound 1245) (0.58 g, 70%).
¹H-NMR (500 MHz, CDCl₃, δ): 7.07-7.14 (m, 3H), 7.28-7.31 (m, 12H), 7.36-7.48 (m, 8H), 7.93 (d, J=7.5 Hz, 4H), 8.02 (d, J=7.5 Hz, 2H), 8.07 (d, J=7.5 Hz, 2H), 8.85 (s, 1H). MS (APCI): 741.67 [(M+H)⁺].

Synthesis of Compound 416

Synthesis of 5-(4,6-diphenyl-1,3,5-triazin-2-yl)-2,4-bis(3-methyl-6-tolyl-9H-carbazole-9-yl)-3-phenyl-benzonitrile (Compound416)

The mixture of the 5-4,6-diphenyl-1,3,5-triazin-2-yl)-2,4-difluoro-3-phenylbenzonitrile 13a (0.73 mg, 1.63 mmol), K₂CO₃ (0.81 mg, 5.84 mmol) and 91H-3-methyl-6-tolyl-carbazole (1.04 g, 3.83 mmol) was added and stirred at 110° C. for 20 h. Water and MeOH was added to reaction mixture and the propitiated solid was filtrated and washed by water and MeOH. The residue was purified by column chromatography (hexane/toluene=3/7) and recrystallized by toluene and MeOH to obtain Compound 416 (1,1 g, 3.0 mmol, 78%). ¹H-NMR (400 MHz, CDCl₃, δ): 8.91 (s, 1H), 8.15 (d, J=10.4 Hz, 1H), 8.00-7.97 (m, 5H), 7.85 (d, J=10.4 Hz, 1H), 7.63 (s, 1H), 7.60-7.52 (m, 3H), 7.50-7.45 (m, 5H), 7.31 (t, J=7.6 Hz, 4H), 7.19-7.16 (m, 2H), 7.18-7.00 (m, 5H), 7.25-7.20 (m, 3H), 6.72 (d, J=7.6 Hz, 2H), 6.62-6.59 (m, 1H), 6.52 (t, J=7.6 Hz, 2H), 2.52 (s, 1.5H), 2.49 (s, 1.5H), 2.41 (s, 6H), 2.40 (s, 1.5H) and 2.39 (s, 1.5H). MS (ASAP): 949.50 (M+H⁺). Calcd for C₆₈H₄₈N₆, 948.39.

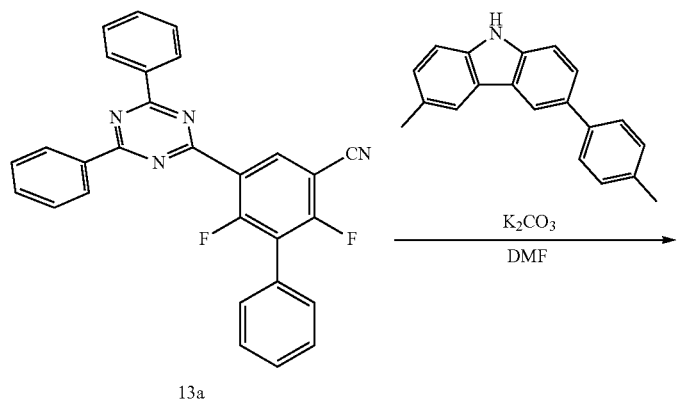

13a

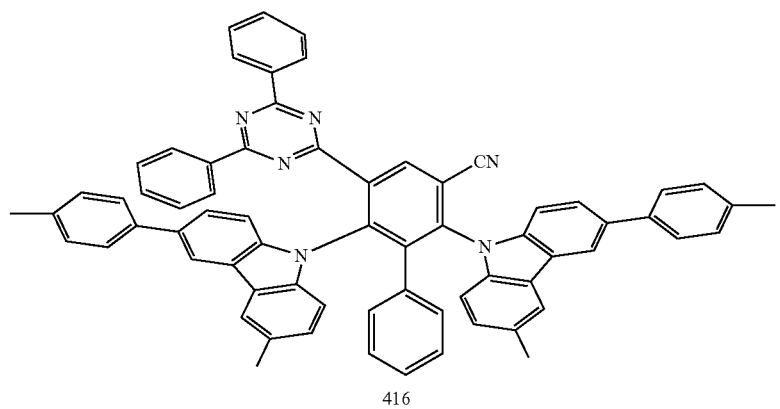

416

81
Synthesis of Compound 1757

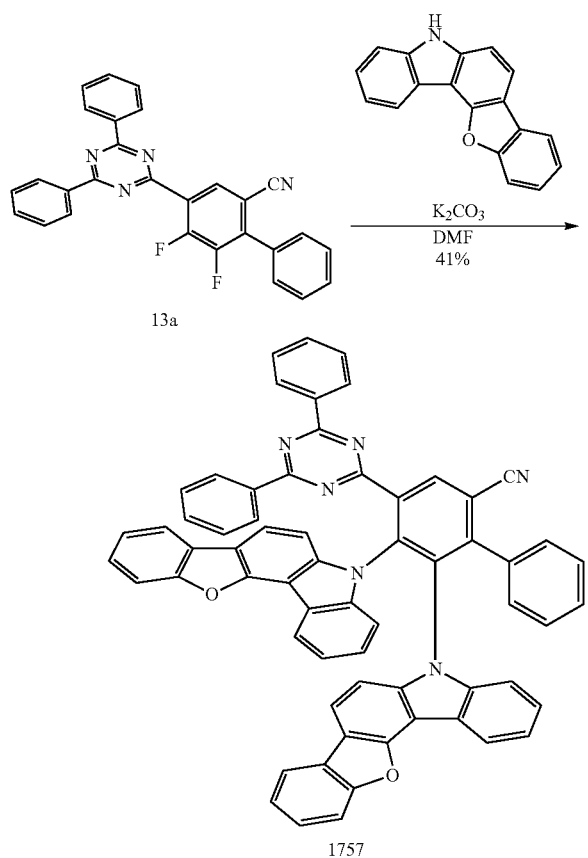

82
Synthesis of 5-(4,6-diphenyl-1,3,5-triazin-2-yl)-3,4-bis(benzofuro[3,2-c]carbazole-5-yl)-2-phenylbenzonitrile (Compound 1757)

The mixture of the 5-(4,6-diphenyl-1,3,5-triazin-2-yl)-3,4-difluoro-2-phenylbenzonitrile 14a (76 mg, 1.71 mmol), $K_7CO_3$ (0.93 g, 6.84 mmol) and 5H-Benzofuro[3,2-c]carbazole (1.76 g, 6.84 mmol) in DMF (30 mL) were added and stirred at 110° C. for 12 h. Water and MeOH was added to reaction mixture and the propitiated solid was filtrated and washed by water and MeOH. The residue was purified by column chromatography (Hexane/$CHCl_3$=3/2) and recrystallized by toluene and MeOH to obtain 5-(4,6-diphenyl-1,3,5-triazin-2-yl)-3,4-bis(benzofuro[3,2-c]carbazole-5-yl)-2-phenylbenzonitrile 1757 (0,64 g, 0.69 mmol, 41%).

$^1$H-NMR (400 MHz, $CDCl_3$, δ): 9.09 (s, 0.5H), 9.09 (s, 0.5H), 8.06-8.02 (m, 1H), 7.97-7.97 (m, 1H), 7.89 (d, J=8.4 Hz, 4H), 7.83-7.74(m, 2H), 7.58-7.47 (m, 4H), 7.39-7.28 (m, 5H), 7.26-7.20 (m, 2H), 7.18-7.13 (m, 8H), 7.11-6.97 (m, 8H). MS (ASAP): 921.53 (M+H$^+$). Calcd for $C_{64}H_{36}N_6O_2$, 920.29.

Synthesis of Compound 1756

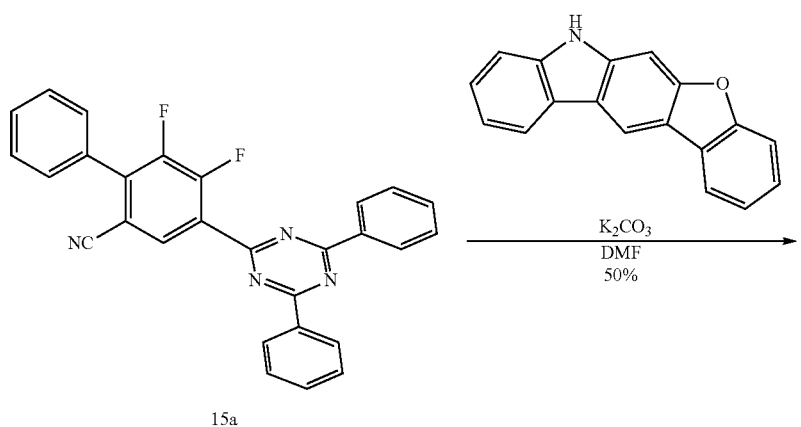

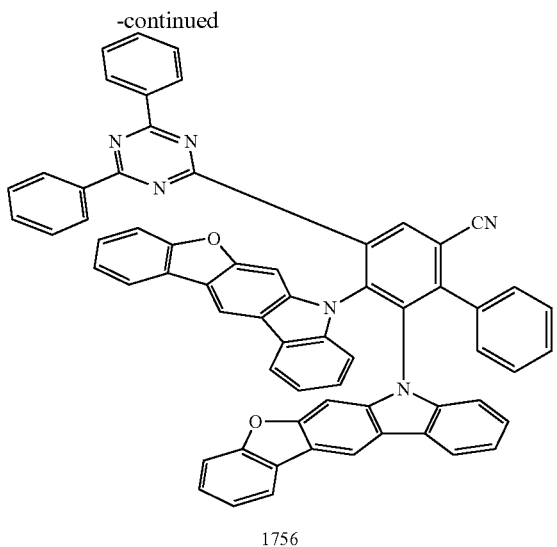

1756

Synthesis of 5-(4,6-diphenyl-1,3,5-triazin-2-yl)-3,4-bis(benzofuro[2,3-b]carbazole-7-yl)-2-phenylbenzonitrile (Compound 1756)

The mixture of the 5-(4,6-diphenyl-1,3,5-triazin-2-yl)-3,4-difluoro-2-phenylbenzonitrile 15a (50 mg, 0.11 mmol), $K_7CO_3$ (46 mg, 0.34 mmol) and 7H-Benzofuro[2,3-b]carbazole (86 mg, 0.37 mmol) in DMF (1 mL) were added and stirred at 110° C. for 12 h. Water and MeOH was added to reaction mixture and the propitiated solid was filtrated and washed by water and MeOH. The residue was purified by column chromatography (toluene/hexane=4/1) and recrystallized by $CHCl_3$ and hexane to obtain 5-(4,6-diphenyl-1,3,5-triazin-2-yl)-3,4-bis(benzofuro[2,3-b]carbazole-7-yl)-2-phenylbenzonitrile 1756 (52 mg, 0.06 mmol, 50%).

$^1$H-NMR (400 MHz, $CDCl_3$, δ): 9.14 (s, 1H), 8.12-8.09 (m, 1H), 8.06-8.03 (m, 1H), 7.97-7.75 (m, 7H), 7.66-7.57 (m, 2H), 7.53-7.47 (m, 1H), 7.47-7.32 (m, 2H), 7.29-7.12 (m, 14H), 7.09-6.96 (m, 41-1), 6.94-6.87 (m, 3H). MS (ASAP): 921.44 (M+H$^+$). Calcd for $C_{64}H_{36}N_6O_2$, 920.29.

Synthesis of Compound 1753

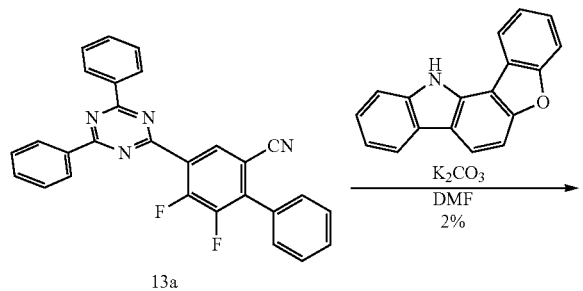

13a

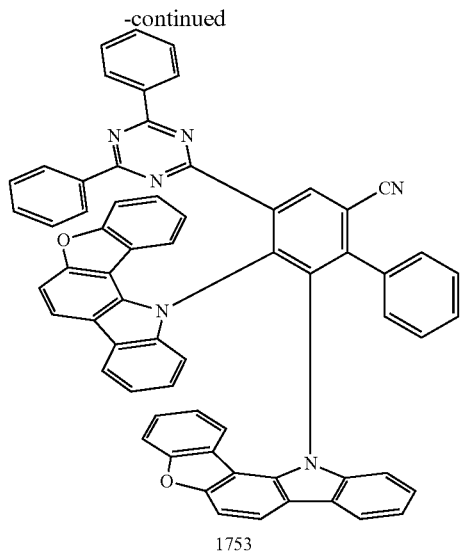

1753

Synthesis of 5-(4,6-diphenyl-1,3,5-triazin-2-yl)-3,4-bis(benzofuro[3,2-a]carbazole-12-yl)-2-phenylbenzonitrile (Compound 1753)

The mixture of the 5-(4,6-diphenyl-1,3,5-triazin-2-yl)-3,4-difluoro-2-phenylbenzonitrile 16a (50 mg, 0.11 mmol), $K_2CO_3$ (46 mg, 0.34 mmol) and 12H-Benzofuro[3,2-a]carbazole (86 mg, 0.37 mmol) were added and stirred at 165 for 12 h. Water and MeOH was added to reaction mixture and the propitiated solid was filtrated and washed by water and MeOH. The residue was purified by column chromatography (toluene/hexane=4/1) and recrystallized by $CHCl_3$ and hexane to obtain 5-(4,6-diphenyl-1,3,5-triazin-2-yl)-3,4-bis(benzofuro[3,2-a]carbazole-12-yl)-2-phenylbenzonitrile 1753 (52 mg, 0.06 mmol, 50%).

$^1$H-NMR (400 MHz, $CDCl_3$, δ): 9.57 (s, 1H), 8.67 (d, J=8.0 Hz, 1H), 7.99 (d, J=8.0 Hz, 4H), 7.73-7.54 (m, 5H), 7.49-7.33 (m, 7H), 7.18-7.11 (m, 4H), 7.09-7.23 (m, 4H), 6.99-6.85 (m, 4H), 6.72-7.65 (m, 3H), 6.52. (t, J=8.0 Hz, 2H), 6.35 (d, J=8.0 Hz, 1H). MS (ASAP): 921.50 (M+H$^+$). Calcd for $C_{64}H_{36}N_6O_2$, 920.29.

Synthesis of Compound 1754

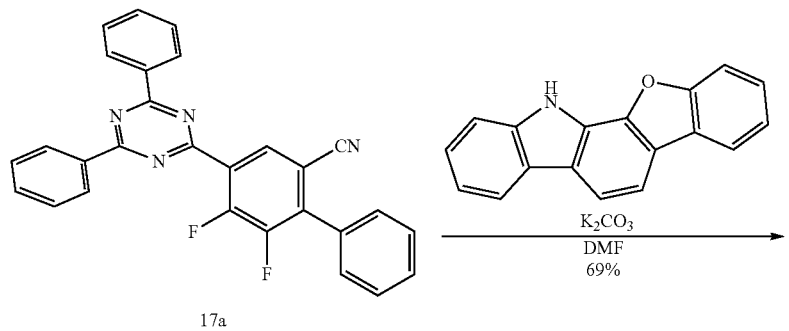

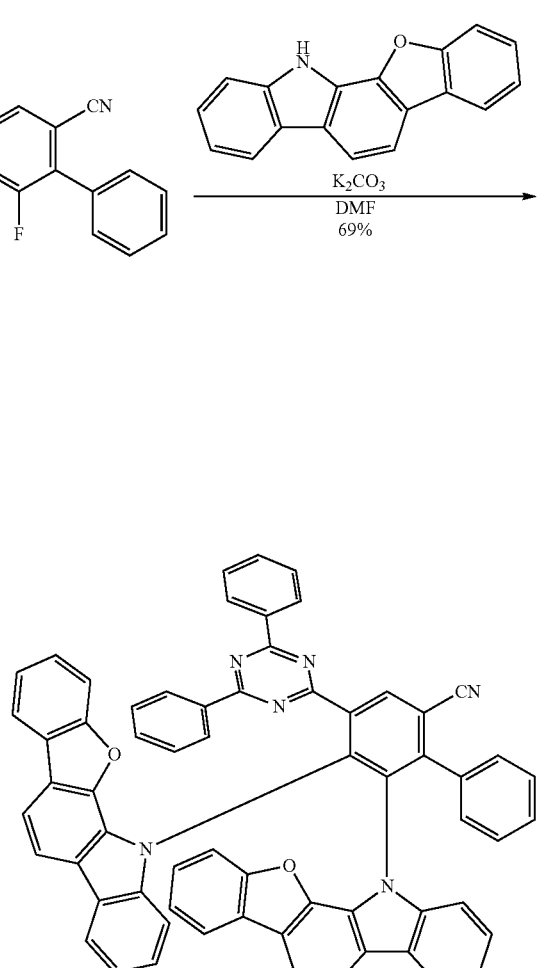

1754

Synthesis of 5-(4,6-diphenyl-1,3,5-triazin-2-yl)-3,4-bis(benzofuro[3,2-a]carbazole-12-yl)-2-phenylbenzonitrile (Compound 1754)

The mixture of the 5-(4,6-diphenyl-1,3,5-triazin-2-yl)-3,4-difluoro-2-phenylbenzonitrile 17a (50 mg, 0.11 mmol), $K_2CO_3$ (46 mg, 0.34 mmol) and 12H-Benzofuro[2,3-a]carbazole (86 mg, 0.37 mmol) were added and stirred at 15° C. for 12 h. Water and MeOH was added to reaction mixture and the propitiated solid was filtrated and washed by water and MeOH. The residue was purified by column chromatography (toluene/hexane=4/1) and recrystallized by $CHCl_3$ and hexane to obtain 5-(4,6-diphenyl-1,3,5-triazin-2-yl)-3,4-bis(benzofuro[2,3-a]carbazole-12-yl)-2-phenylbenzonitrile 1754 (72 mg, 0.08 mmol, 69%).
$^1$H-NMR (400 MHz, $CDCl_3$, δ): 9.40 (s, 0.5H), 9.21 (s, 0.5H), 7.95 (d, J=8.0 Hz, 0.5H), 7.84-7.80 (m, 2.5H), 7.78-7.56 (m, 3H), 7.70 (t, J=8.4 Hz, 1H), 7.64-7.50 (m, 6H), 7.48-7.44 (m, 2H), 7.42-7.35 (m, 3H), 7.34-7.28 (m, 1H), 7.25-7.23 (m, 1H), 7.21-7.14 (m, 5H), 7.12-7.00 (m, 5H), 6.97-6.83 (m, 1H), 6.82-6.69 (m, 3H), 6.48 (t, J=8.4, 1H). MS (ASAP): 921.39 (M+H$^+$). Calcd for $C_{64}H_{36}N_6O_2$, 920.29.

Synthesis of Compound 1758

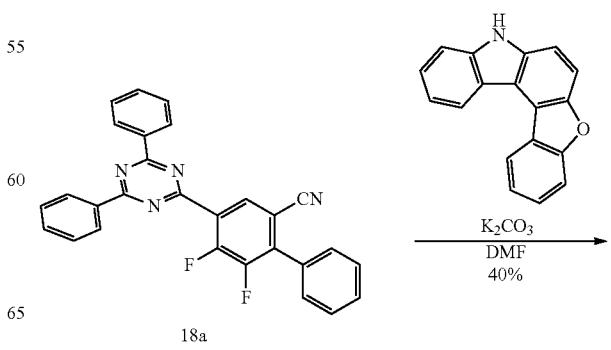

18a

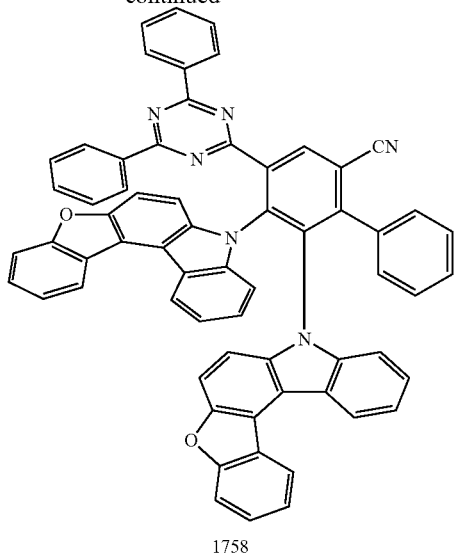

1758

Synthesis of 5-(4,6-diphenyl-1,3,5-triazin-2-yl)-3,4-bis(benzofuro[2,3-c]carbazole-8-yl)-2-phenylbenzonitrile (Compound 1758)

The mixture of the 5-(4,6-diphenyl-1,3,5-triazin-2-yl)-3,4-difluoro-2-phenylbenzonitrile 18a (50 mg, 0.11 mmol), $K_2CO_3$ (46 mg, 0.34 mmol) and 8H-Benzofuro[2,3-c]carbazole (86 mg, 0.37 mmol) were added and stirred at 50° C. for 12 h. Water and MeOH was added to reaction mixture and the propitiated solid was filtrated and washed by water and MeOH. The residue was purified by column chromatography ($CHCl_3$/hexane=4/1) and recrystallized by $CHCl_3$ and hexane to obtain 5-(4,6-diphenyl-1,3,5-triazin-2-yl)-3,4-bis(benzofuro[2,3-c]carbazole-8-yl)-2-phenylbenzonitrile 1758 (41 mg, 004 mmol, 40%).

$^1$H-NMR (400 MHz, $CDCl_3$, δ): 9.10 (s, 0.5H), 9.09 (s, 0.5H), 8.28 (d, J=8.0 1H), 8.19-8.13 m, 2H), 8.11-8.07 (m, 1H), 7.87 (d, J=7.2 Hz , 4H), 7.50 (t, J=8.8 Hz, 2H), 7.41-7.37 (m, 2H), 7.35-7.28 (m, 4H), 7.27-7.25 (m, 3H), 7.23-7.21 (m, 2H), 7.20-6.95 (m, 14H). MS (ASAP): 921.46 (M+H$^+$). Calcd for $C_{64}H_{36}N_6O_2$, 920.29.

Synthesis of Compound 1730

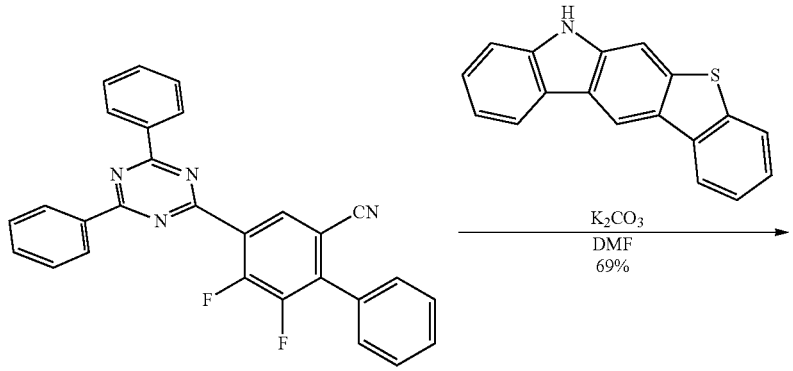

19a

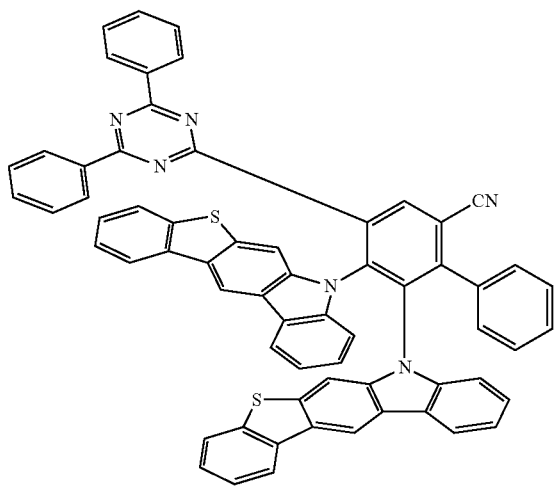

1730

Synthesis of 5-(4,6-diphenyl-1,3,5-triazin-2-yl)-3,4-bis(benzothieno[2,3-b]carbazole-7-yl)-2-phenylbenzonitrile (Compound 1730)

The mixture of the 5-(4,6-diphenyl-1,3,5-triazin-2-yl)-3,4-difluoro-2-phenylbenzonitrile 19a (45 mg, 0.10 mmol), $K_2CO_3$ (41 mg, 0.30 mmol) and 7H-benzothieno[2,3-b]carbazole (83 mg, 0.30 mmol) were added and stirred at 110° C. for 12 h. Water and MeOH was added to reaction mixture and the propitiated solid was filtrated and washed by water and MeOH. The residue was purified by column chromatography (DCM/hexane=1/1) and recrystallized by $CHCl_3$ and hexane to obtain 5-(4,6-diphenyl-1,3,5-triazin-2-yl)-3,4-bis(benzothieno[2,3-b]carbazole-7-yl)-2-phenylbenzonitrile 1730 (66 mg, 0.06 mmol, 69%).
$^1$H-NMR (400 MHz, $CDCl_3$, δ): 9.07 (s, 0.5H), 9.06 (s, 0.5H), 8.28 (s, 0.5 H), 8.27 (s, 0.5 H), 8.22 (s, 0.5 H), 8.21 (s, 0.5 H), 8.00-7.91 (m, 6H), 7.70-7.56 (m, 5H), 7.51 (s, 0.5 H), 7.44 (s, 0.5 H), 7.40-7.27 (m, 7H), 7.26-7.23 (m, 2H), 7.19-7.10 (m, 6H), 7.09-6.91 (m, 6H). MS (ASAP): 953.37 (M+H$^+$). Calcd for $C_{64}H_{36}N_6S_2$, 952.24.

Synthesis of Compound 1731

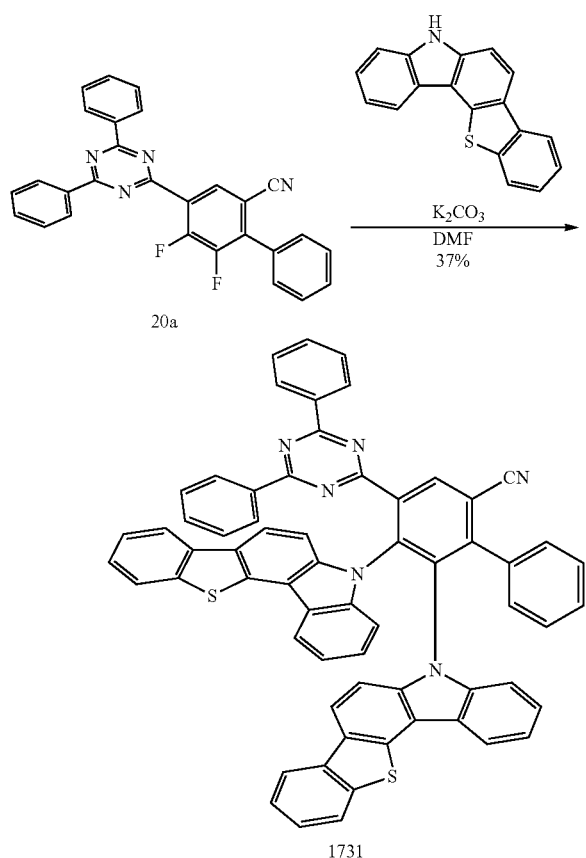

Synthesis of 5-(4,6-diphenyl-1,3,5-triazin-2-yl)-3,4-bis(benzothieno[3,2-s]carbazole-5-yl)-2-phenylbenzonitrile (Compound 1731)

The mixture of the 5-(4,6-diphenyl-1,3,5-triazin-2-yl)-3,4-difluoro-2-phenylbenzonitrile 20a (45 mg, 0.10 mmol), $K_2CO_3$ (41 mg, 0.30 mmol) and 5H-benzothieno[3,2-c]carbazole (83 mg, 0.30 mmol) were added and stirred at 110° C. for 12 h. Water and MeOH was added to reaction mixture and the propitiated solid was filtrated and washed by water and MeOH. The residue was purified by column chromatography (DCM/hexane=1/1) and recrystallized by $CHCl_3$ and hexane to obtain 5-(4,6-diphenyl-1,3,5-triazin-2-yl)-3,4-his(benzothieno[3,2-c]carbazole-5-yl)-2-phenylbenzonitrile 1731 (36 mg, 0.04 mmol, 37%).
$^1$H-NMR (400 MHz, $CDCl_3$, δ): 9.11 (s, 0.5H), 9.11 (s, 0.51-H), 8.04-8.01 (m, 1H), 7.91-7.84 (m, 5H), 7.82-7.74 (m, 4H), 7.71-7.66 (m, 2H), 7.39-7.29 (m, 5H), 7.26-7.23 (m, 2H), 7.21-6.97 (m, 16H).
MS (ASAP): 953.37 (M+H$^+$). Calcd for $C_{64}H_{36}N_6S_2$, 952.24.

Example 3

Preparation of Neat Films

In this example, each of Compounds 1, 21, 227, 416, 467, 475, 483, 485, 1245, 1730, 1731, 1753, 1754, 1756, 1757 and 1758 synthesised in Example 2 was vapor-deposited on a quartz substrate by a vacuum vapor deposition method under a condition of a vacuum degree of $10^{-3}$ Pa or less, so as to form a thin film having a thickness of 70 nm.

The neat films were irradiated with light having a wavelength of 300 nm at 300 K, and thus the light emission spectrum was measured and designated as fluorescence.

Preparation of Doped Films

Compound 1 and mCBP were vapor-deposited from a separate vapor deposition source on a quartz substrate by vacuum vapor deposition method under a condition of a vacuum degree of $10^{-3}$ Pa or less, so as to form a thin film having a thickness of 100 nm and a concentration of Compound 1 of 20% by weight.

In the same manner, doped films were produced by using Compounds 21, 227, 416, 467, 475, 483, 485, 1245, 1730, 1731, 1753, 1754, 1756, 1757 and 1758 instead of Compound 1.

The doped films were irradiated with light having a wavelength of 300 nm at 300 K, and thus the light emission spectrum was measured and designated as fluorescence.

Preparation of OLEDs

Thin films were laminated on a glass substrate having formed thereon an anode formed of indium tin oxide (ITO) having a thickness of 100 nm, by a vacuum vapor deposition method at a vacuum degree of $1.0 \times 10^{-4}$ Pa or less. Firstly, HAT-CN was formed to a thickness of 10 nm on ITO, and thereon NPD was formed to a thickness of 30 nm and TrisPCz was formed to a thickness of 10 nm. mCBP was formed to a thickness of 5 nm, and thereon mCBP and Compound 1 (weight ratio 80:20) were then vapor-co-deposited to form a layer having a thickness of 30 nm, which was designated as a light emitting layer. SF3-TRZ was then formed to a thickness of 10 nm, and thereon SF3-TRZ and Liq (weight ratio 70:30) were vapor-co-deposited to a thickness of 30 nm. Liq was then vacuum vapor-deposited to a thickness of 2 nm, and then aluminum (Al) was vapor-deposited to a thickness of 100 nm to form a cathode, thereby producing an organic electroluminescent device (Device 1).

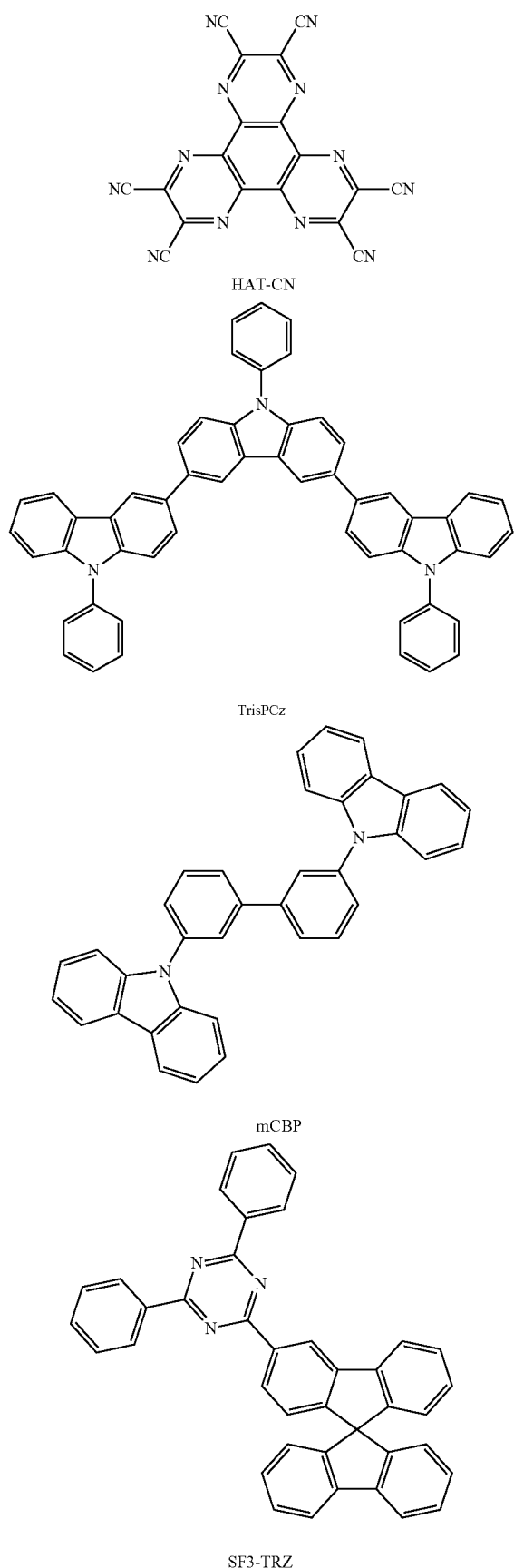

Devices 2 and 3 were produced in the same manner by using Compounds 21 and 416 instead of Compound 1, respectively. Other devices can be produced in the same manner by using Compounds 227, 467, 475, 483, 485, 1245, 1730, 1731, 1753, 1754, 1756, 1757 and 1758.

Comparative Device 1 was produced in the same manner by using Comparative Compound 1 instead of Compound 1.

Measurement of OLEDs

Fluorescence was observed from Devices 1 to 3 and Comparative Device 1. Time to reach 95% of initial luminance 1000 cd/m$^2$ (LT95) of the produced devices were measured. Devices 1 to 3 showed longer LT95 than Comparative Device 1. LT95 of Devices 1, 2 and 3 were 29.9 times, 66.4 times and 75.1 times longer than Comparative Device 1, respectively. These results show that OLED's containing a compound of Formula (I) have longer lifetimes.

The invention claimed is:
1. A compound of Formula (I):

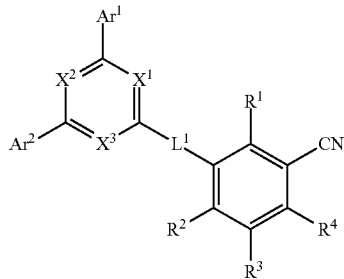

(I)

wherein:
one of $X^1$, $X^2$ and $X^3$ is N,
the other two of $X^1$, $X^2$ and $X^3$ are independently N or $C(R^5)$,
$R^5$ is hydrogen, deuterium, halogen, cyano, substituted or unsubstituted alkyl, substituted or unsubstituted alkoxy, substituted or unsubstituted aryl, substituted or unsubstituted aryloxy, substituted or unsubstituted heteroaryl, substituted or unsubstituted heteroaryloxy, and silyl;
$Ar^1$ and $Ar^2$ are independently selected from substituted or unsubstituted aryl, substituted or unsubstituted heteroaryl and cyano;
$L^1$ is a single bond;
$R^1$ is H;
two of $R^2$, $R^3$ and $R^4$ are Z,
the remaining one of $R^2$, $R^3$ and $R^4$ is $Ar^3$,
$Ar^3$ is substituted or unsubstituted aryl which can be substituted with one or more substituents independently selected from deuterium, substituted or unsubstituted alkyl, substituted or unsubstituted aryl, and substituted or unsubstituted heteroaryl not having N as a ring-constituting atom; and two or more of these substituents taken together can form a ring system,
Z is independently selected from substituted or unsubstituted 1-carbazolyl, substituted or unsubstituted 2-carbazolyl, substituted or unsubstituted 3-carbazolyl, substituted or unsubstituted 4-carbazolyl, or group represented by Formula (II):

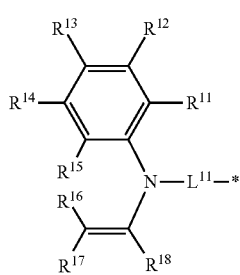

(II)

$R^{11}$, $R^{12}$, $R^{13}$, $R^{14}$, $R^{15}$, $R^{16}$, $R^{17}$ and $R^{18}$ are independently selected from hydrogen, deuterium, substituted or unsubstituted alkyl, substituted or unsubstituted alkoxy, substituted or unsubstituted amino, substituted or unsubstituted aryl, substituted or unsubstituted aryloxy, substituted or unsubstituted heteroaryl, substituted or unsubstituted heteroaryloxy, and silyl; or two or more of $R^{11}$, $R^{12}$, $R^{13}$, $R^{14}$, $R^{15}$, $R^{16}$, $R^{17}$ and $R^{18}$ taken together can form a ring system, or $R^{15}$ and $R^{16}$ taken together can form single bond, and
$L^{11}$ is selected from single bond, substituted or unsubstituted arylene, and substituted or unsubstituted heteroarylene.

2. The compound of claim 1, wherein $R^2$ is $^3$.
3. The compound of claim 1, wherein $R^3$ is a group bonding to Formula (I) by a carbon atom.
4. The compound of claim 1, wherein $R^3$ is $Ar^3$.
5. The compound of claim 1, wherein $R^3$ is Z.
6. The compound of claim 1, wherein $R^4$ is $Ar^3$.
7. The compound of claim 1, wherein at least one of $R^3$ and $R^4$ is Z or $Ar^3$.
8. The compound of claim 1, wherein $Ar^3$ is independently substituted or unsubstituted aryl.
9. The compound of claim 1, wherein $R^2$ and $R^4$ are independently Z.
10. The compound of claim 1, wherein Z is independently selected from

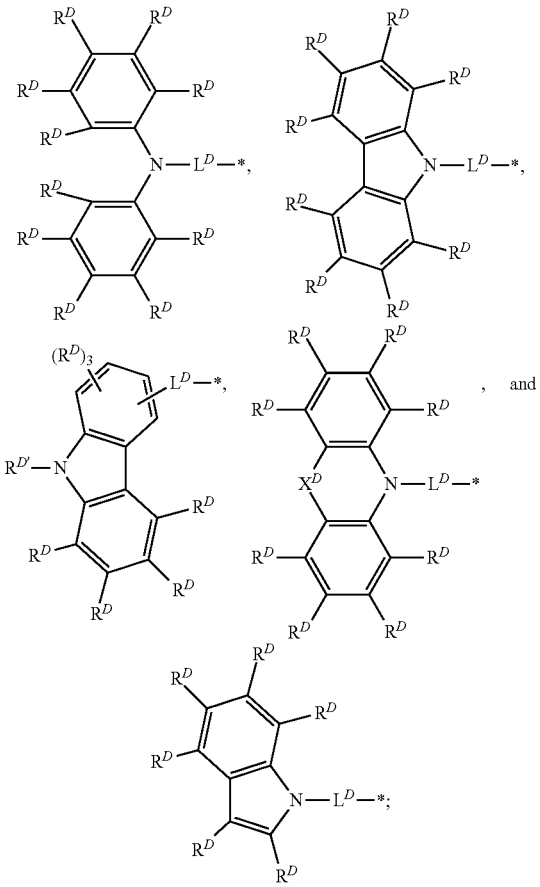

wherein
$X^D$ is independently selected from O, S, $NR^{D'}$, C(O), substituted or unsubstituted methylene, substituted or unsubstituted ethylene, substituted or unsubstituted vinylene, substituted or unsubstituted o-arylene, and substituted or unsubstituted o-heteroarylene; wherein each instance of methylene, ethylene, vinylene, o-arylene or o-heteroarylene can be substituted with one or more substituents independently selected from deuterium, substituted or unsubstituted alkyl, substituted or unsubstituted aryl, and substituted or unsubstituted heteroaryl; two or more instances of $X^D$ taken together can form a ring system;

$R^D$ is independently selected from hydrogen, deuterium, substituted or unsubstituted alkyl, substituted or unsubstituted alkoxy, substituted or unsubstituted amino, substituted or unsubstituted aryl, substituted or unsubstituted aryloxy, substituted or unsubstituted heteroaryl, substituted or unsubstituted heteroaryloxy, and silyl; two or more instances of $R^D$ taken together can form a ring system;

$R^{D'}$ is independently selected from hydrogen, deuterium, substituted or unsubstituted alkyl, substituted or unsubstituted amino, substituted or unsubstituted aryl, and substituted or unsubstituted heteroaryl; two or more instances of $R^{D'}$ and $R^D$ taken together can form a ring system;

$L^D$ is independently selected from single bond, substituted or unsubstituted arylene, and substituted or unsubstituted heteroarylene; wherein each instance of arylene and heteroarylene can be substituted with one or more substituents independently selected from deuterium, substituted or unsubstituted alkyl, substituted or unsubstituted aryl, and substituted or unsubstituted heteroaryl; two or more of these substituents taken together can form a ring system; and each "*" represents a point of attachment to Formula (I).

11. The compound of claim 1, wherein at least one of $Ar^1$ and $Ar^2$ is substituted or unsubstituted aryl.

12. The compound of claim 1, wherein

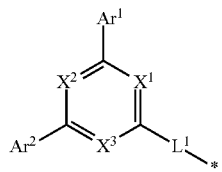

is selected from

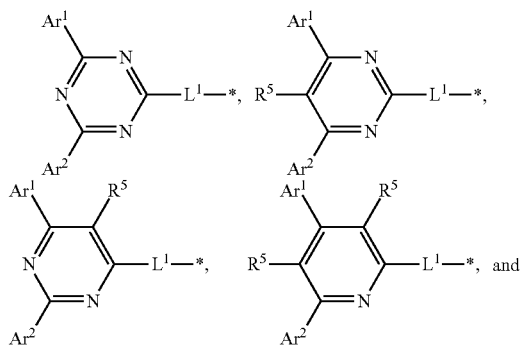

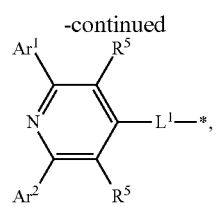

each "*" represents a point of attachment to the benzonitrile in Formula (I).

13. The compound of claim 1, wherein

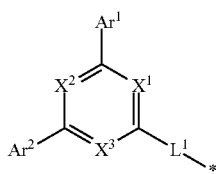

is

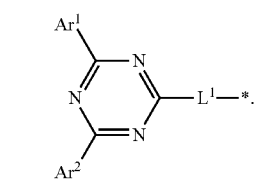

14. An organic electronic device comprising the compound of claim 1.

15. An organic light-emitting diode (OLED) comprising the compound of claim 1.

16. The organic light-emitting diode (OLED) of claim 15, comprising an anode, a cathode, and at least one organic layer comprising a light-emitting layer between the anode and the cathode, wherein the light-emitting layer comprises a host material and the compound.

17. The organic light-emitting diode (OLED) of claim 16, wherein the compound is a light-emitting material.

18. The organic light-emitting diode (OLED) of claim 15, comprising an anode, a cathode, and at least one organic layer comprising a light-emitting layer between the anode and the cathode, wherein the light-emitting layer comprises the compound and a light-emitting material, and light emission of the OLED occurs mainly in the light-emitting material.

19. The organic light-emitting diode (OLED) of claim 15, comprising an anode, a cathode, and at least one organic layer comprising a light-emitting layer between the anode and the cathode, wherein:
the light-emitting layer comprises a host material, an assistant dopant and a light-emitting material,
the assistant dopant is the compound, and
light emission of the OLED occurs mainly in the light-emitting material.

* * * * *